(12) United States Patent
Machida

(10) Patent No.: US 12,155,950 B2
(45) Date of Patent: Nov. 26, 2024

(54) IMAGING DEVICE THAT ALLOWS MINIATURIZATION AND ELECTRONIC APPARATUS

(71) Applicant: SONY SEMICONDUCTOR SOLUTIONS CORPORATION, Kanagawa (JP)

(72) Inventor: Takashi Machida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/756,591

(22) PCT Filed: Nov. 27, 2020

(86) PCT No.: PCT/JP2020/044298
§ 371 (c)(1),
(2) Date: May 27, 2022

(87) PCT Pub. No.: WO2021/117511
PCT Pub. Date: Jun. 17, 2021

(65) Prior Publication Data
US 2022/0408051 A1   Dec. 22, 2022

(30) Foreign Application Priority Data

Dec. 10, 2019   (JP) .................................. 2019-222999

(51) Int. Cl.
*H04N 25/77*   (2023.01)
*H01L 27/146*   (2006.01)

(52) U.S. Cl.
CPC ....... *H04N 25/77* (2023.01); *H01L 27/14601* (2013.01)

(58) Field of Classification Search
CPC ...... H04N 25/77; H04N 25/704; H04N 25/79; H04N 25/131; H01L 27/14601;
(Continued)

(56) References Cited

U.S. PATENT DOCUMENTS

2013/0001404 A1   1/2013   Meynants
2013/0182173 A1*  7/2013   Murata ................ H04N 25/136
                                          257/432
(Continued)

FOREIGN PATENT DOCUMENTS

JP   2013-157883 A   8/2013
JP   2015-142254 A   8/2015
(Continued)

OTHER PUBLICATIONS

International Search Report and Written Opinion of PCT Application No. PCT/JP2020/044298, issued on Jan. 19, 2021, 08 pages of ISRWO.

*Primary Examiner* — Padma Haliyur
(74) *Attorney, Agent, or Firm* — CHIP LAW GROUP

(57) ABSTRACT

To provide an imaging device that allows miniaturization to be achieved in an in-plane direction without impairing operation performance. This imaging device includes a first pixel and a second pixel. The first pixel includes m (m represents an integer greater than or equal to 2) first wiring lines and m first gate electrodes that are coupled to the m respective first wiring lines. The second pixel includes n (n represents a natural number smaller than m) second wiring lines and n second gate electrodes that are coupled to the n respective second wiring lines.

9 Claims, 56 Drawing Sheets

(58) Field of Classification Search
CPC ......... H01L 27/14636; H01L 27/14645; H01L 27/14649; H01L 27/14614; H01L 27/14634; H01L 27/1464; H01L 27/1463
See application file for complete search history.

(56) References Cited

U.S. PATENT DOCUMENTS

| | | |
|---|---|---|
| 2013/0194471 A1 | 8/2013 | Yamashita |
| 2015/0042858 A1* | 2/2015 | Kokubun .......... H01L 27/14629 348/302 |
| 2015/0109499 A1* | 4/2015 | Yamashita ........ H01L 27/14614 348/308 |
| 2015/0215554 A1 | 7/2015 | Toyoguchi |
| 2015/0381907 A1* | 12/2015 | Boettiger .......... H01L 27/14621 348/164 |
| 2017/0257587 A1 | 9/2017 | Hatano et al. |
| 2019/0333949 A1 | 10/2019 | Ohya et al. |

FOREIGN PATENT DOCUMENTS

| | | |
|---|---|---|
| JP | 2019-036770 A | 3/2019 |
| JP | 2019-193169 A | 10/2019 |
| WO | 2016/039152 A1 | 3/2016 |
| WO | 2016/136486 A1 | 9/2016 |

\* cited by examiner

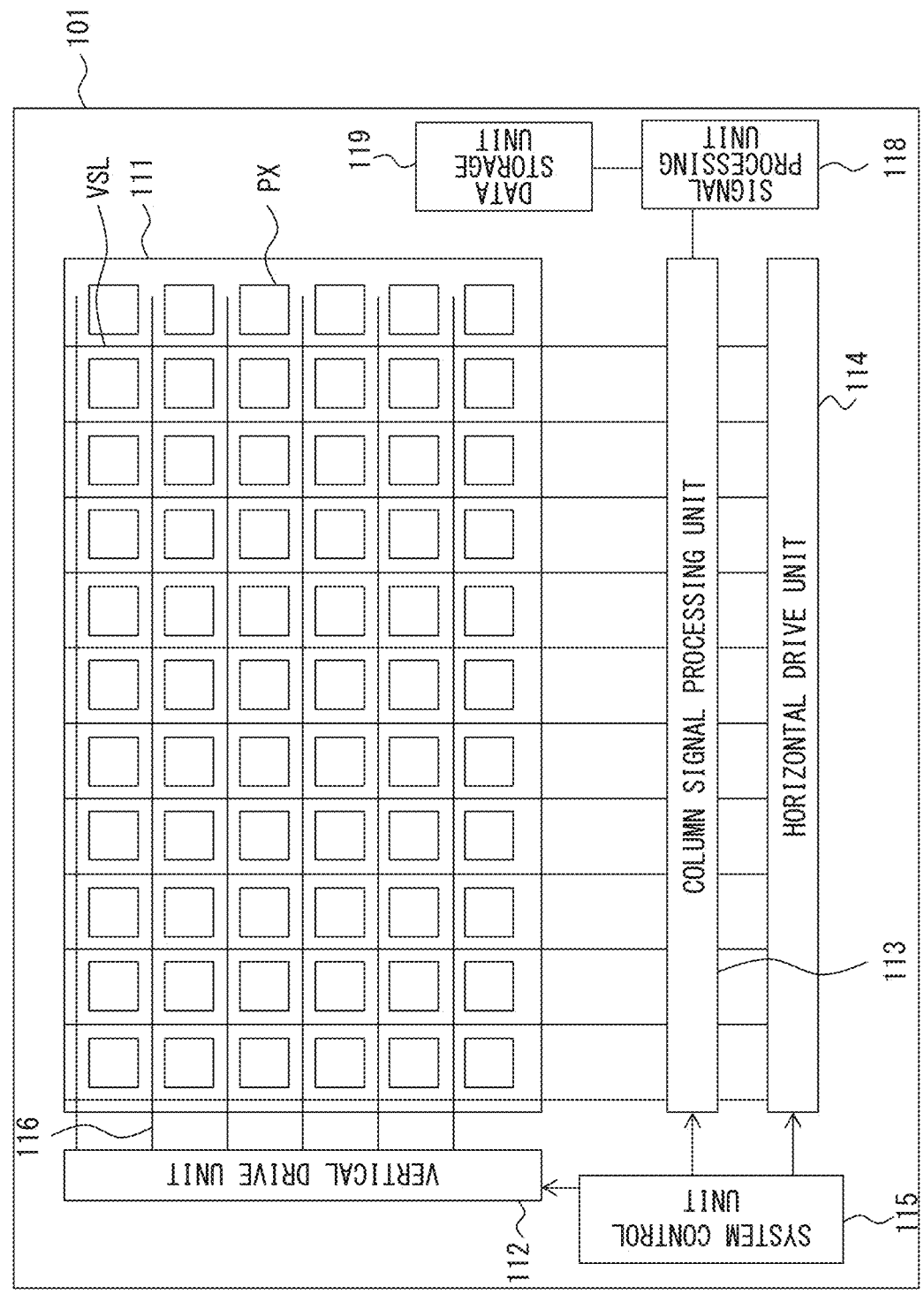

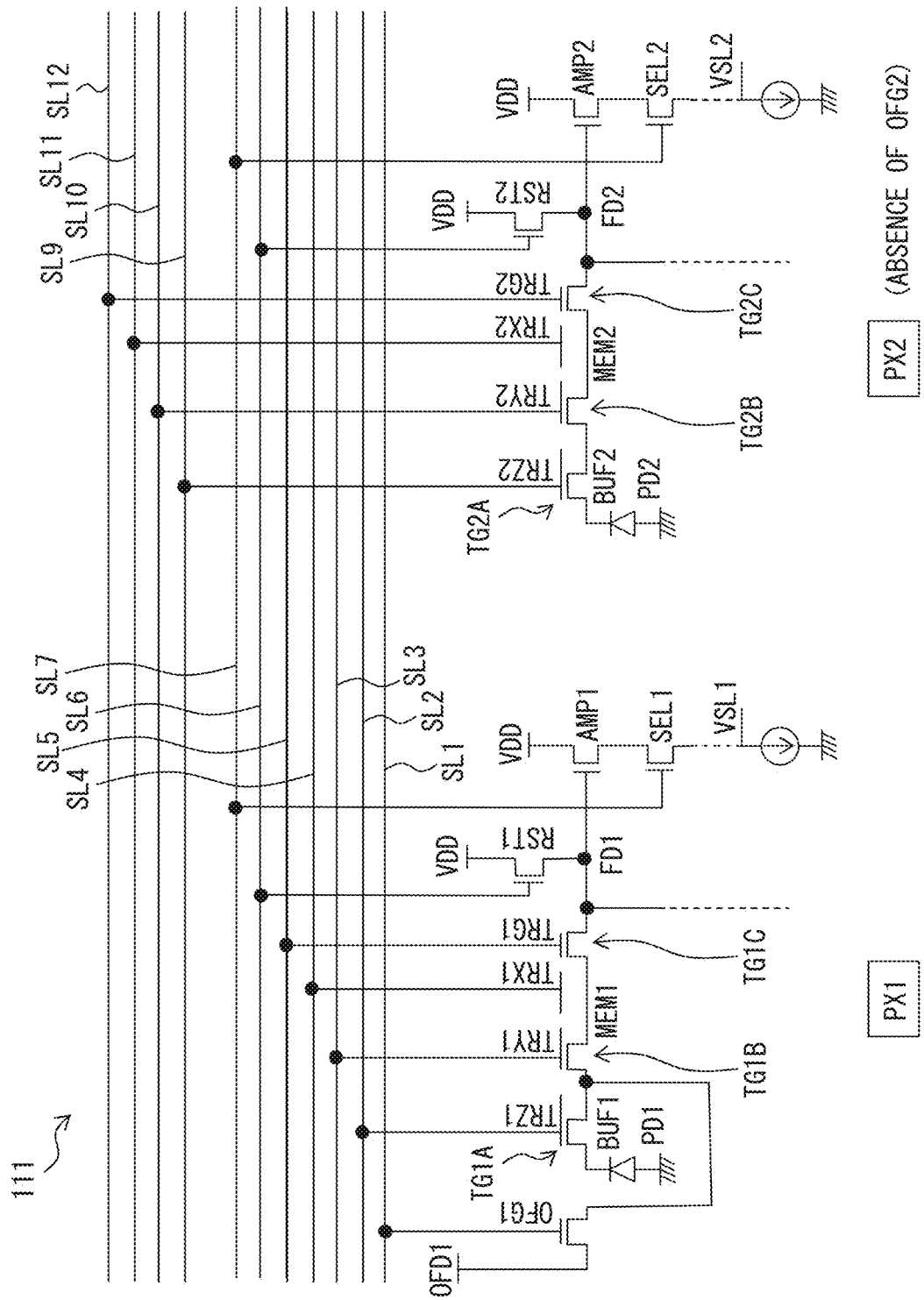
[FIG. 2]

[FIG. 3A]
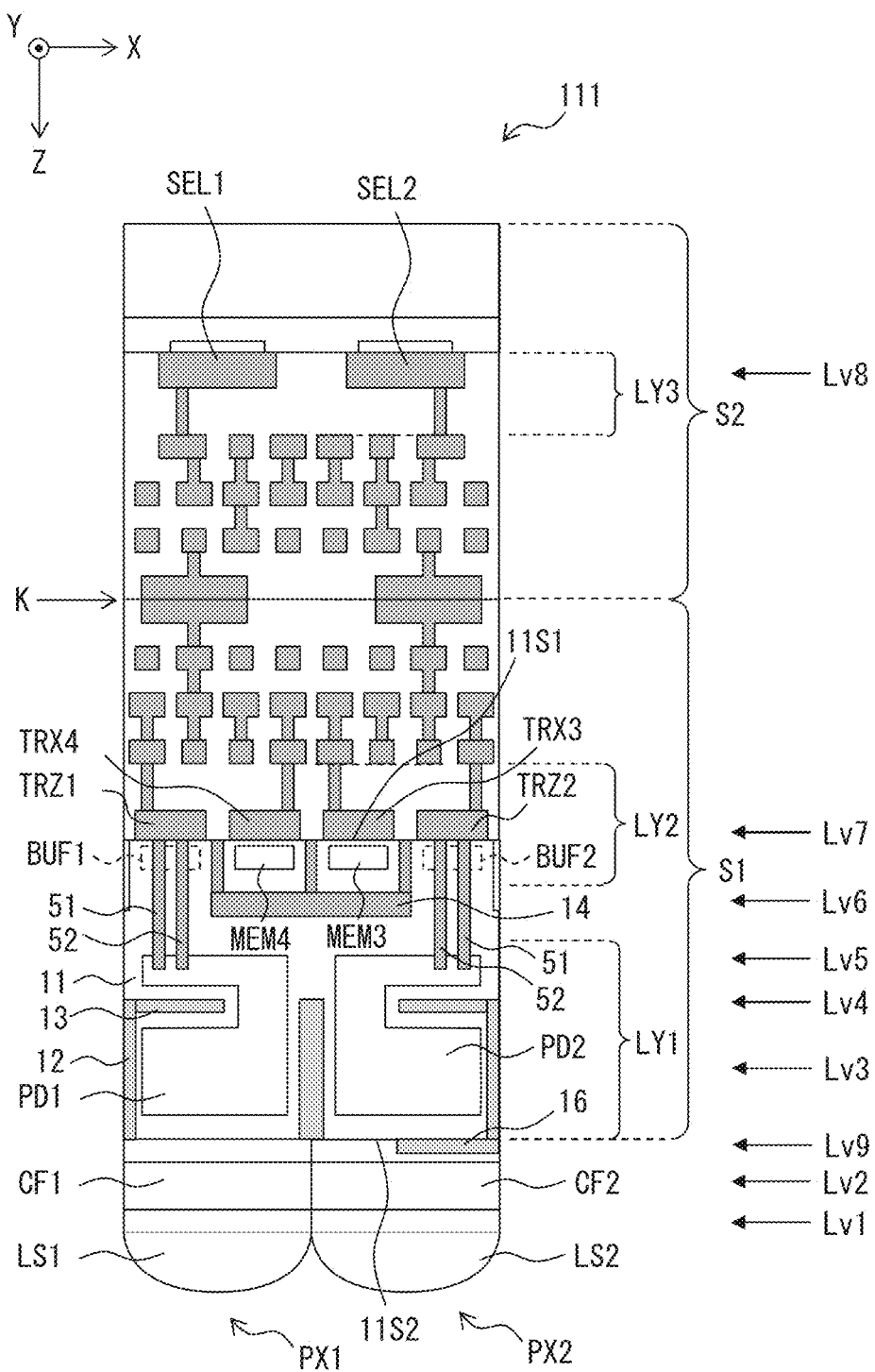

[FIG. 3B]
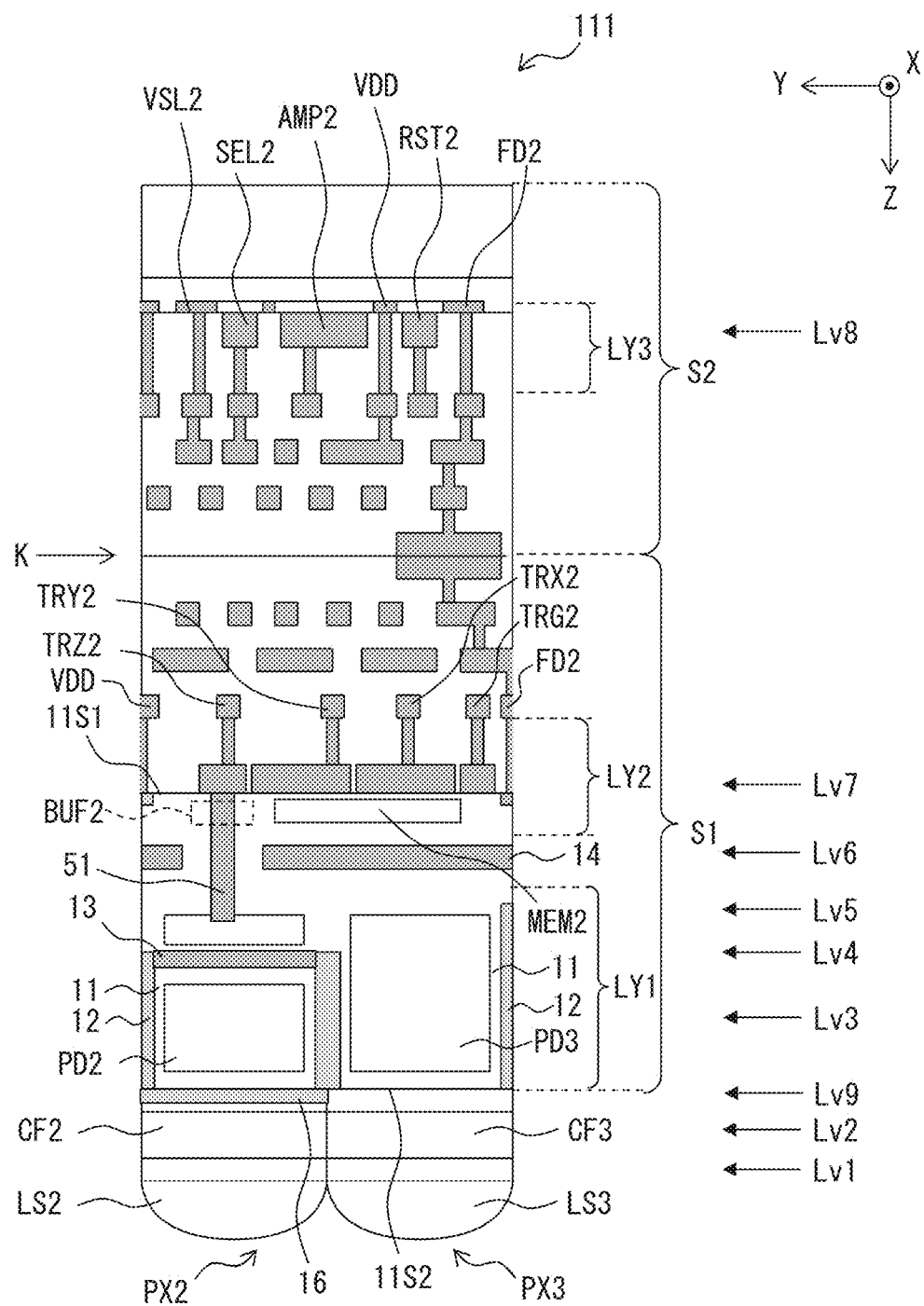

[FIG. 4A]
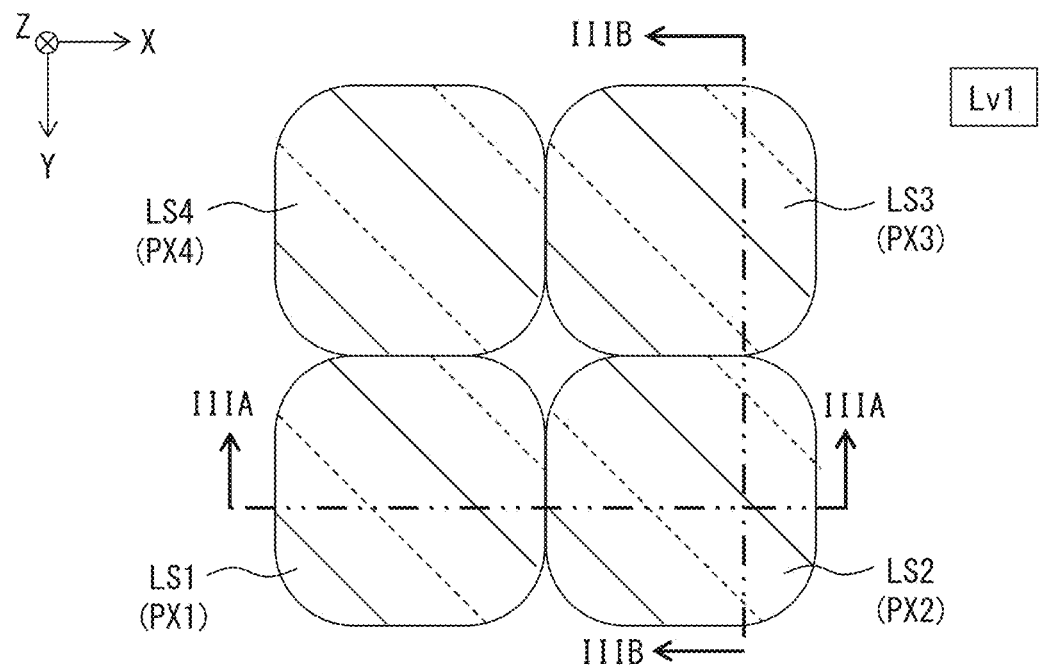
[FIG. 4B]
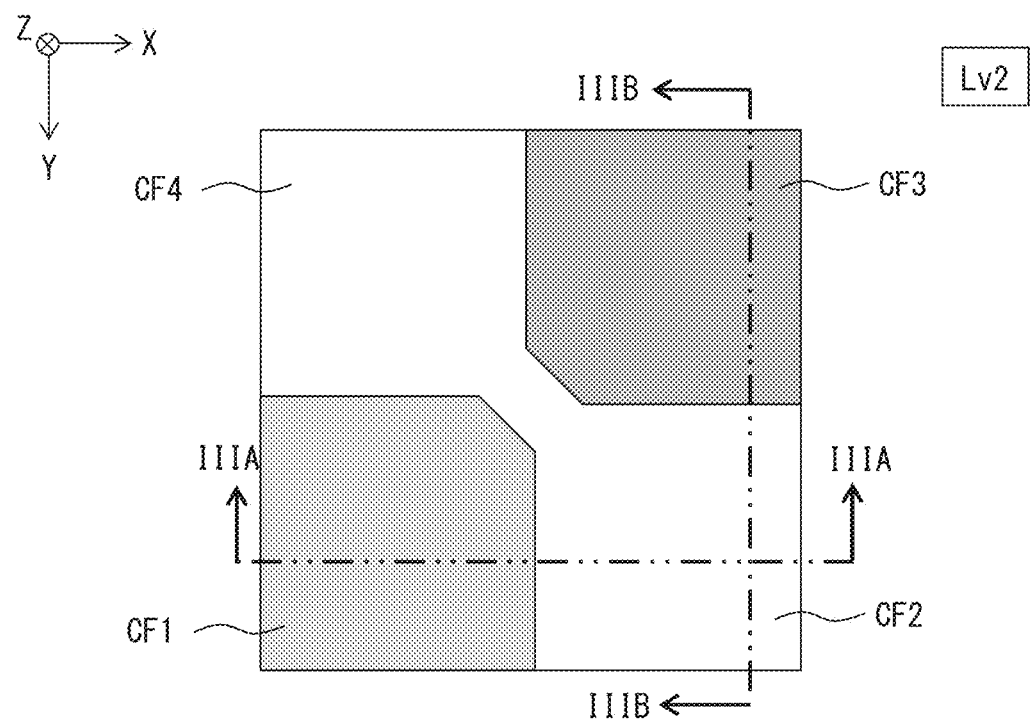

[FIG. 4C]
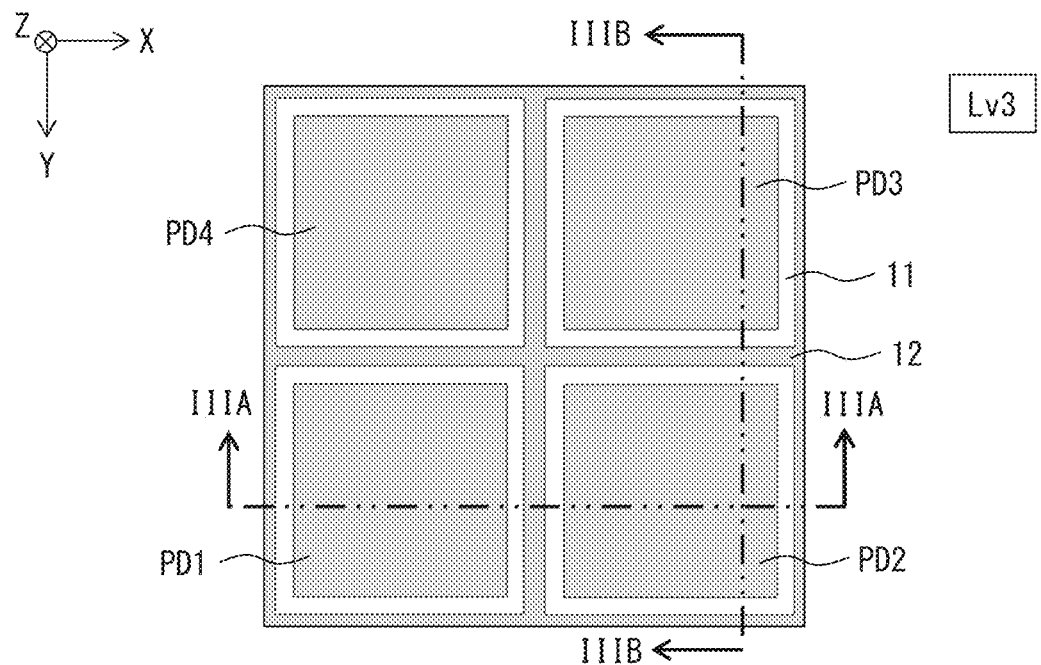
[FIG. 4D]
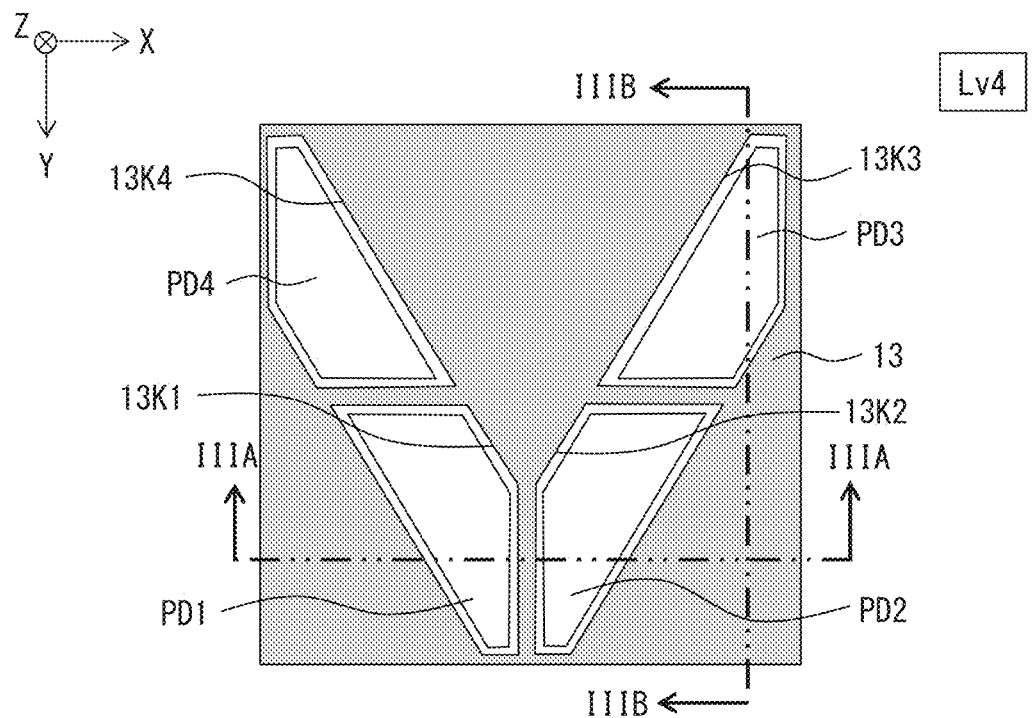

[FIG. 4E]
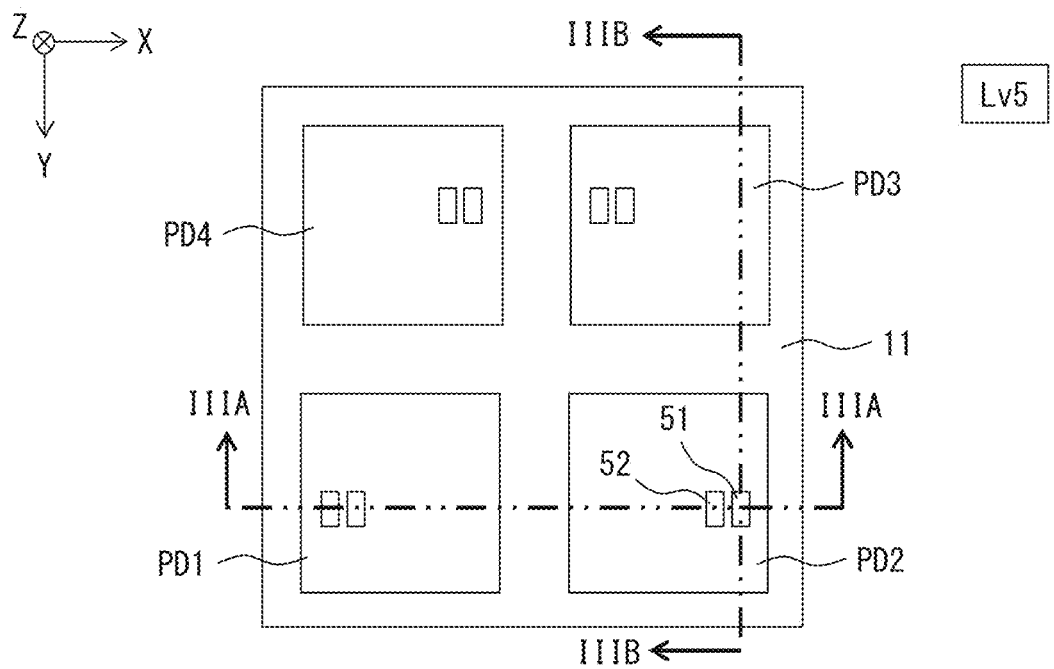
[FIG. 4F]
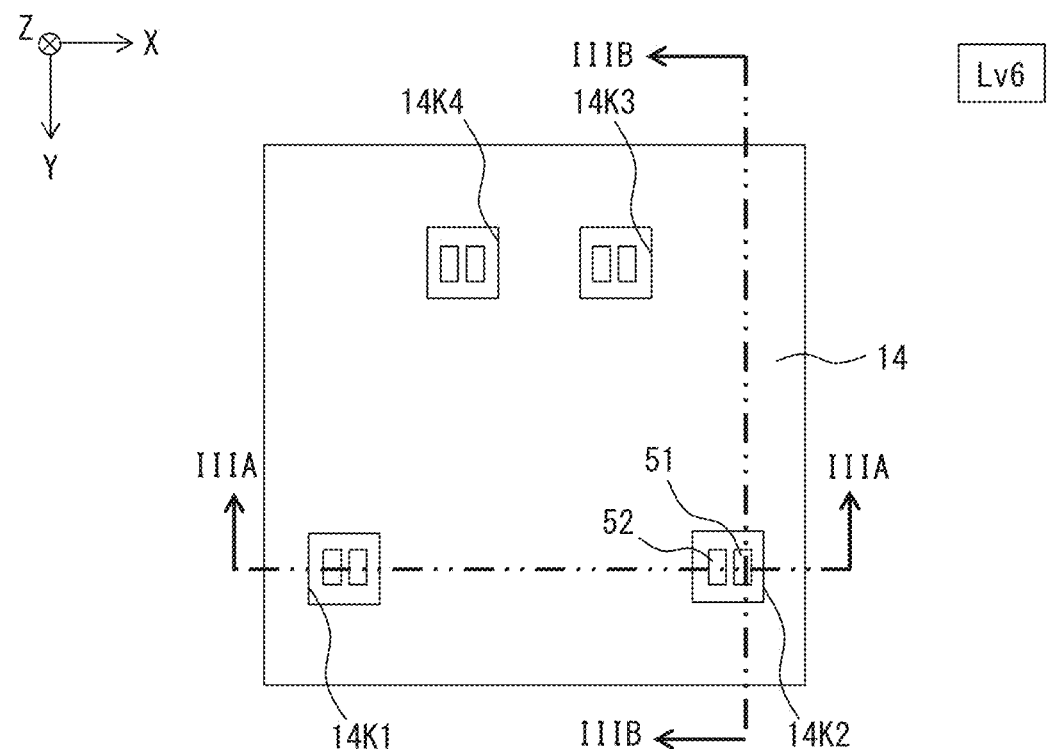

[FIG. 4G]
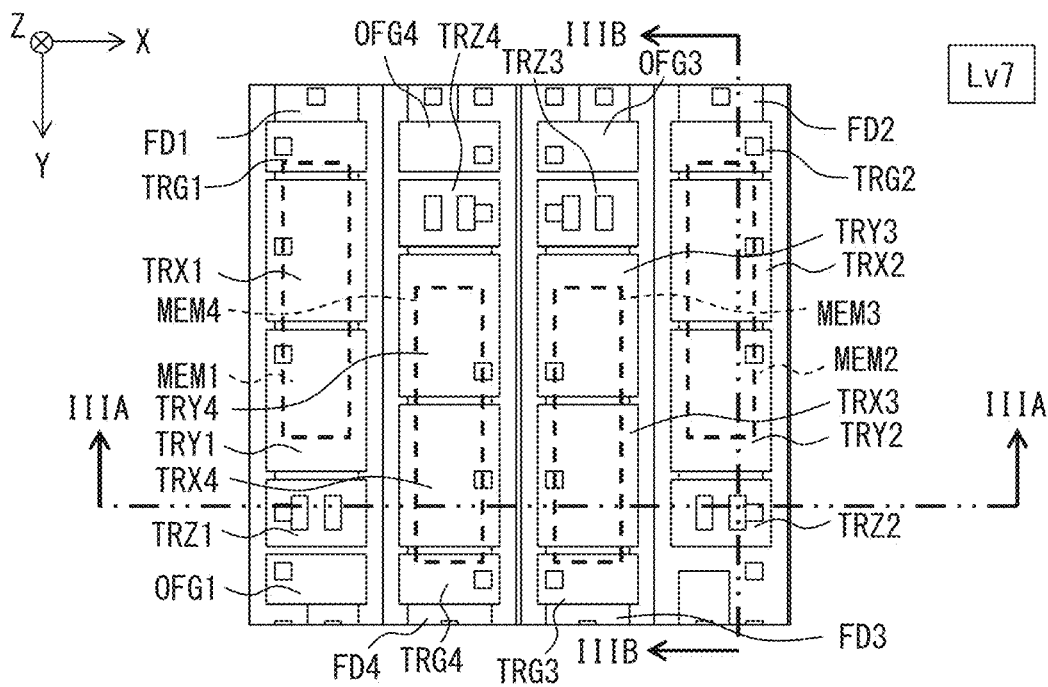
[FIG. 4H]
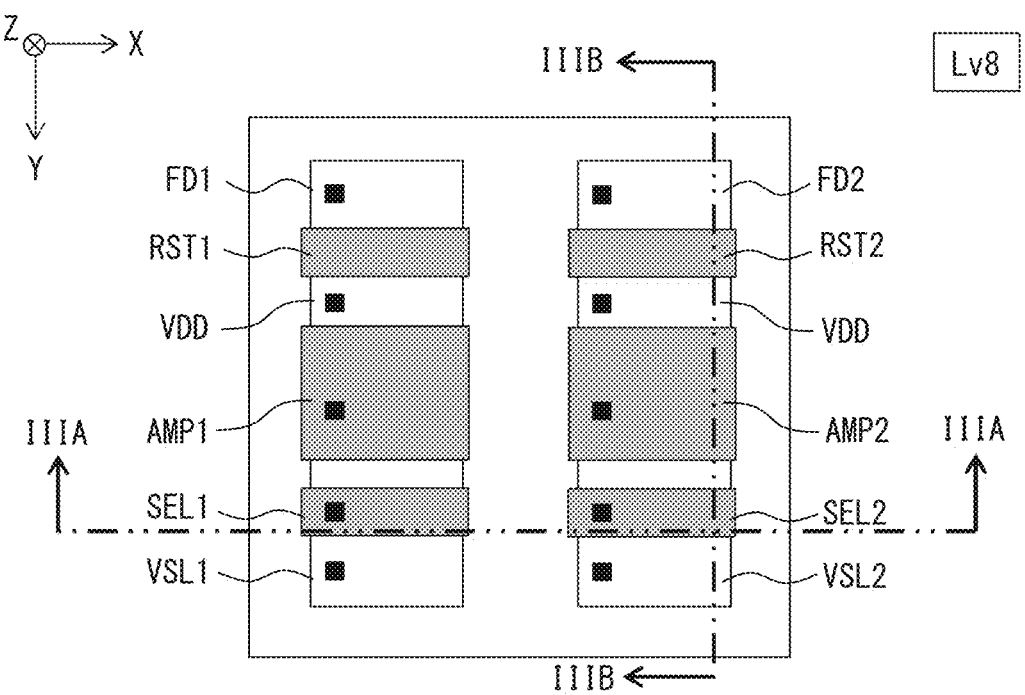

[FIG. 41]
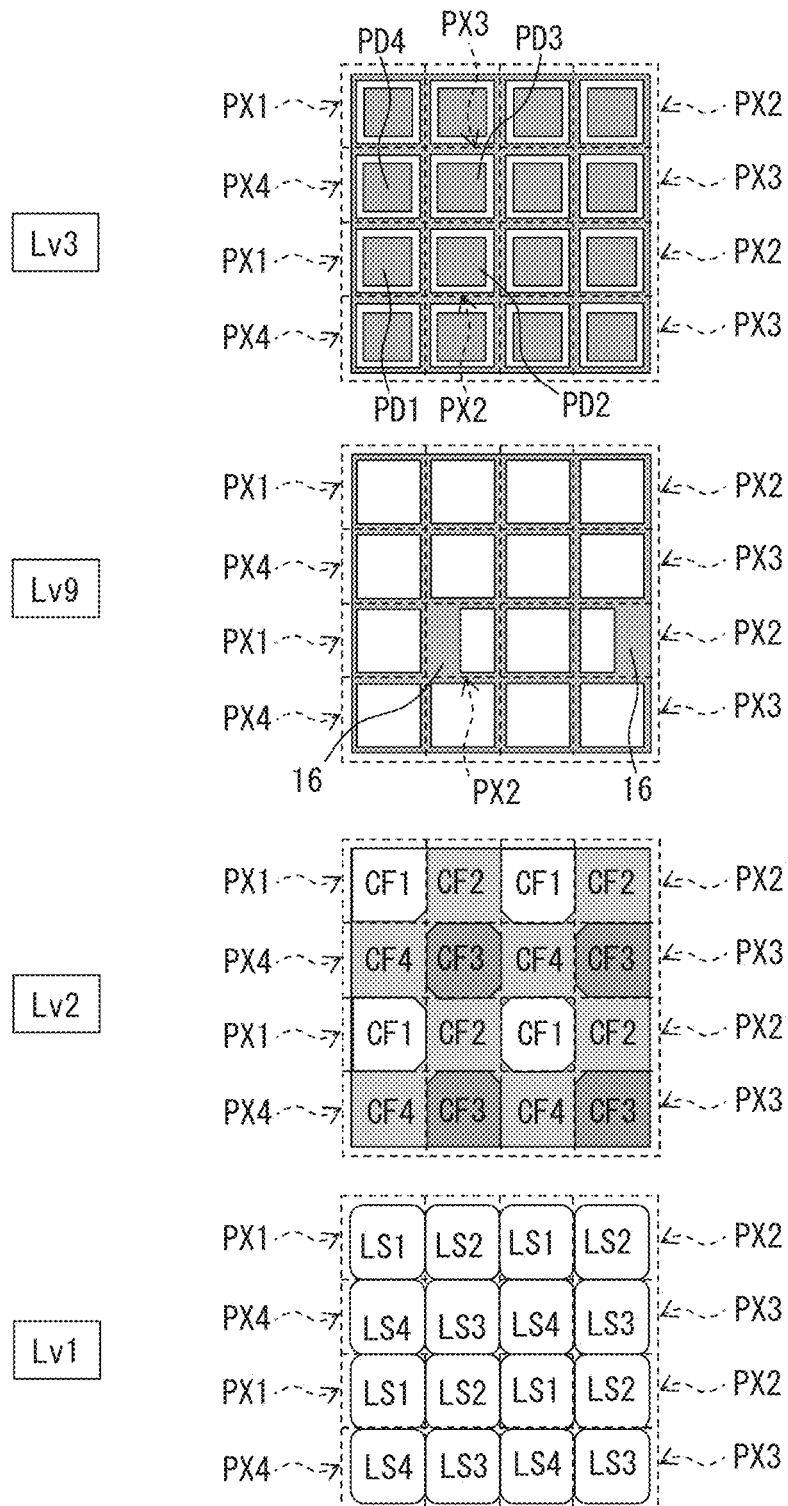

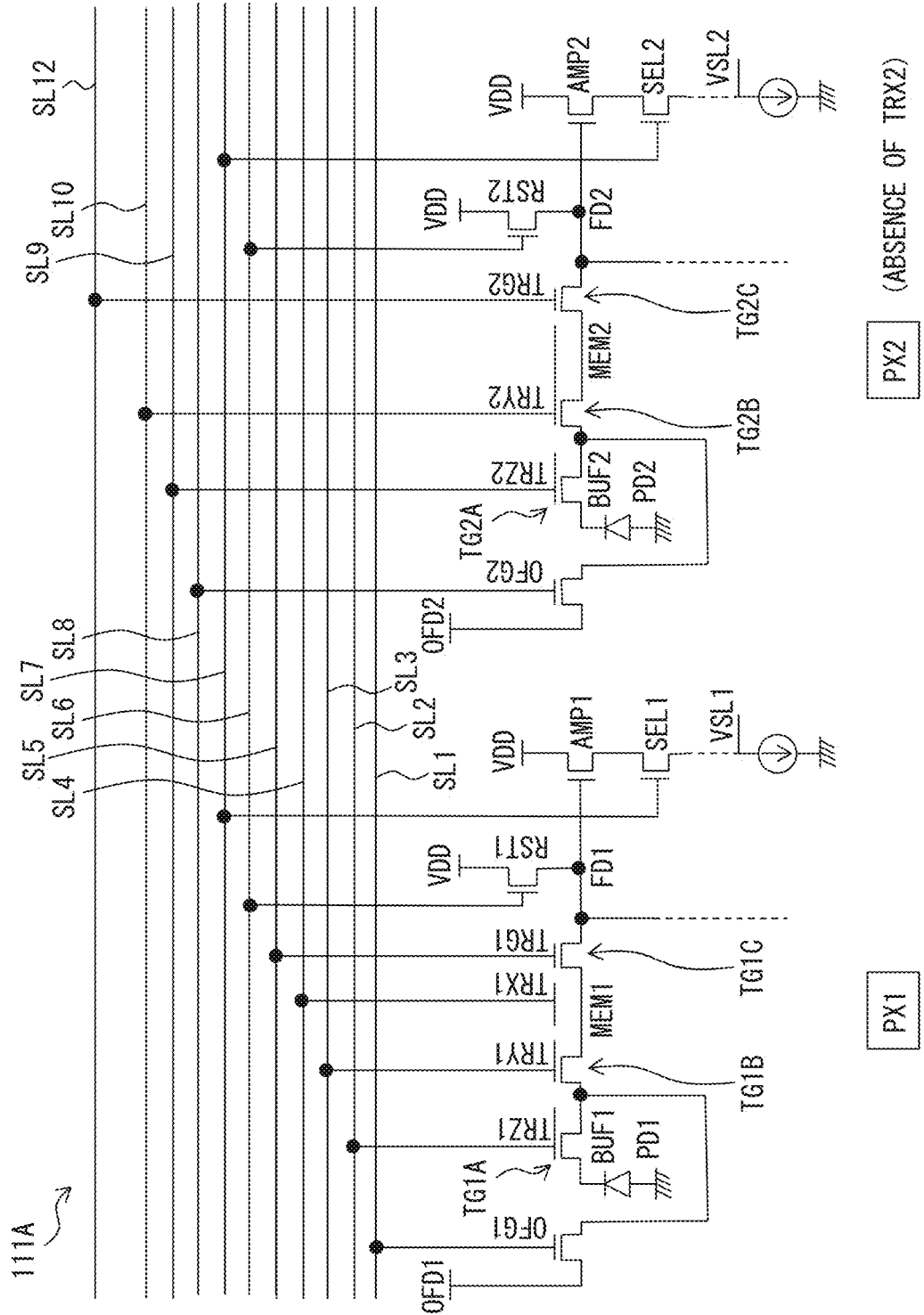
[FIG. 5]

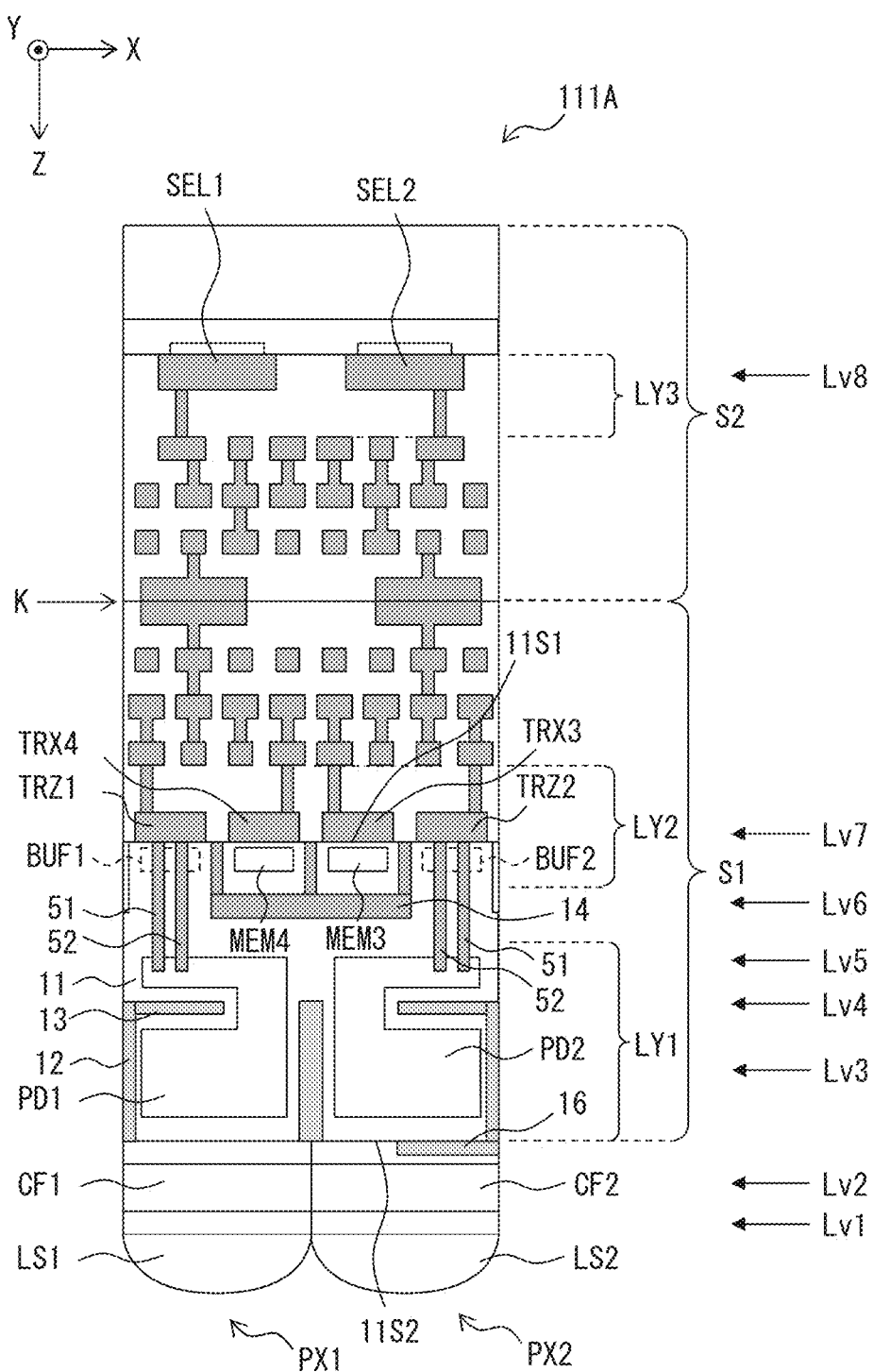
[FIG. 6A]

[FIG. 6B]
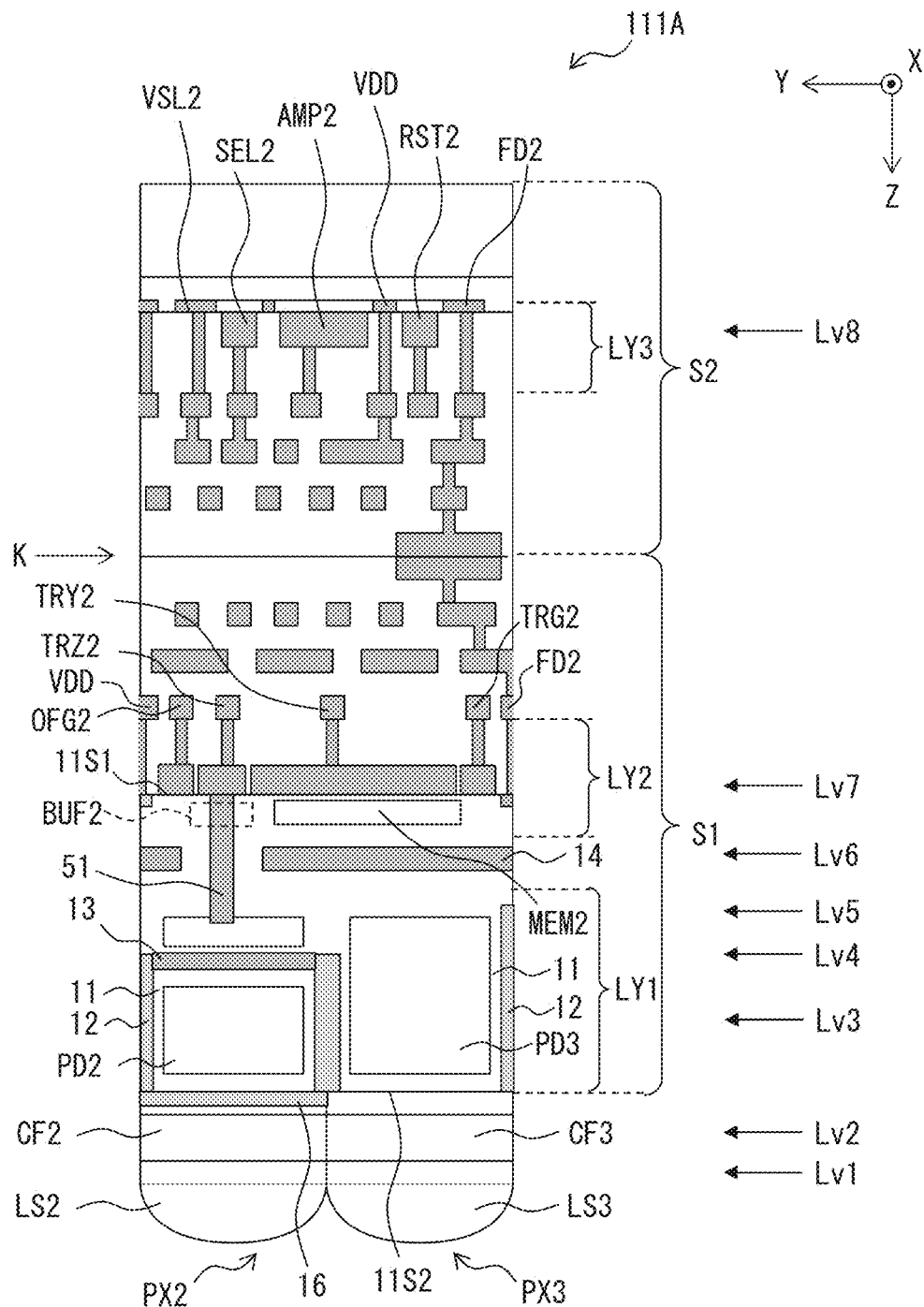

[FIG. 7]
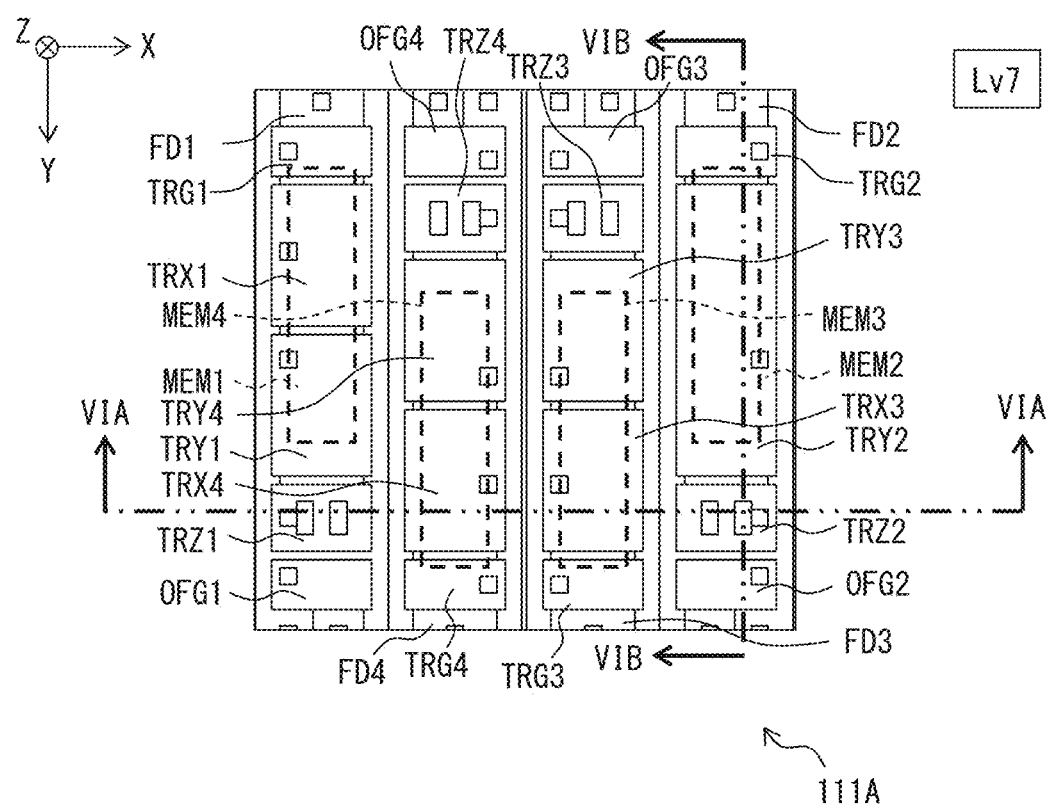

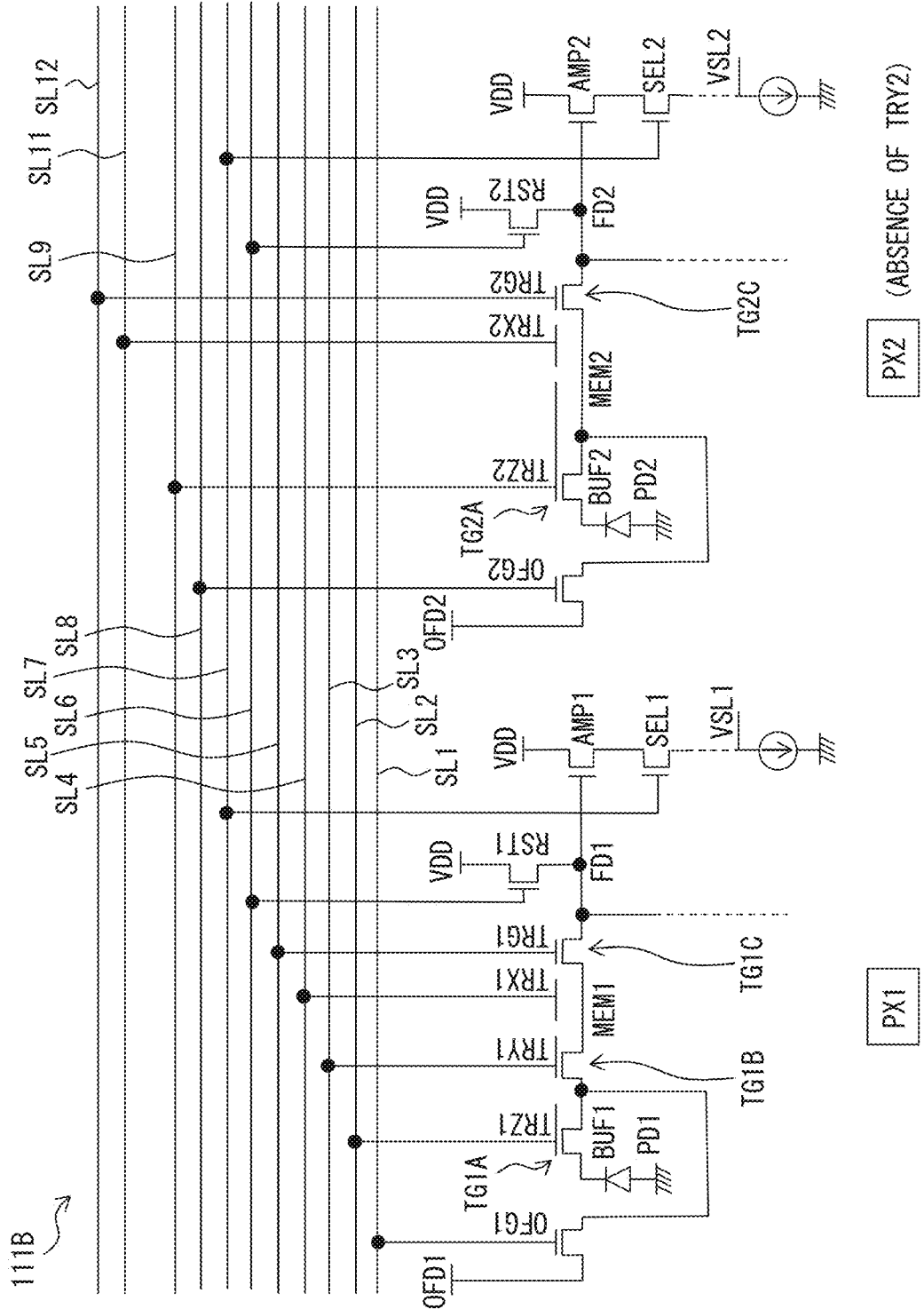
[FIG. 8]

[FIG. 9A]
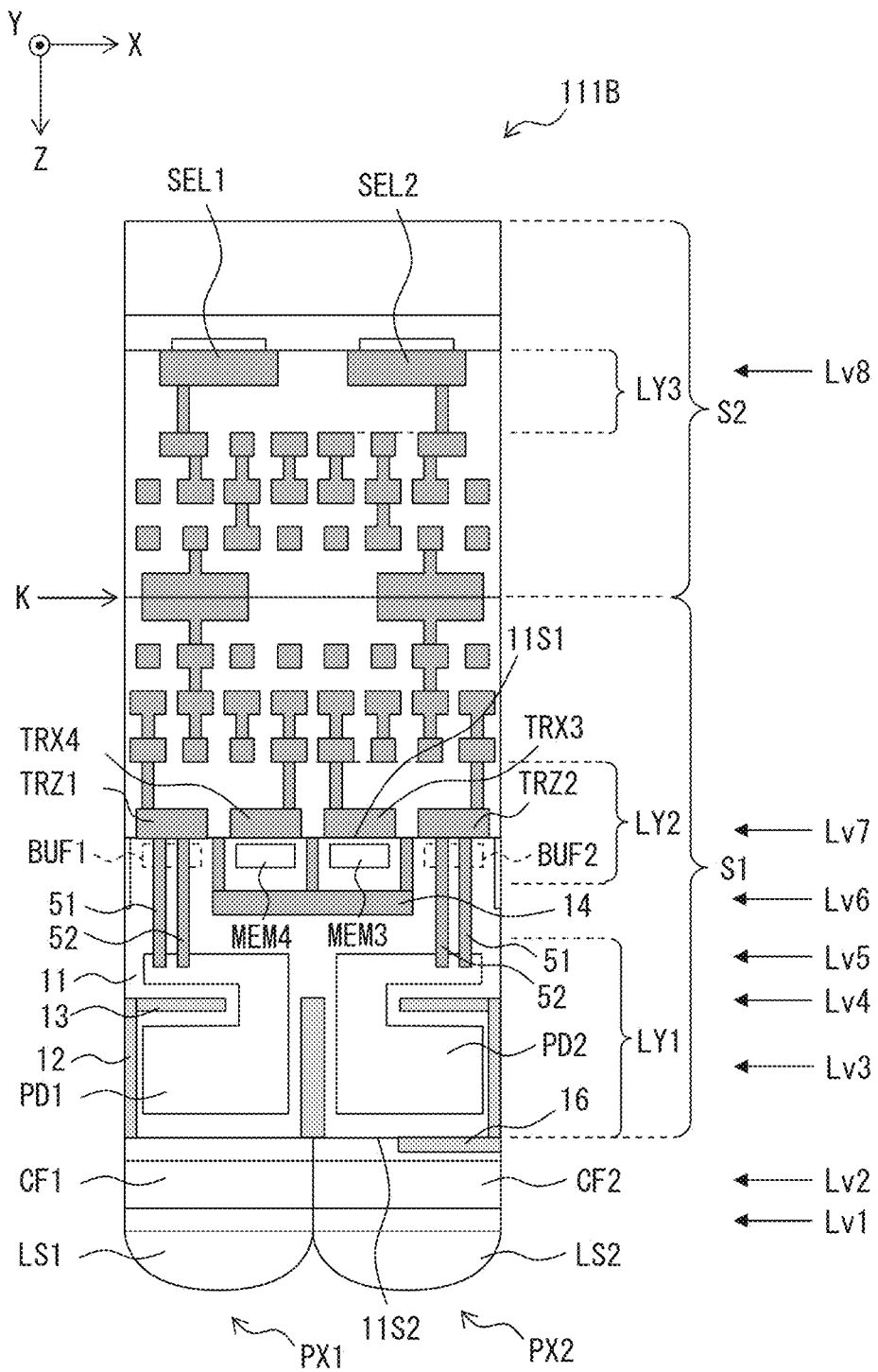

[FIG. 9B]
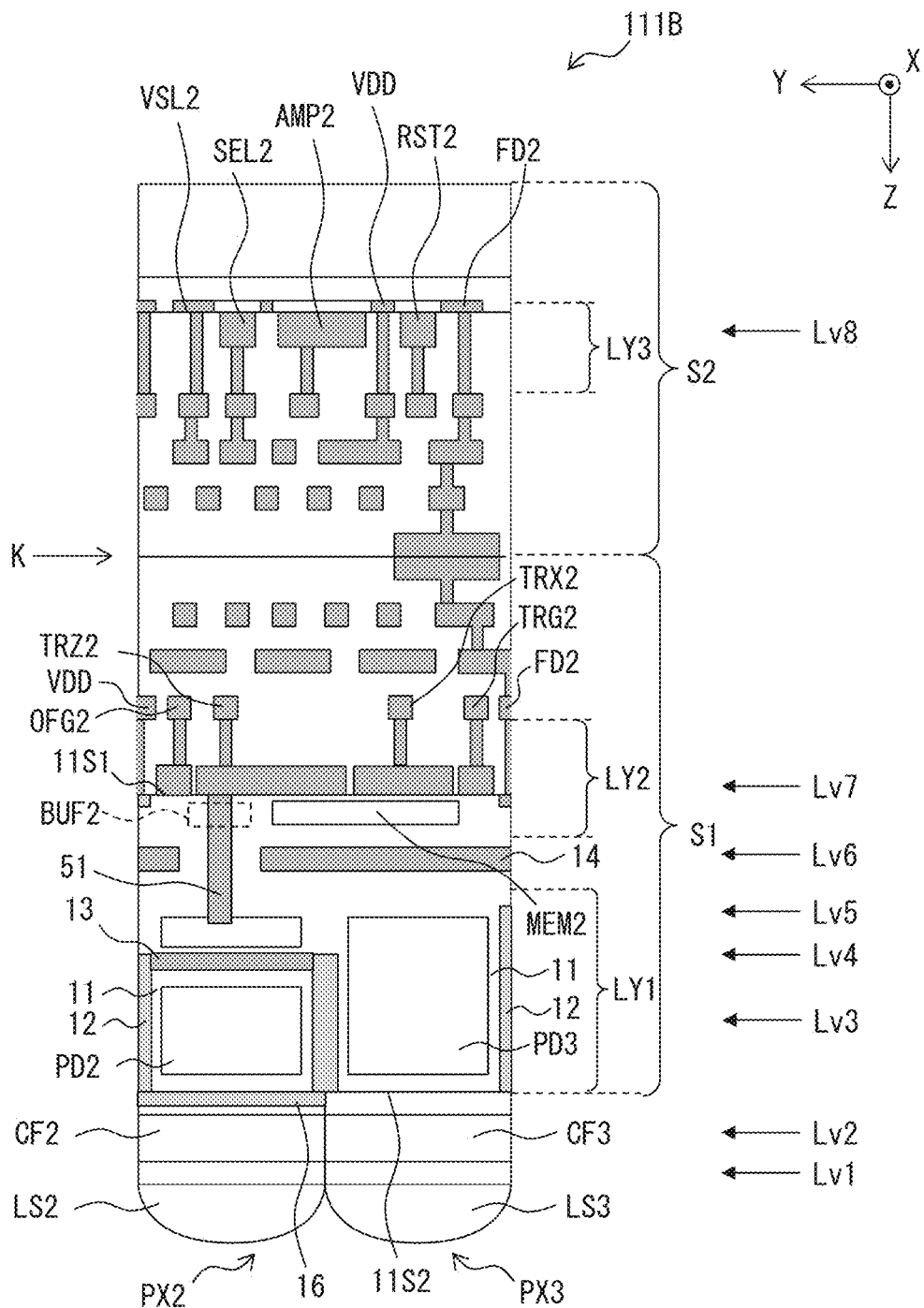

[FIG. 10]
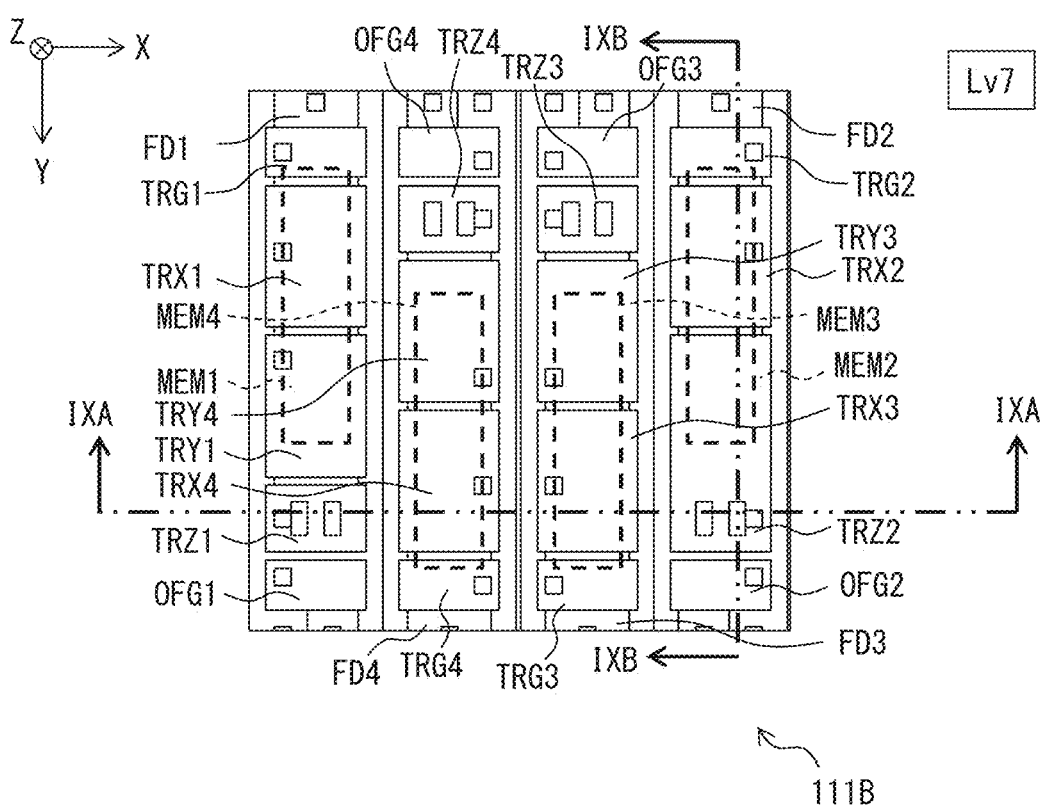

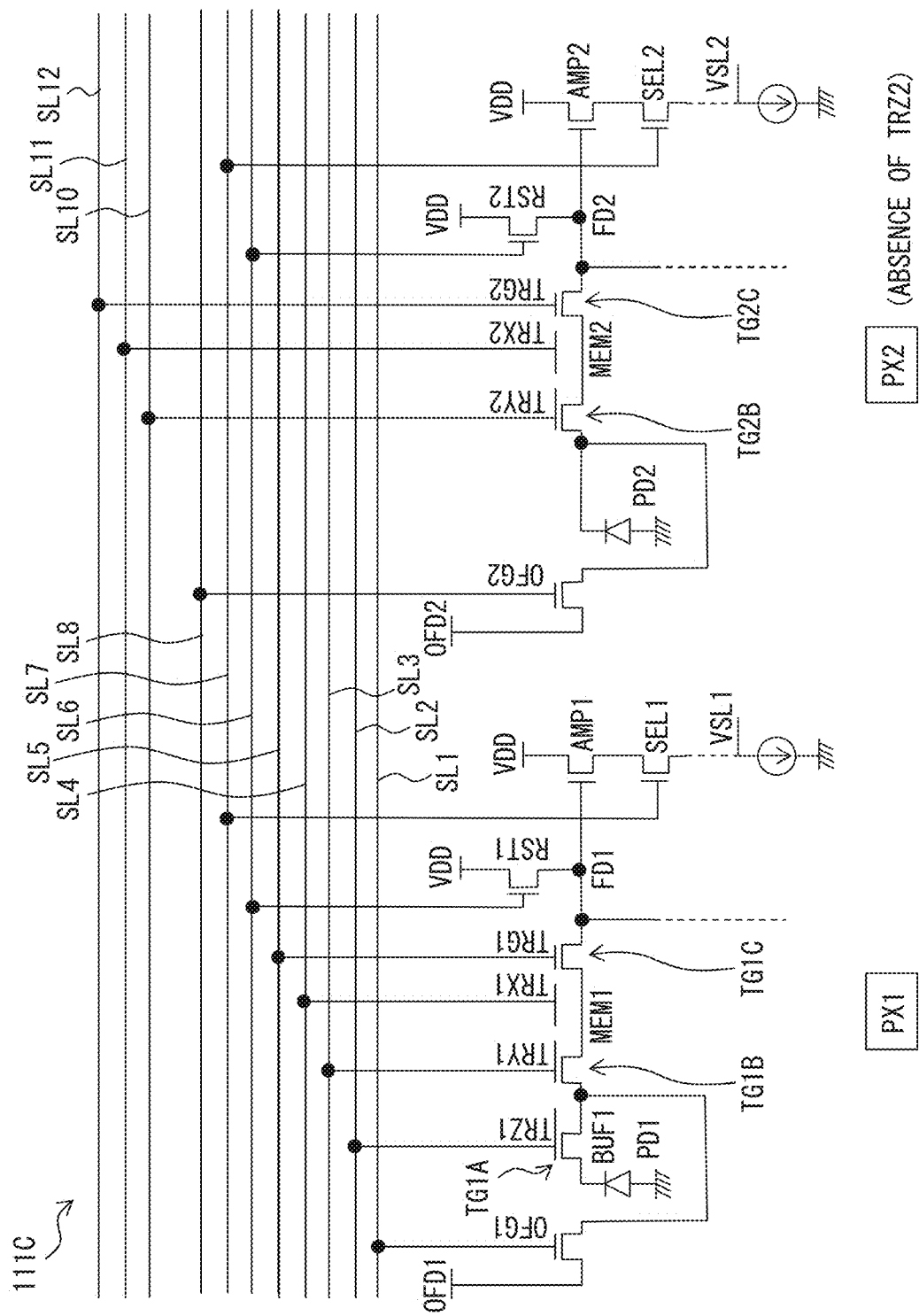
[FIG. 11]

[FIG. 12A]
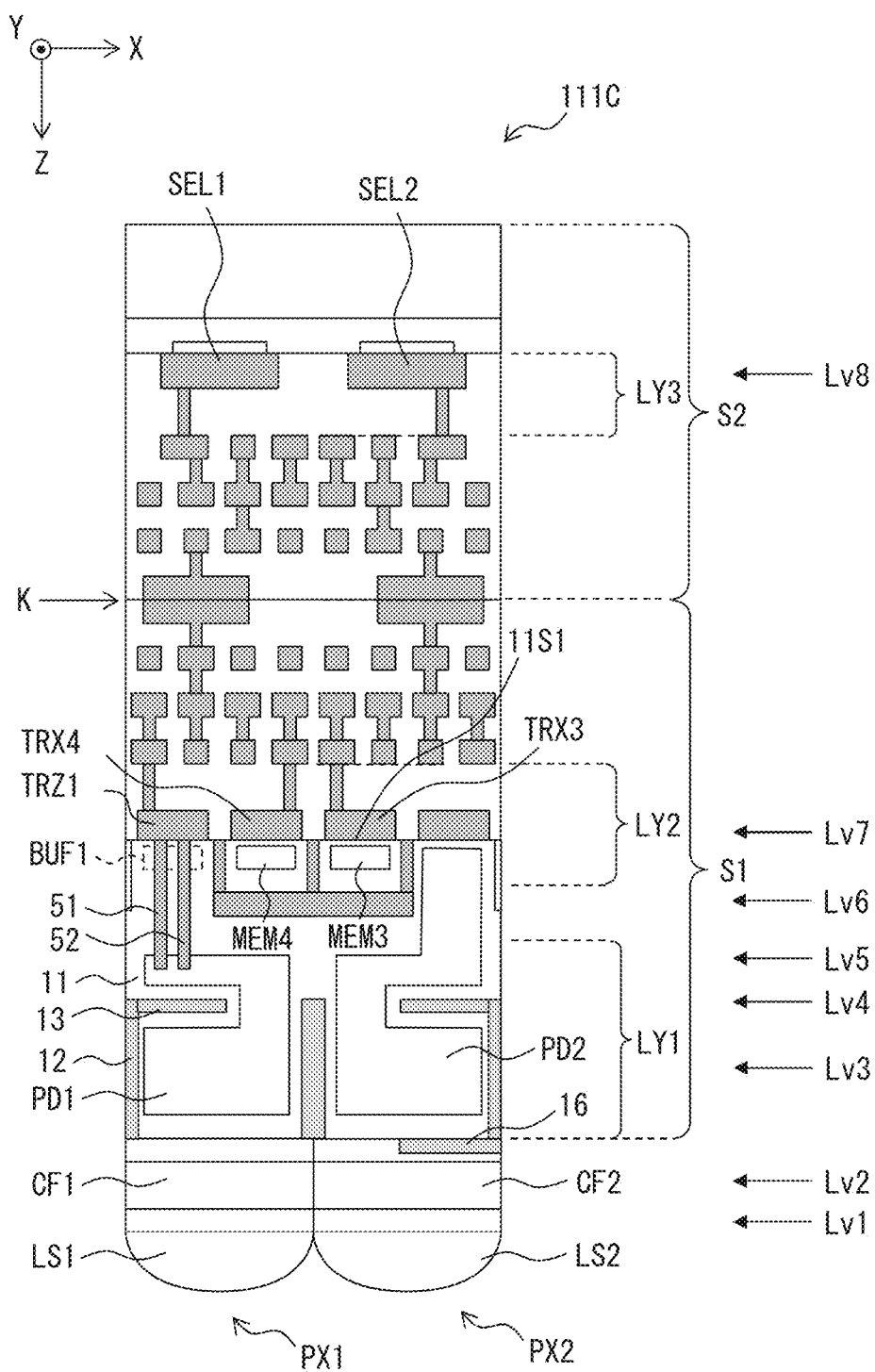

[FIG. 12B]
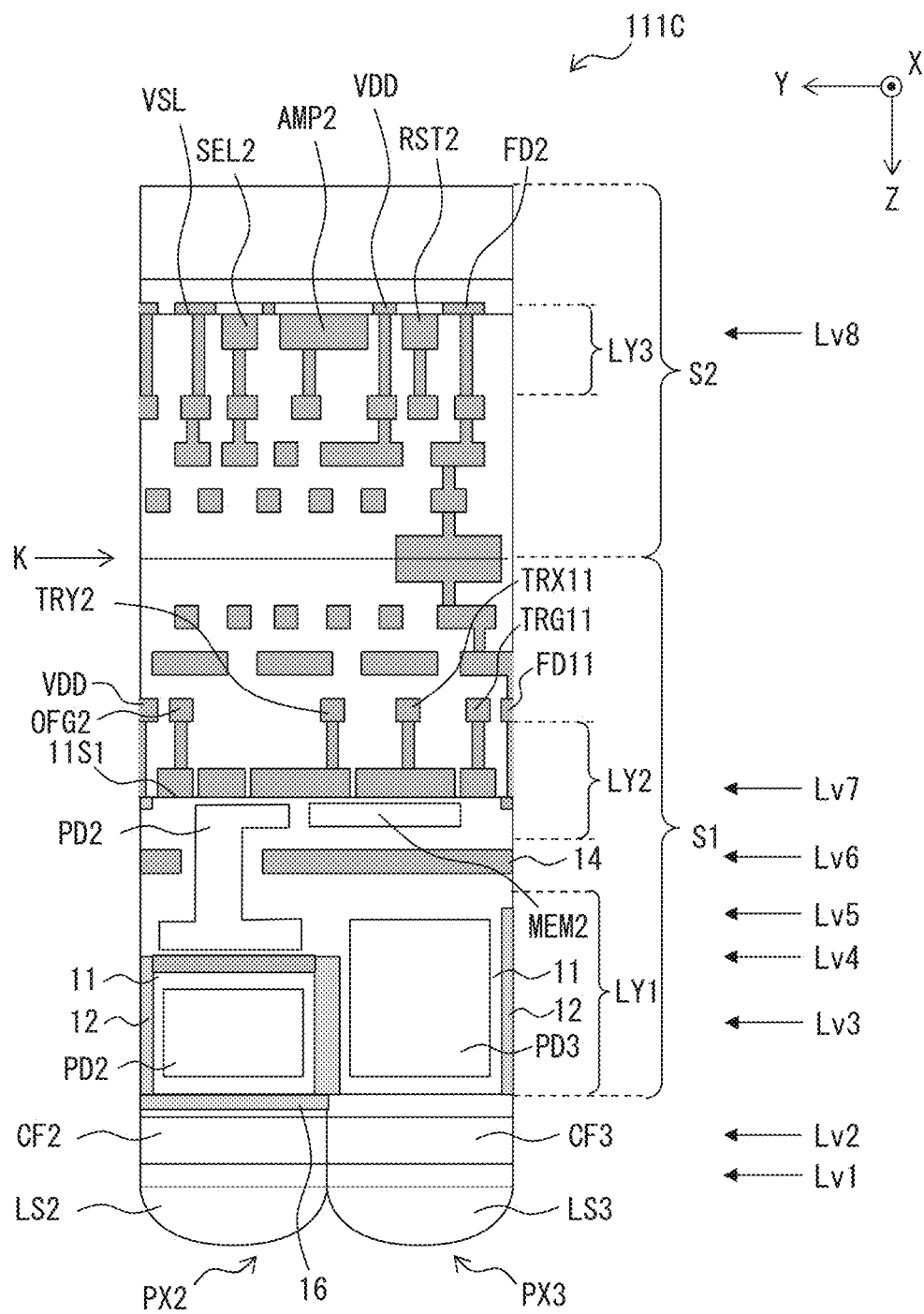

[FIG. 13]
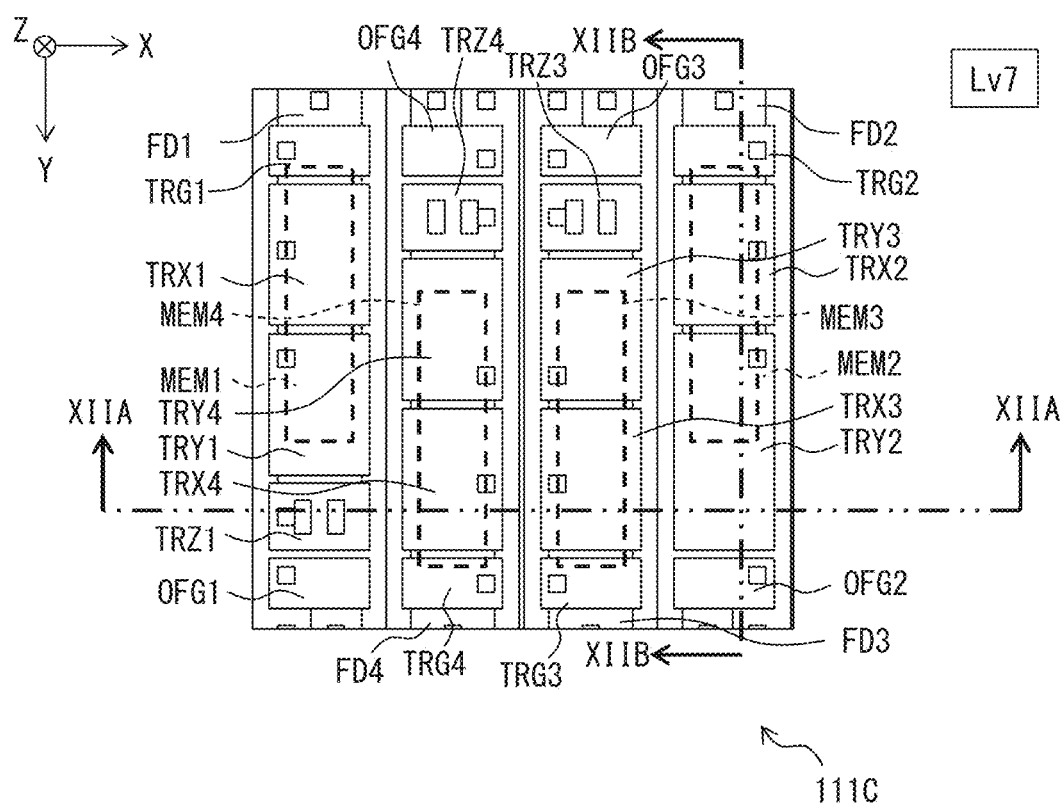

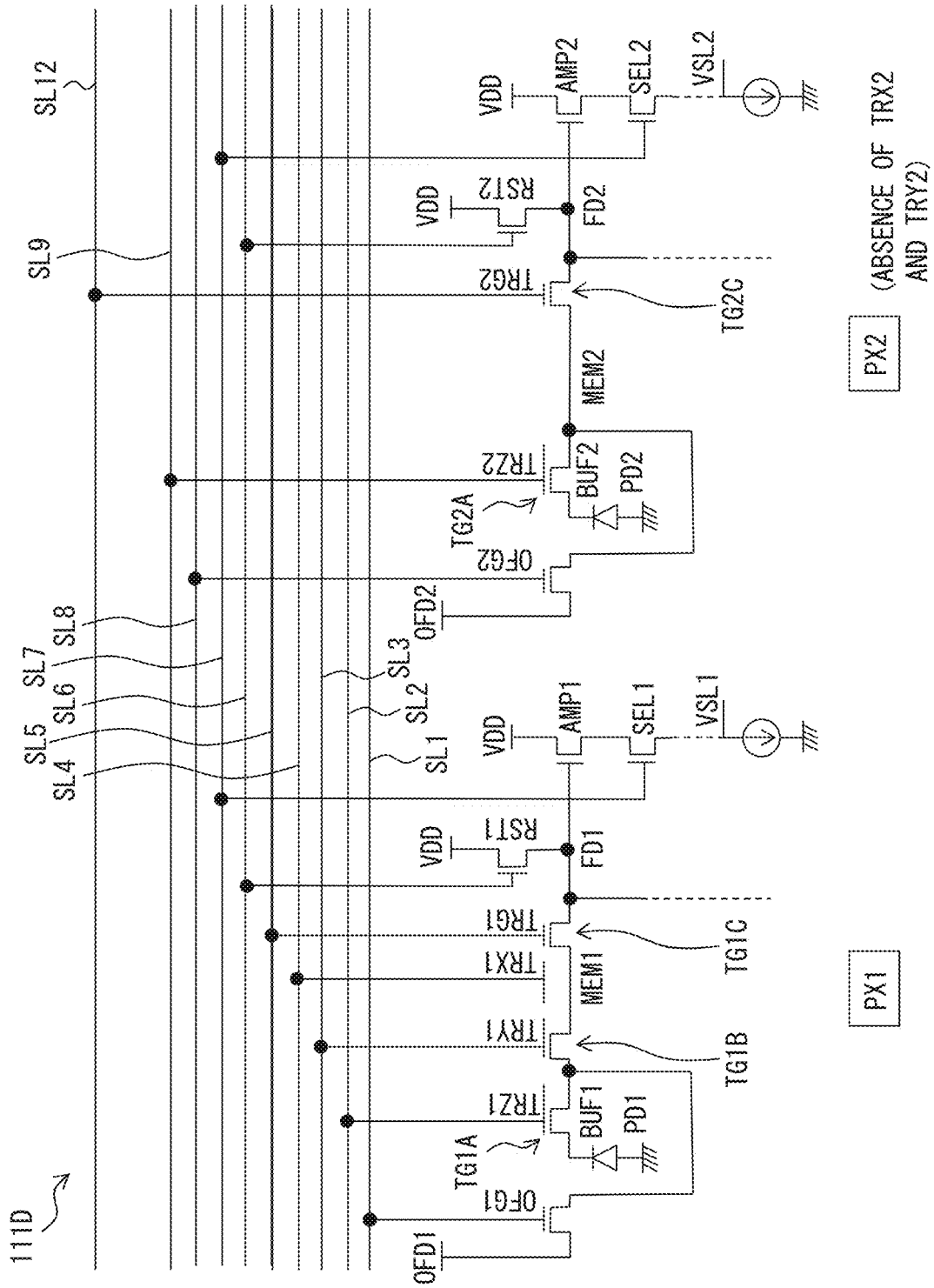
[FIG. 14]

[FIG. 15A]
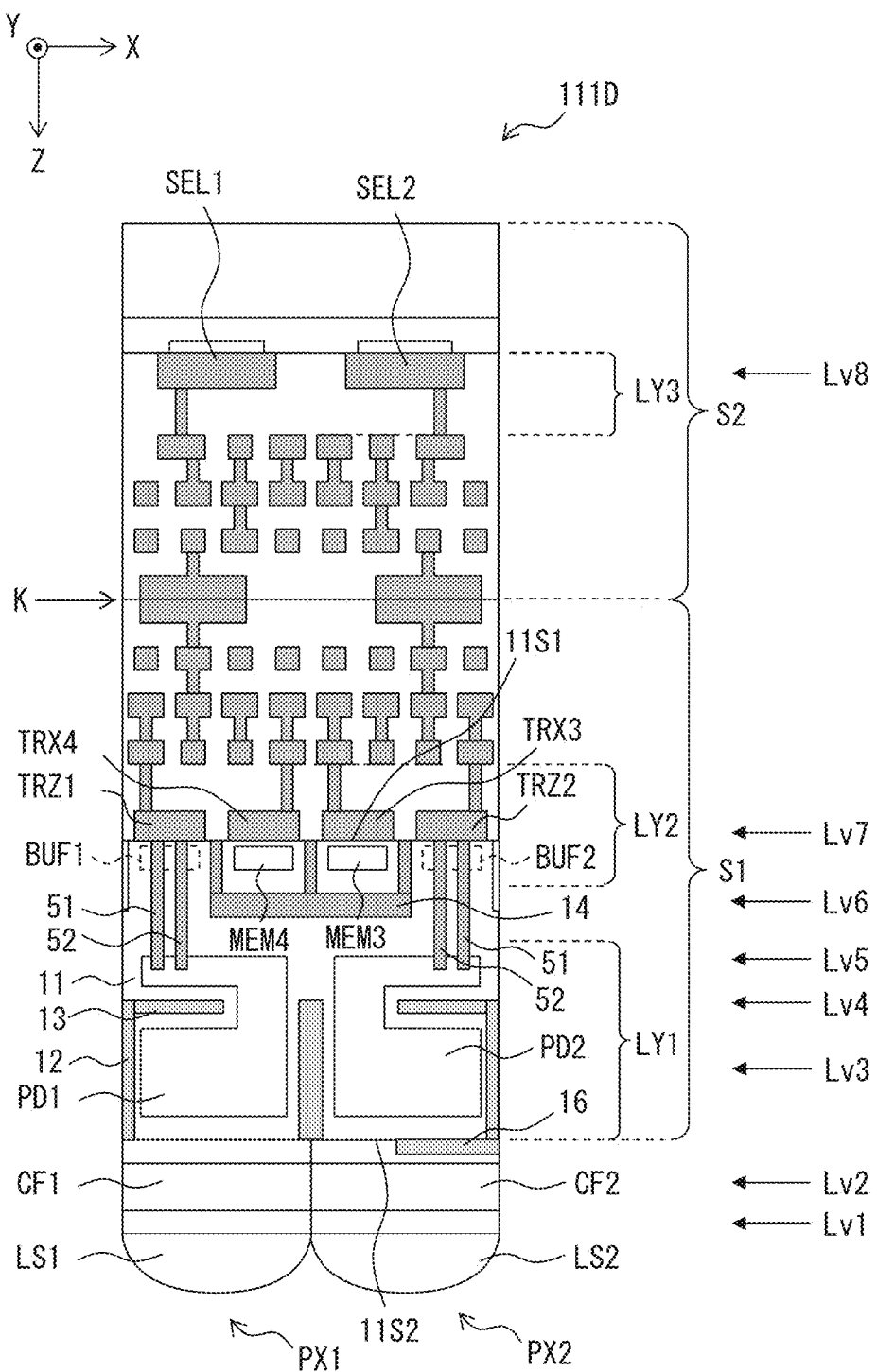

[FIG. 15B]
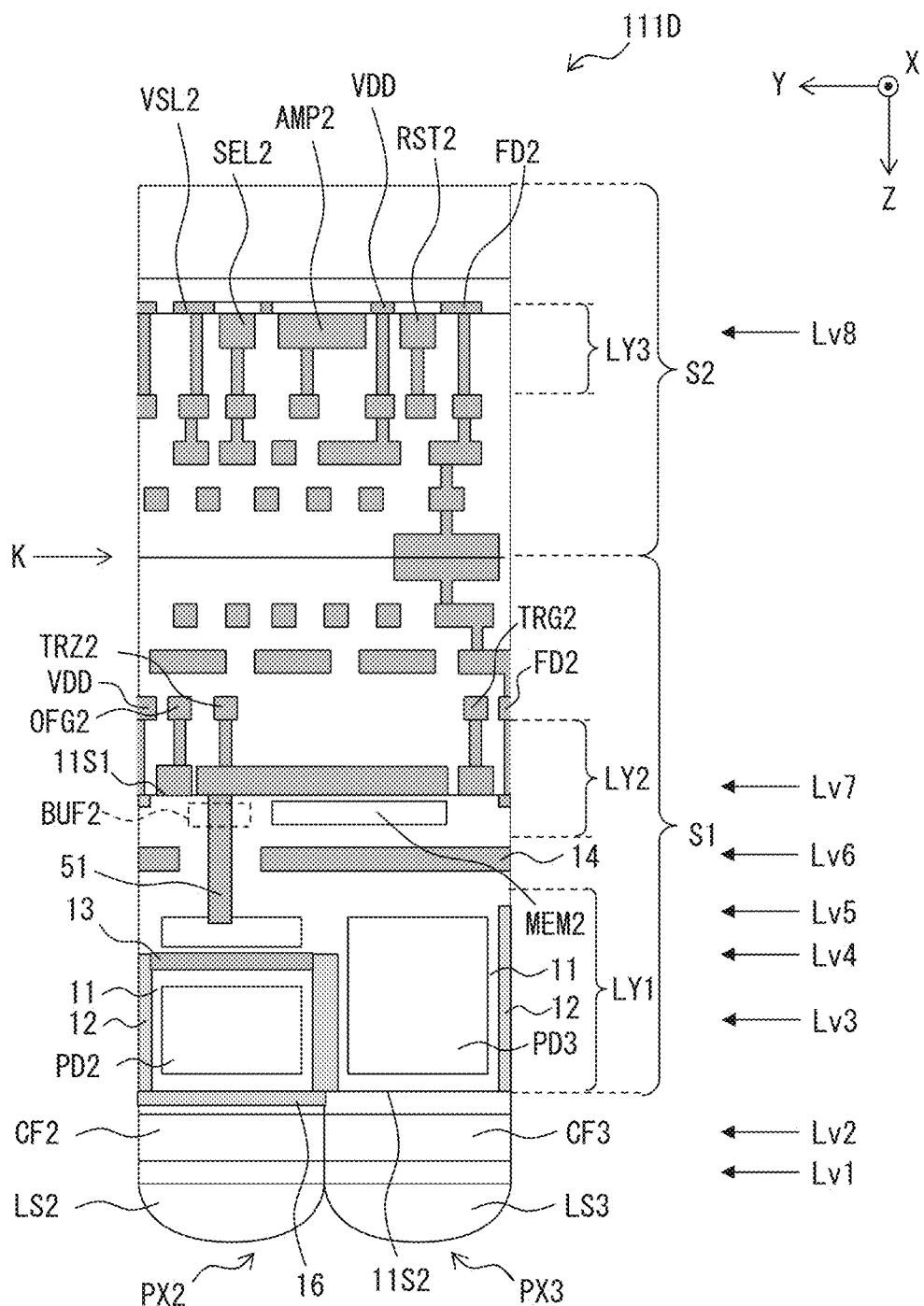

[FIG. 16]
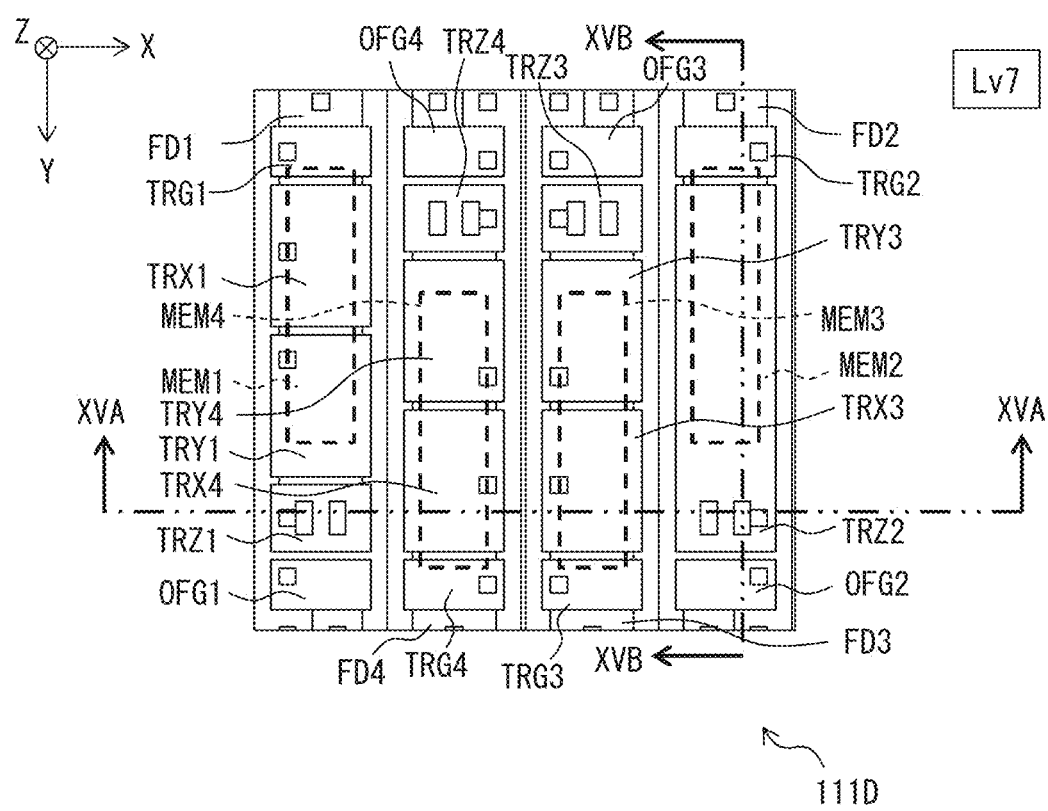

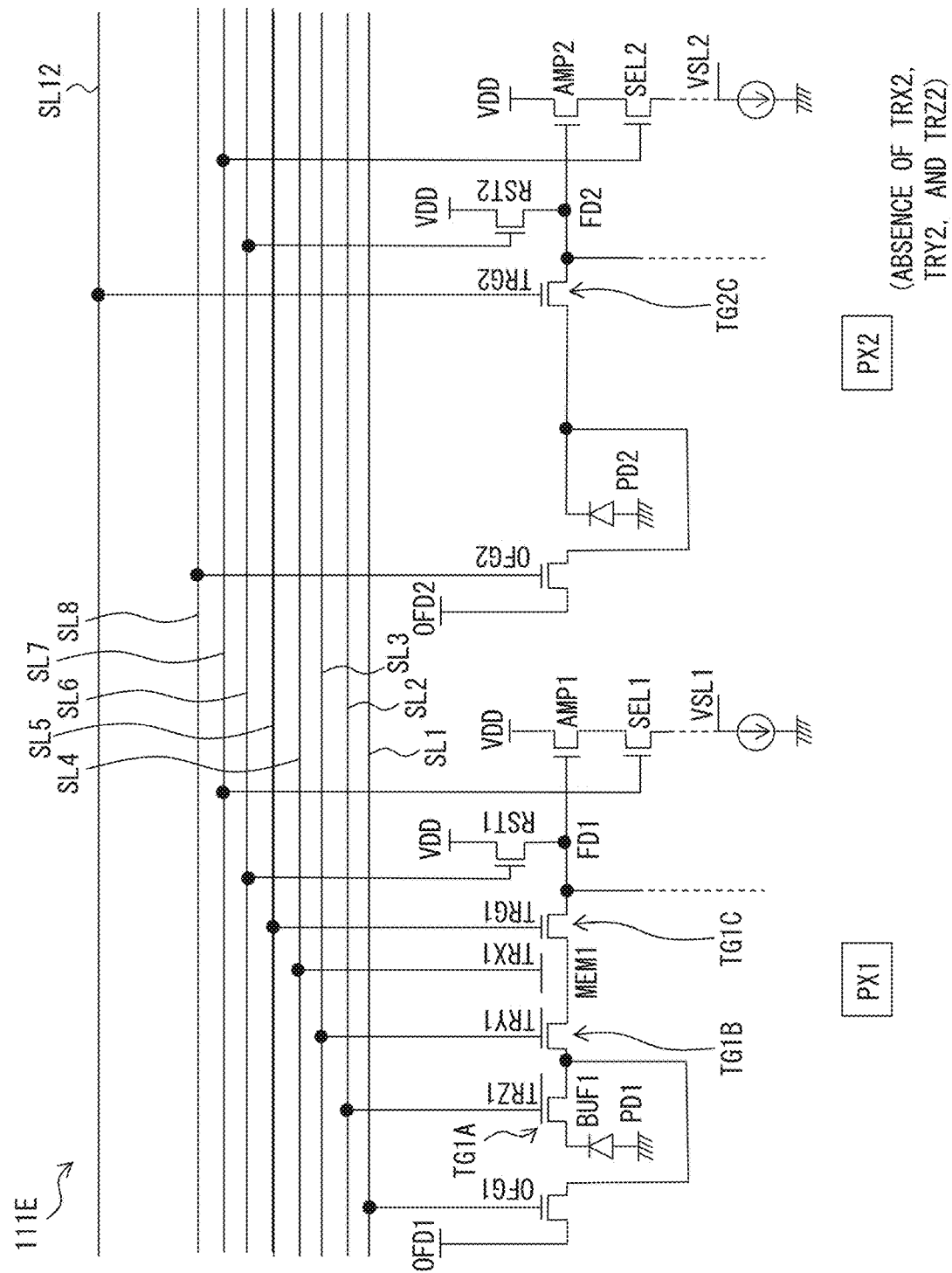
[ FIG. 17 ]

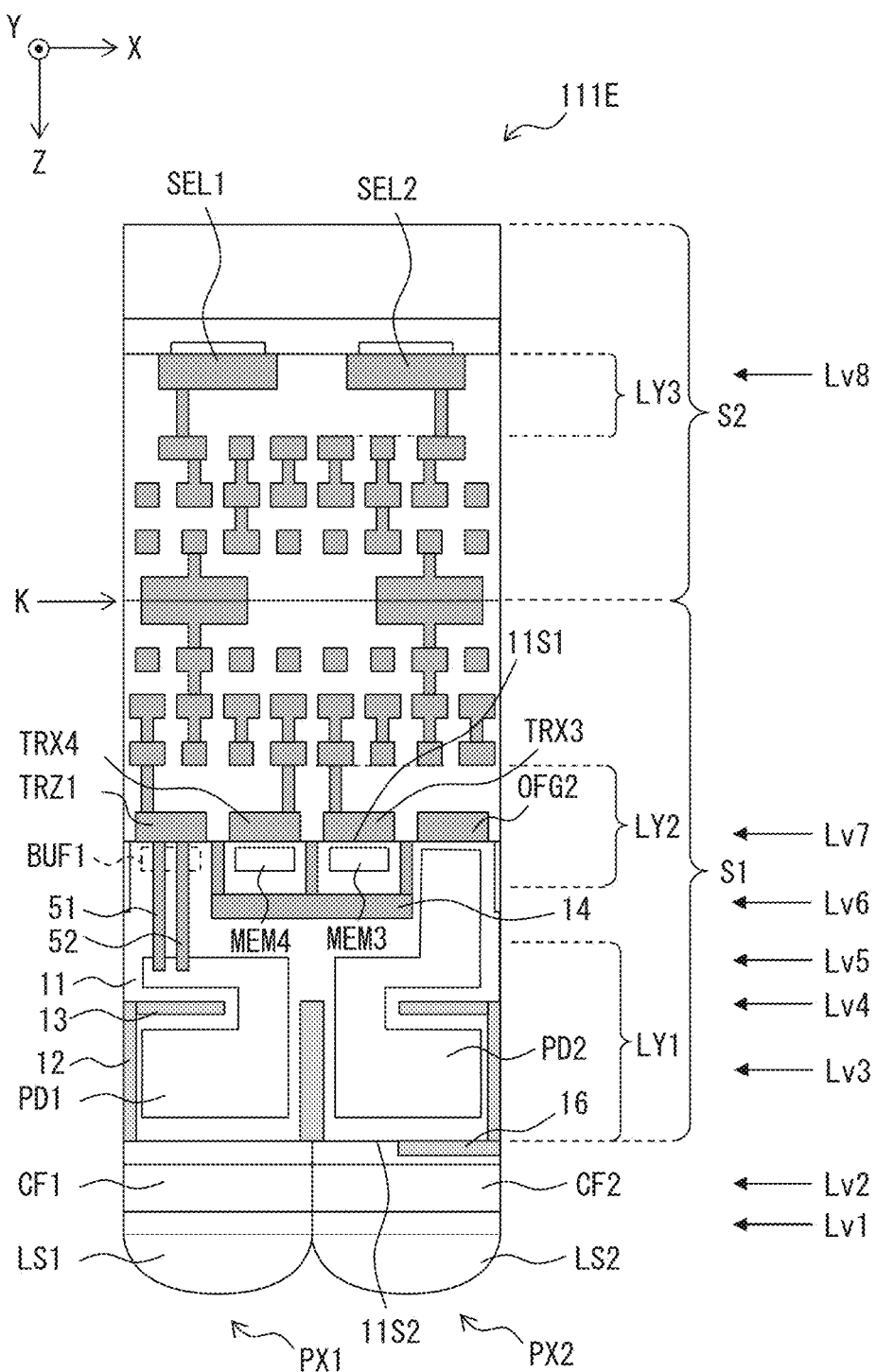
[FIG. 18A]

[FIG. 18B]
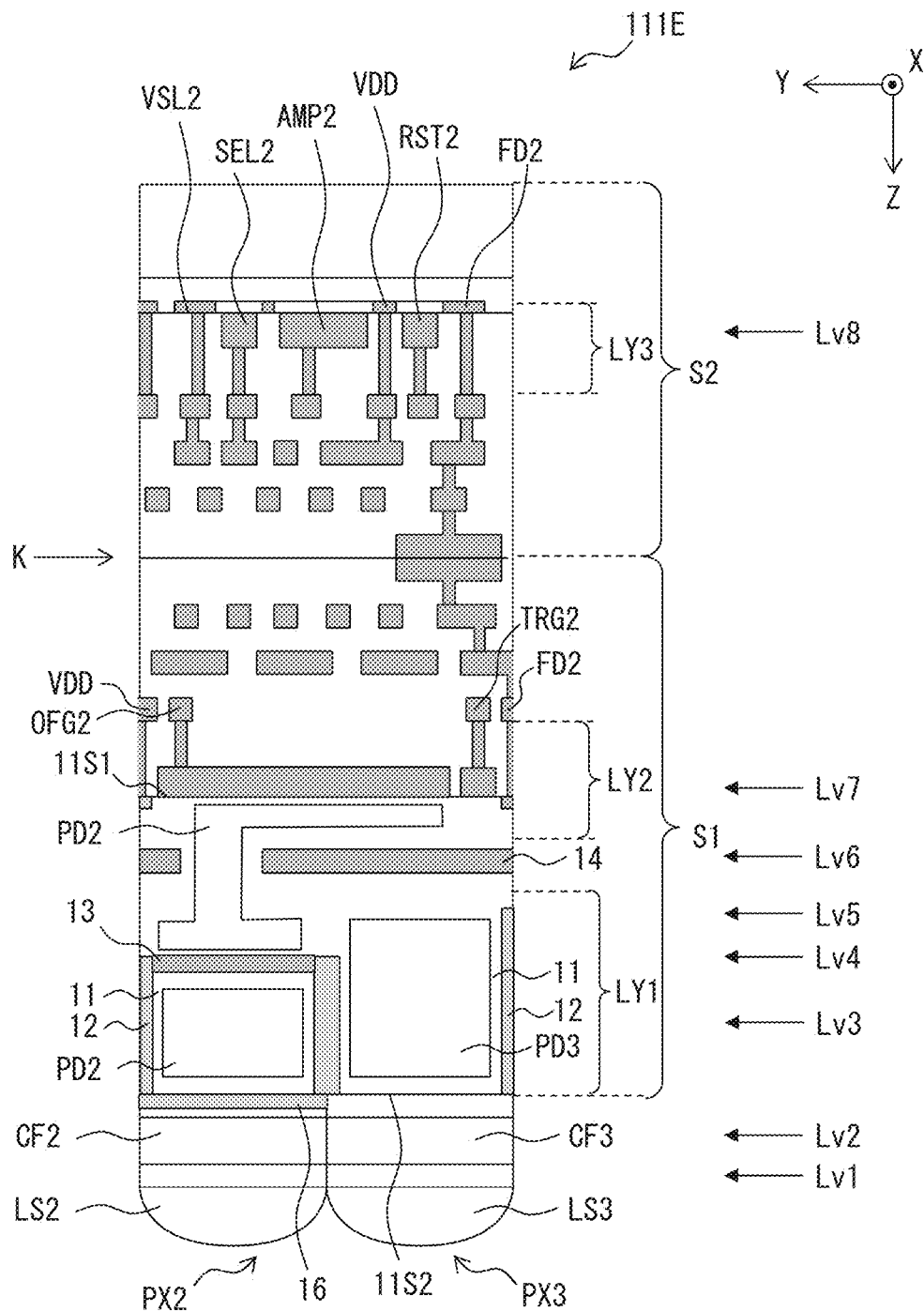

[FIG. 19]
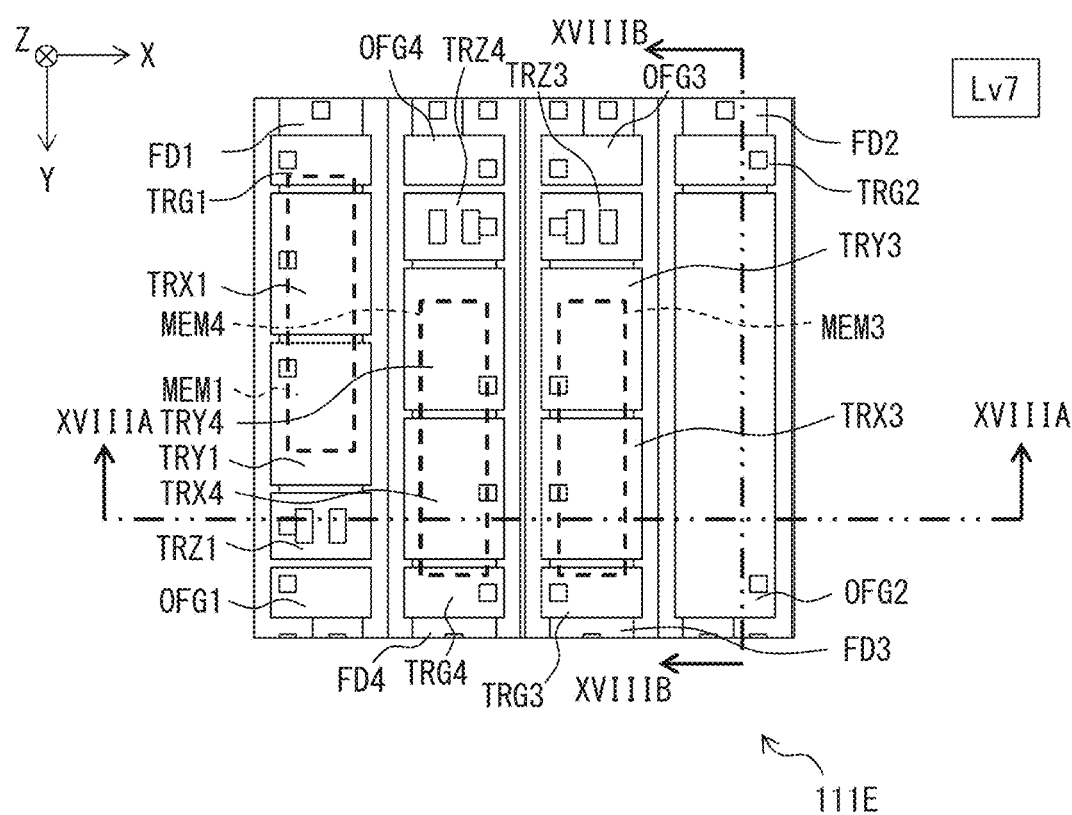

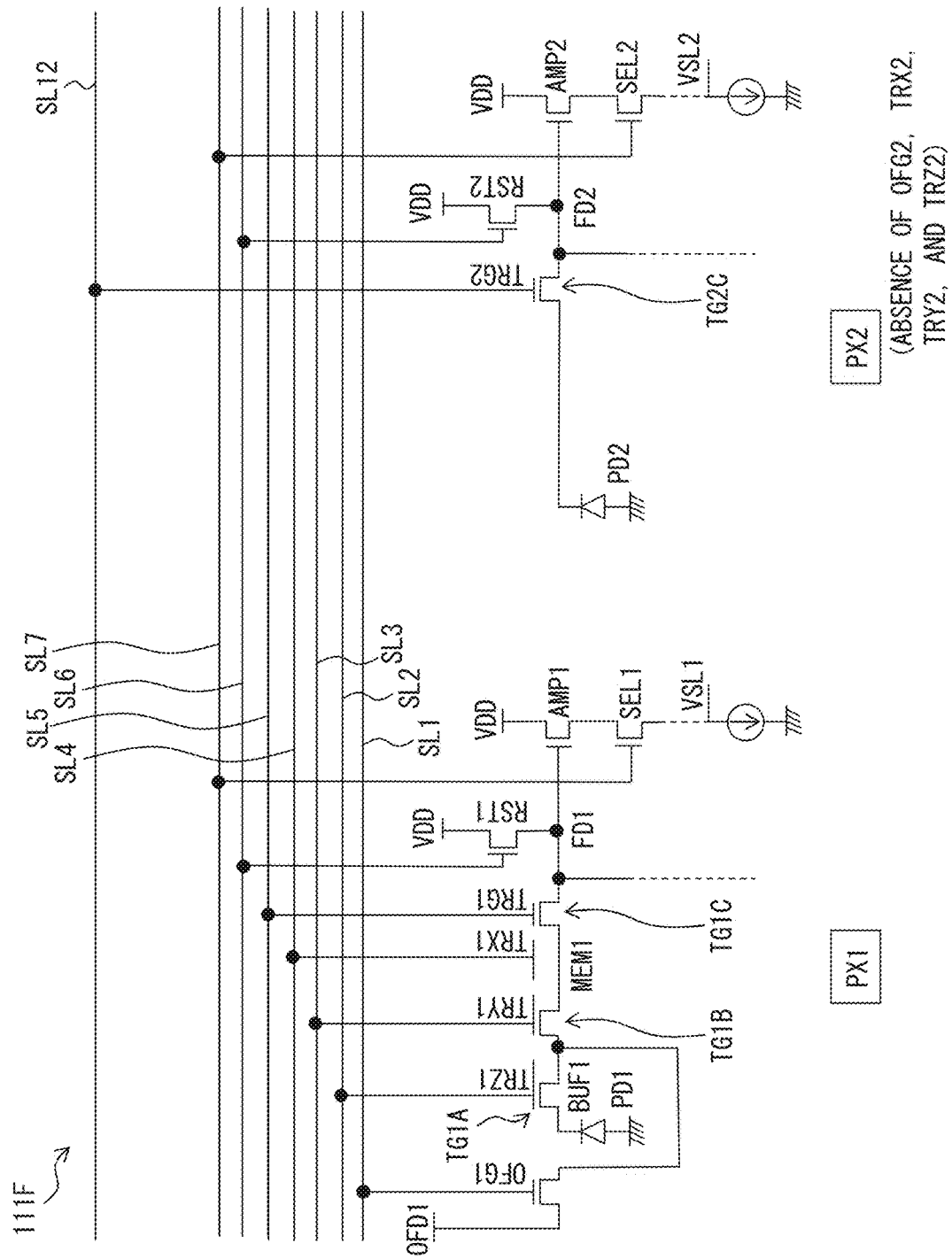
[FIG. 20]

[FIG. 21A]
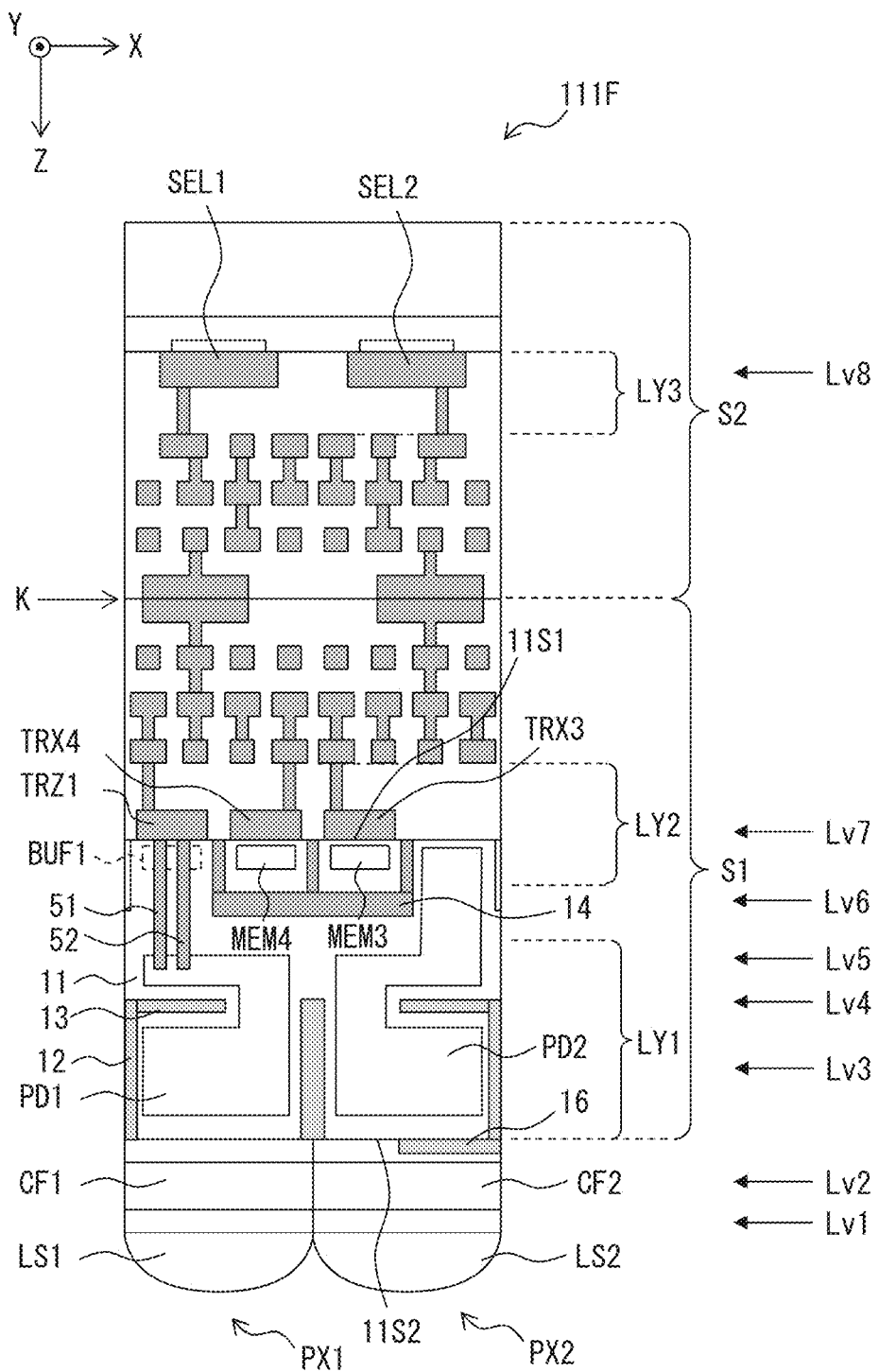

[FIG. 21B]
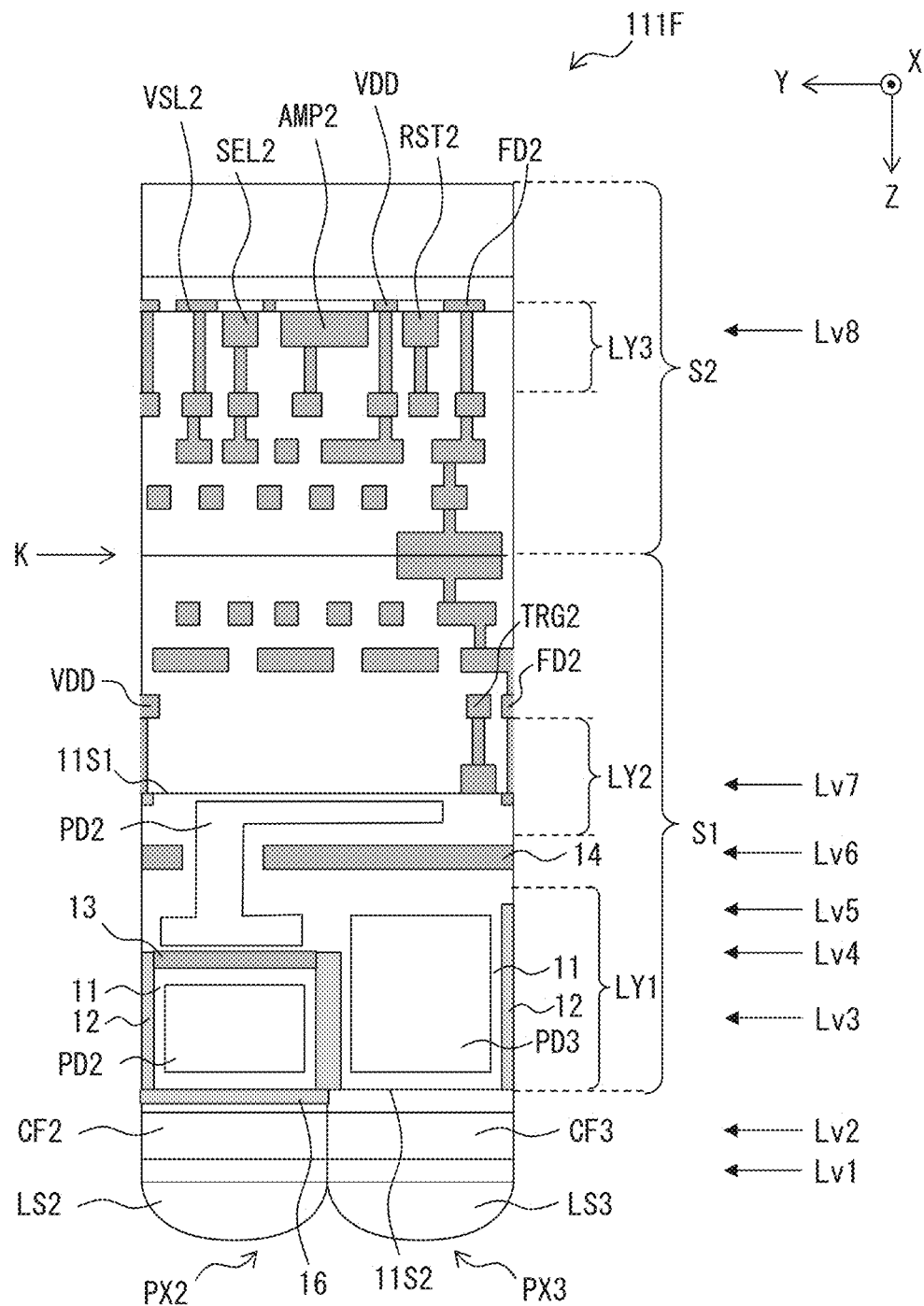

[FIG. 22]
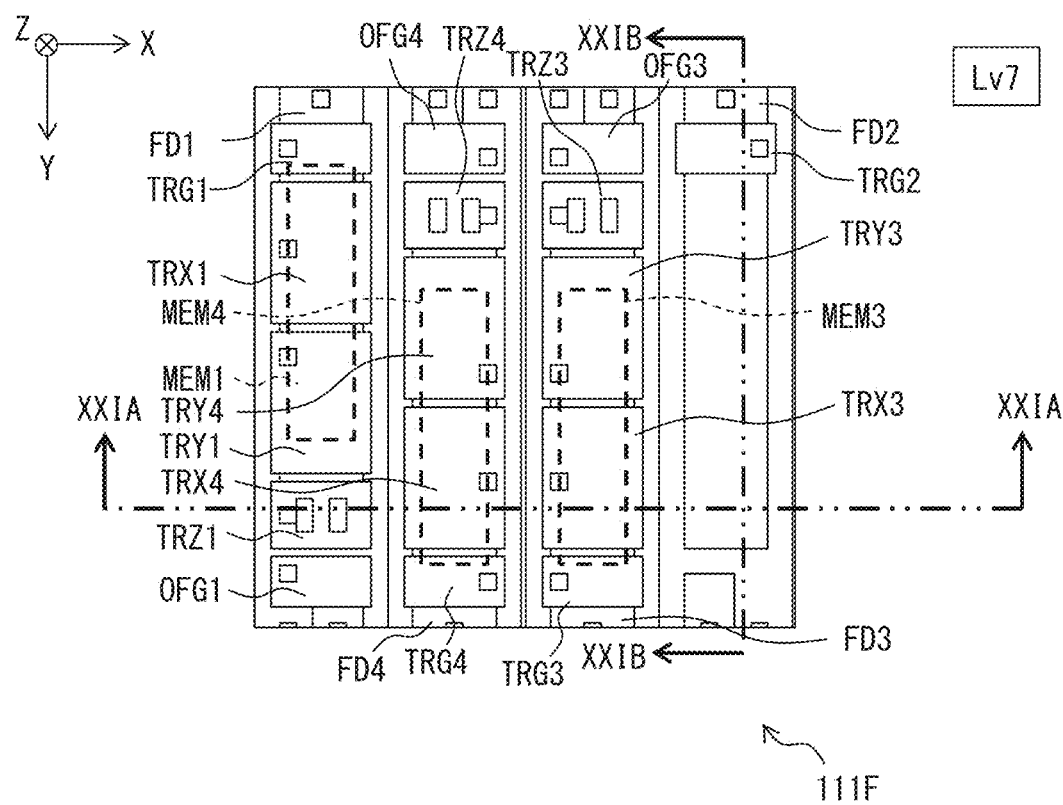

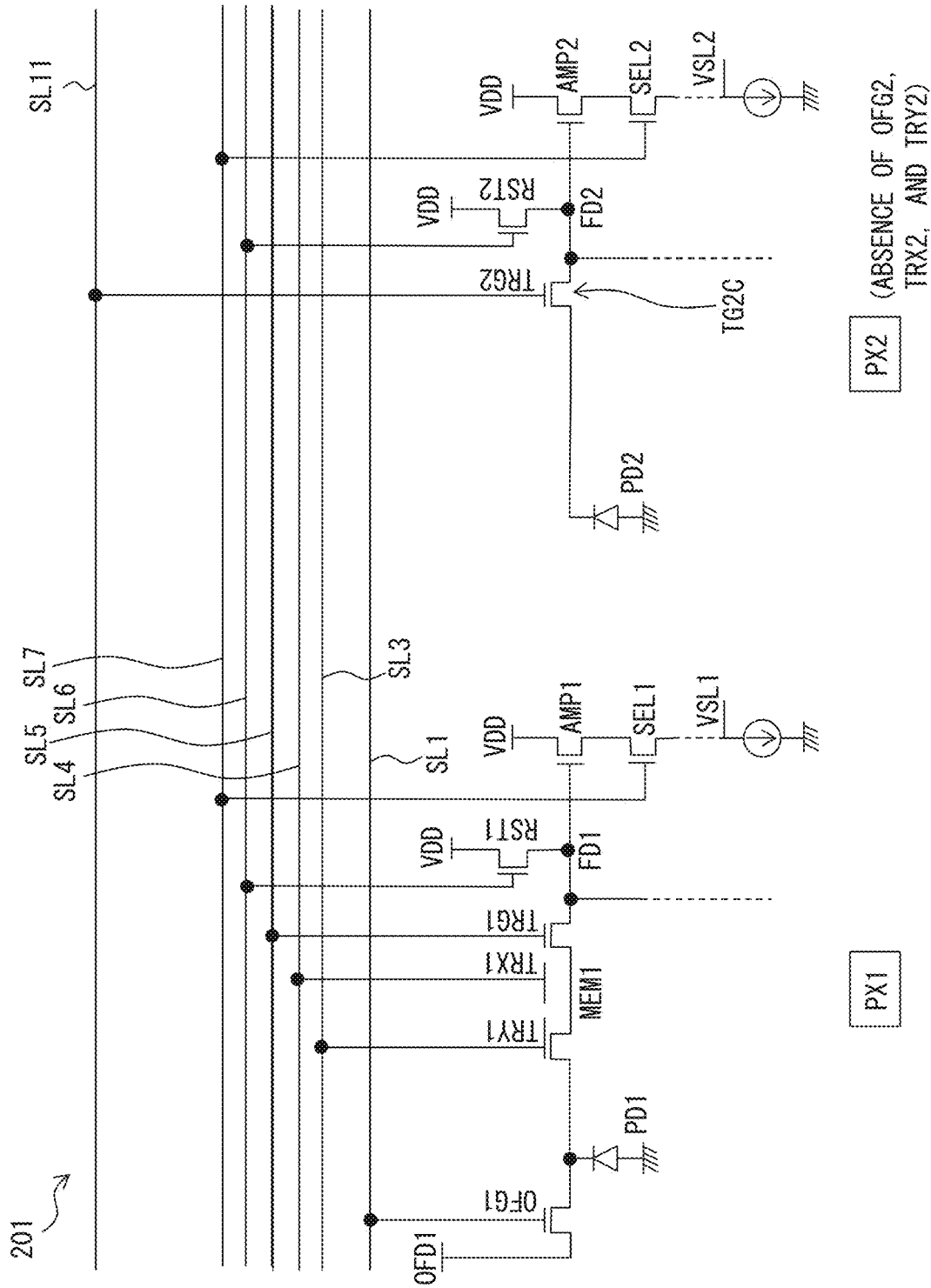
[FIG. 23]

[FIG. 24]
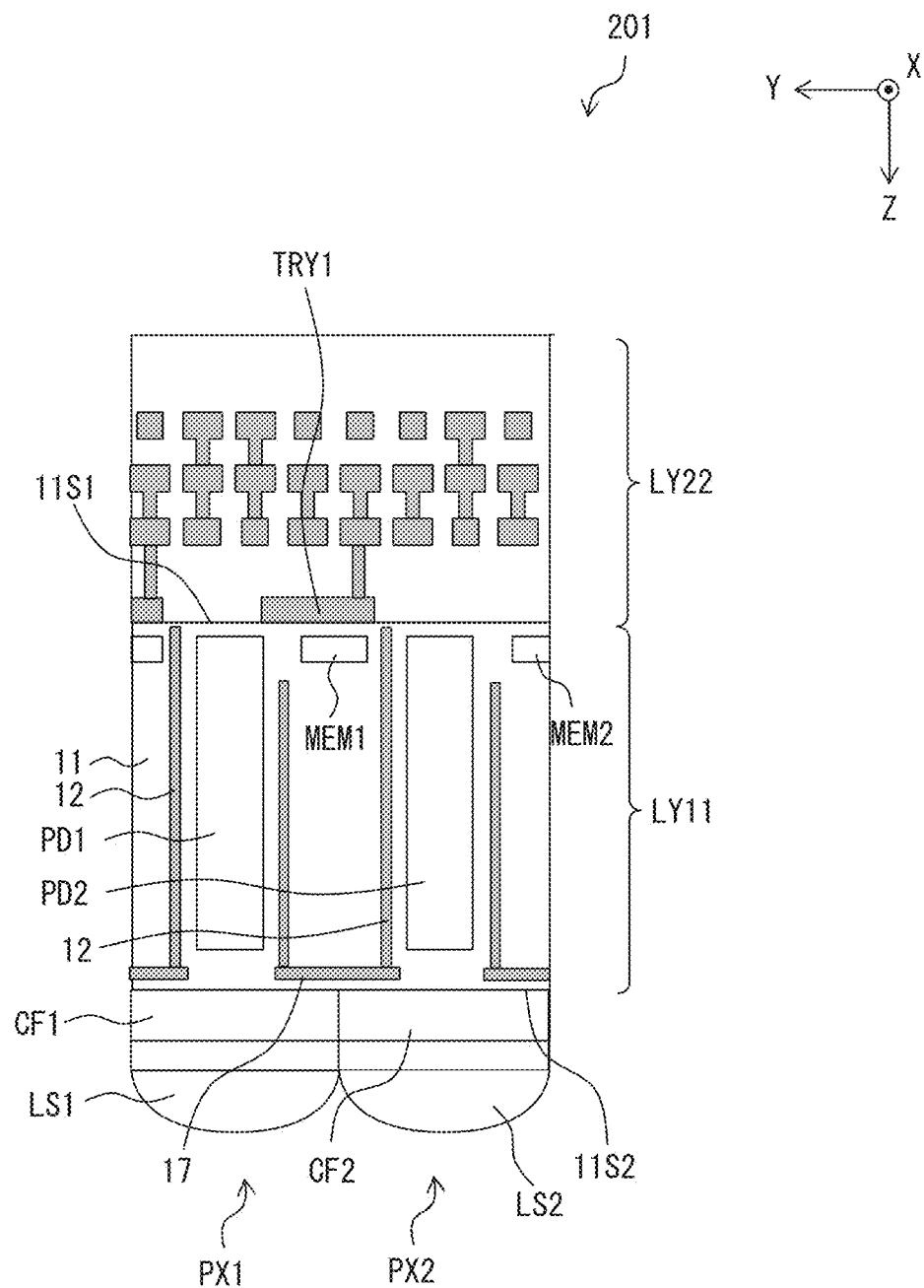

[FIG. 25]
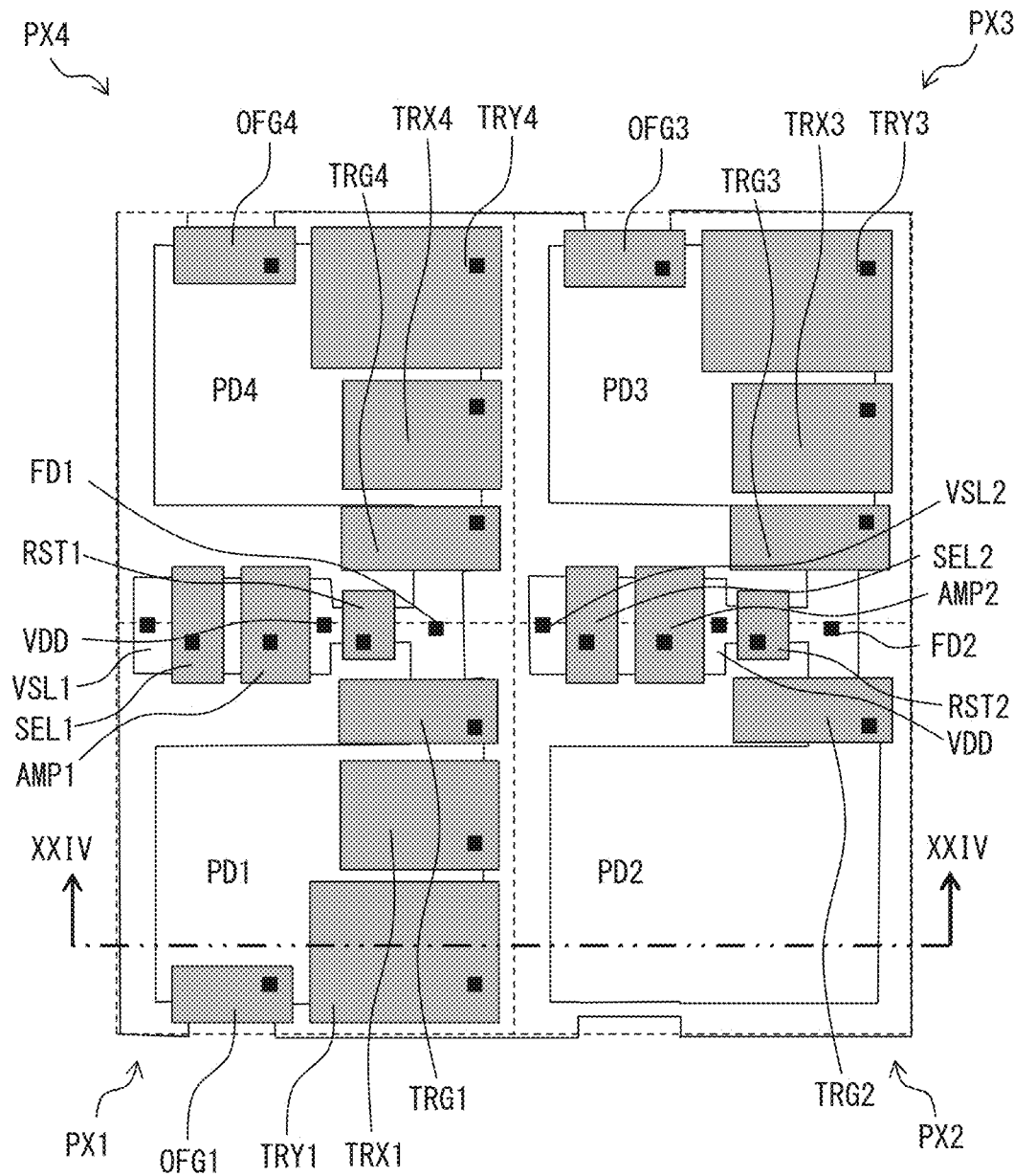

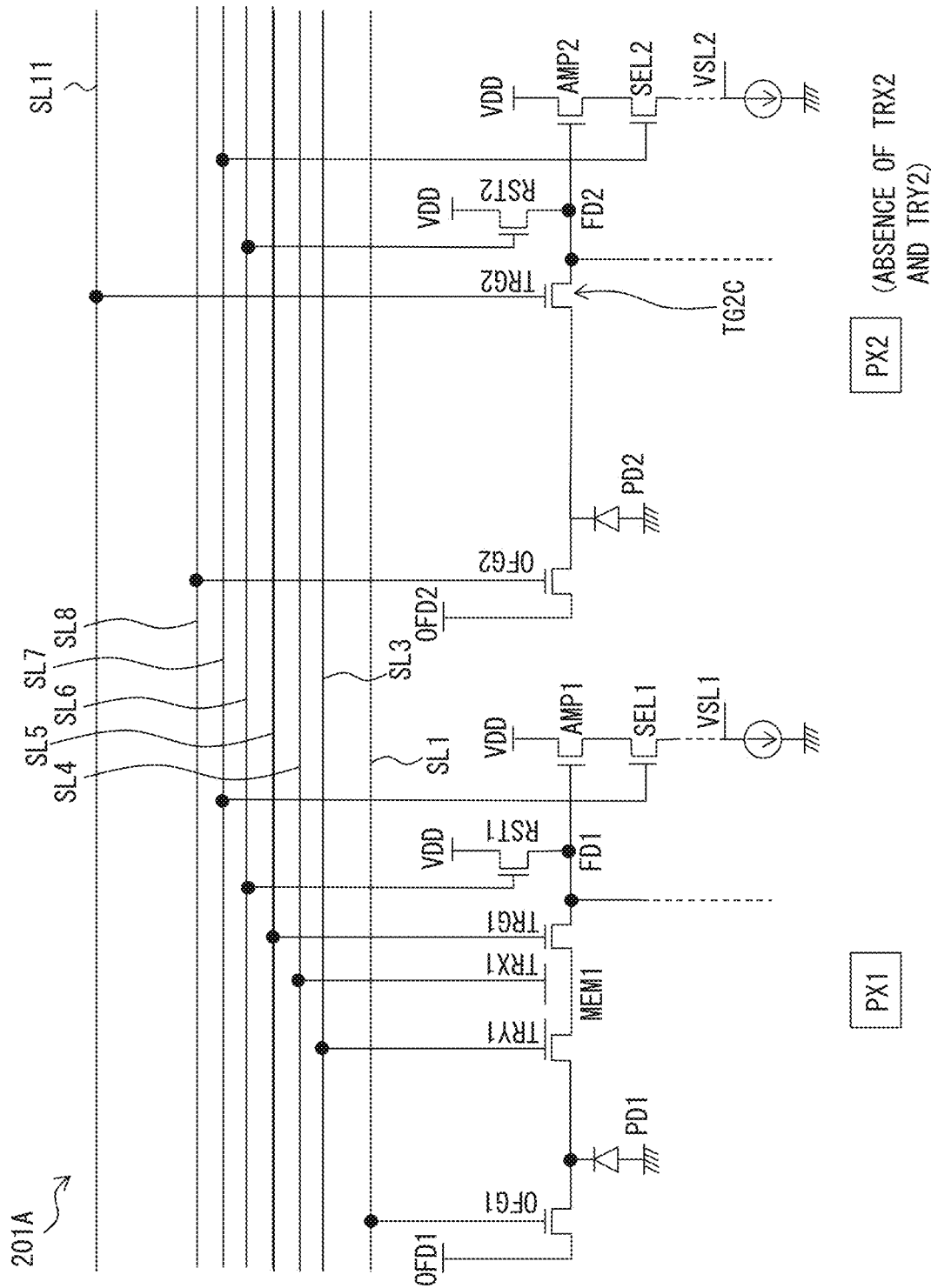
[FIG. 26]

[FIG. 27]
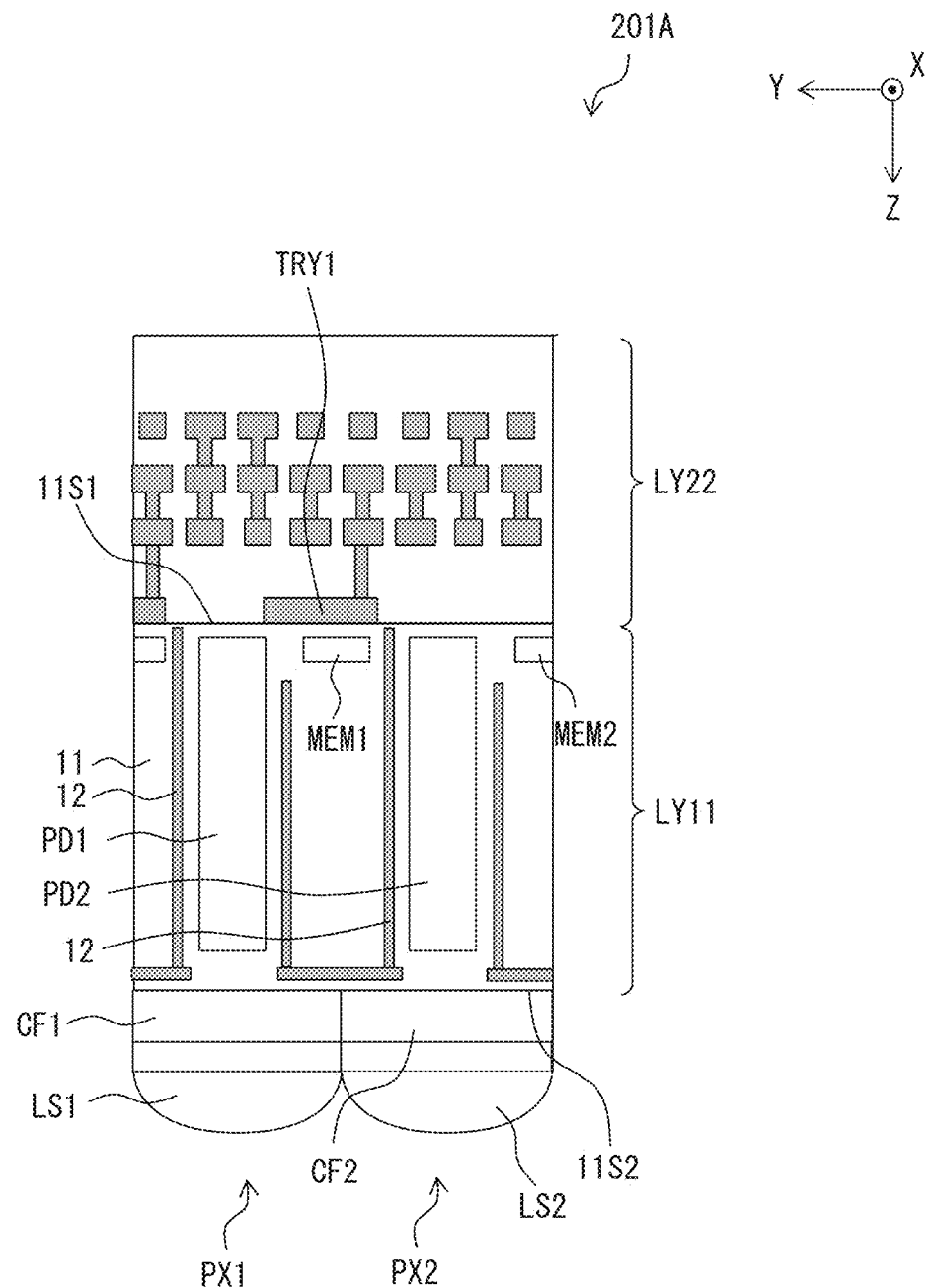

[FIG. 28]
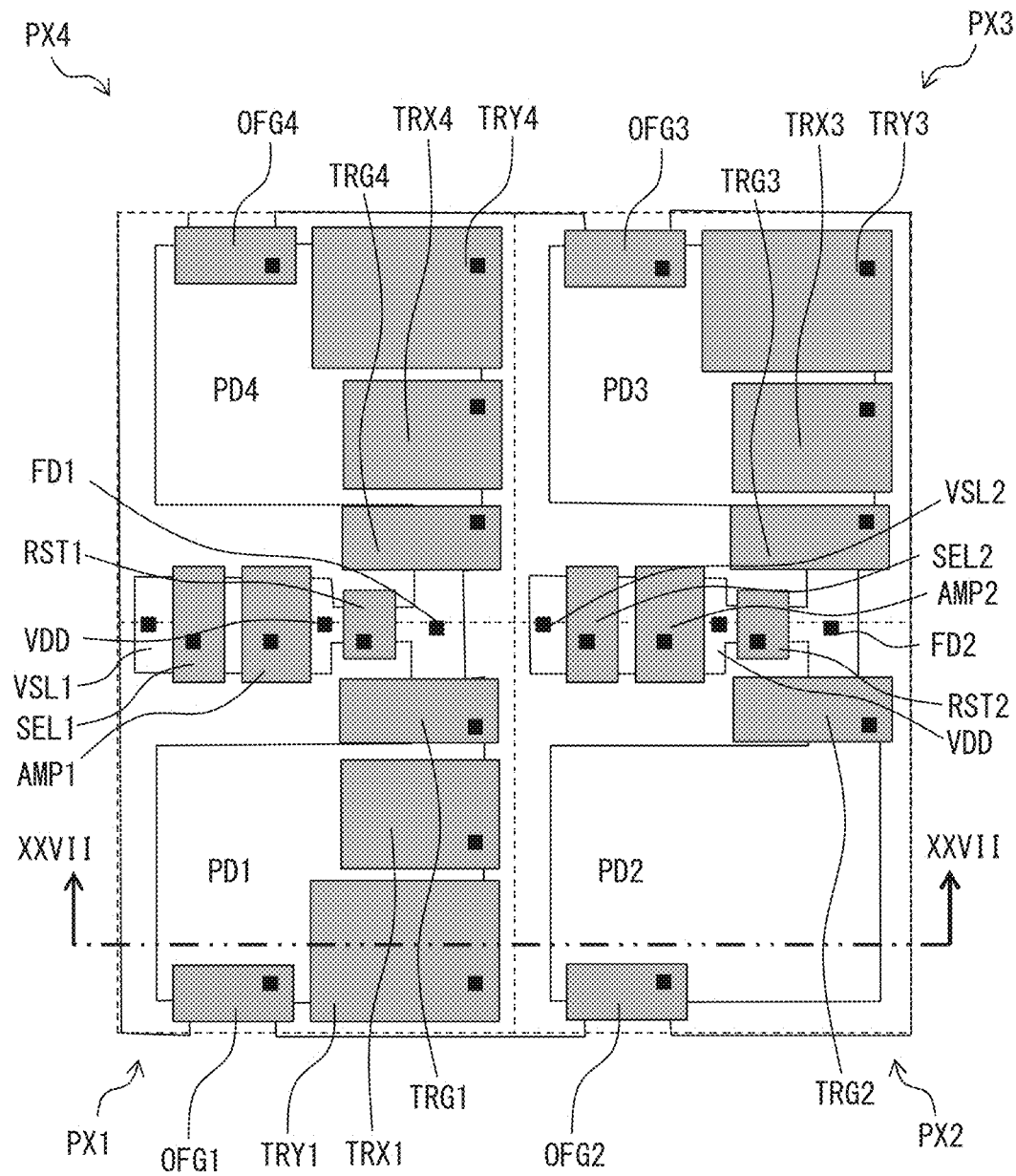

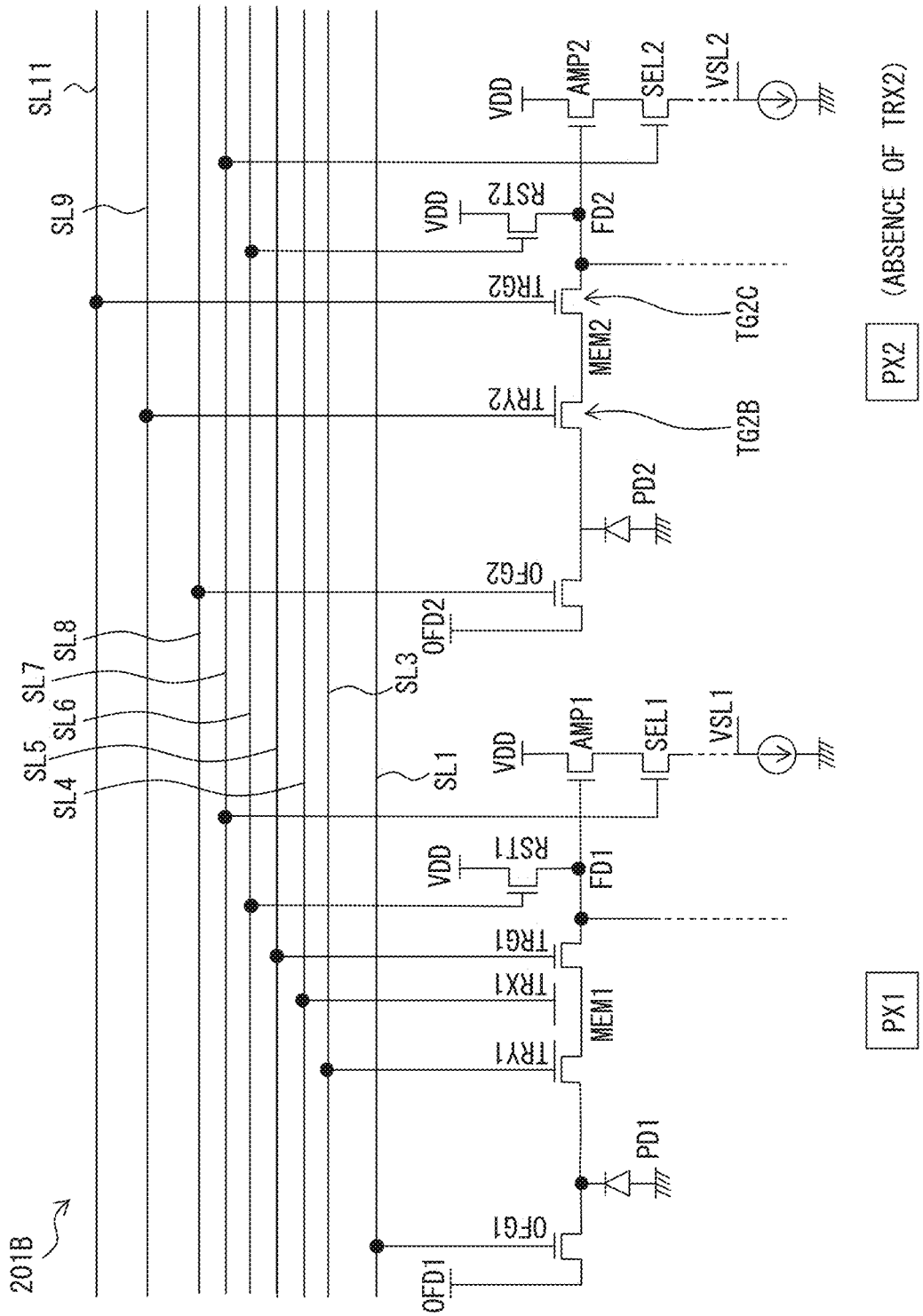
[FIG. 29]

[FIG. 30]
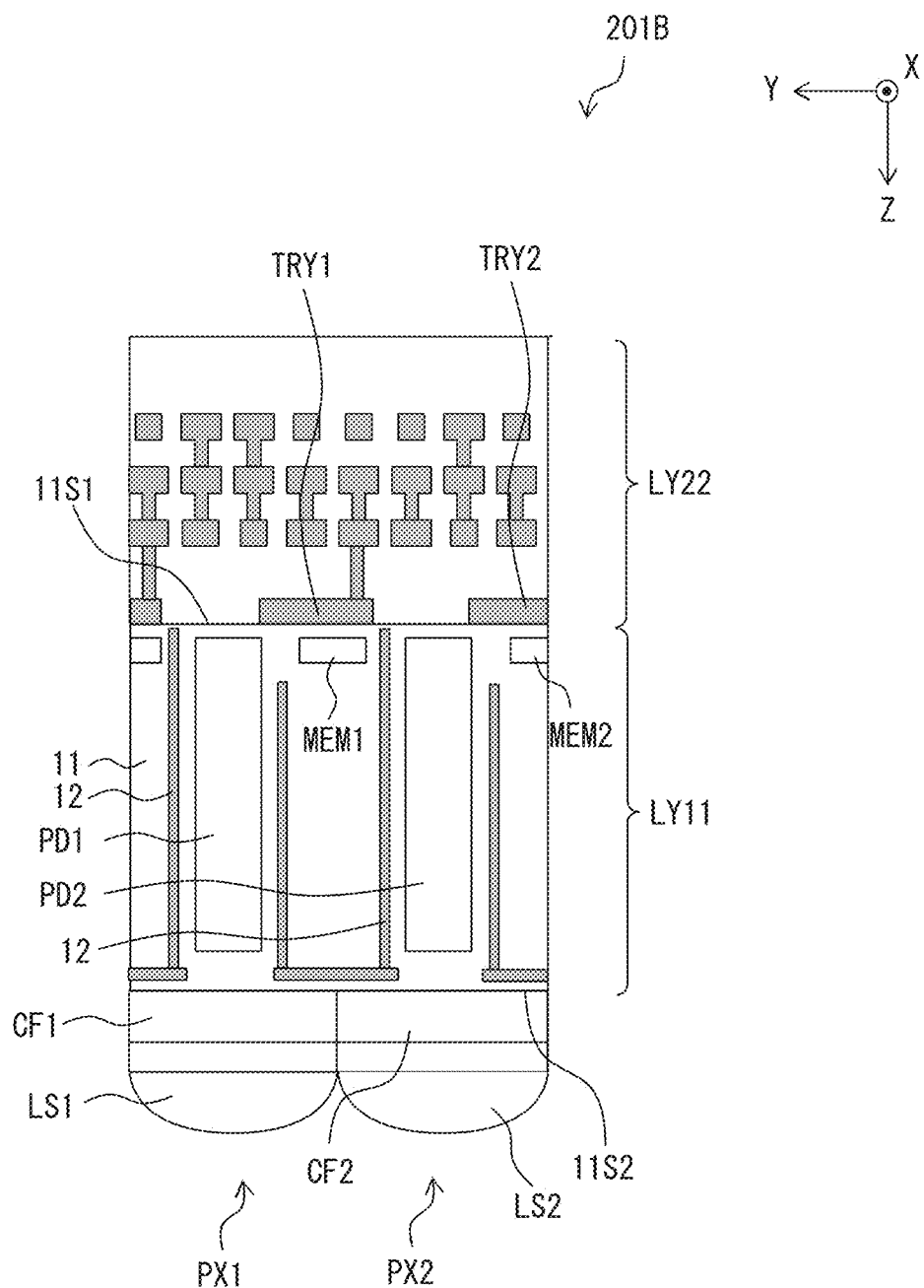

[FIG. 31]
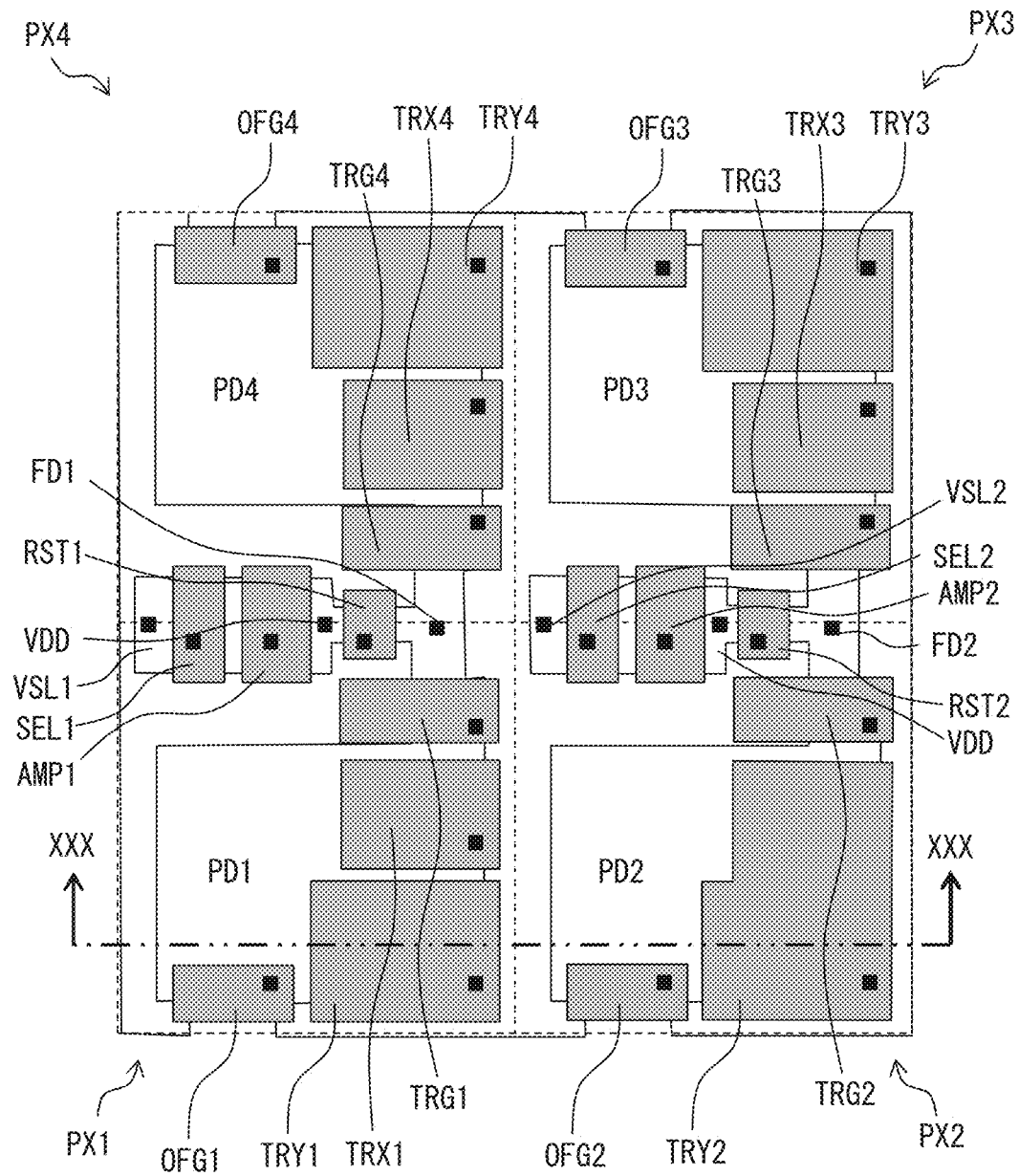

[FIG. 32]
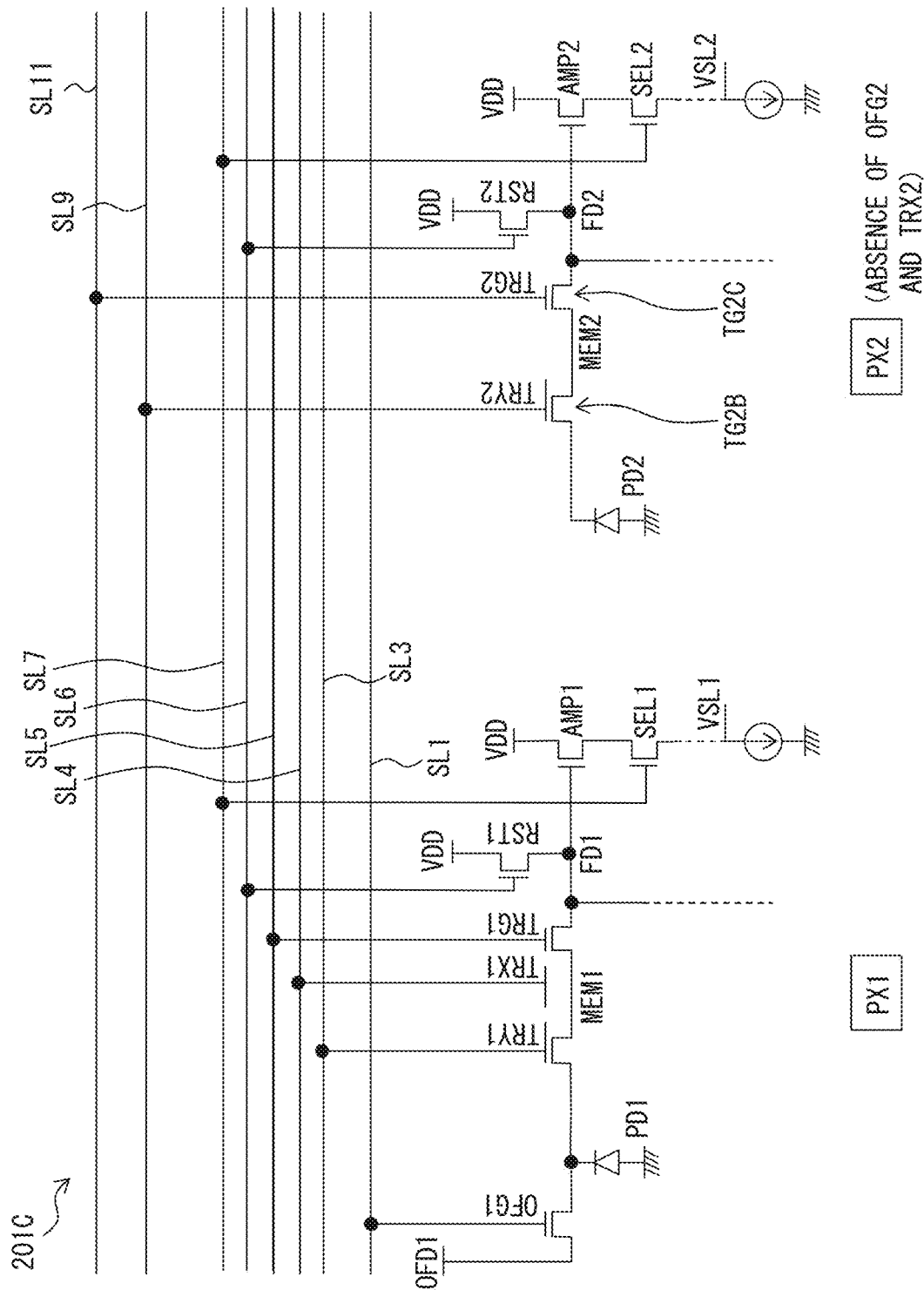

[FIG. 33]
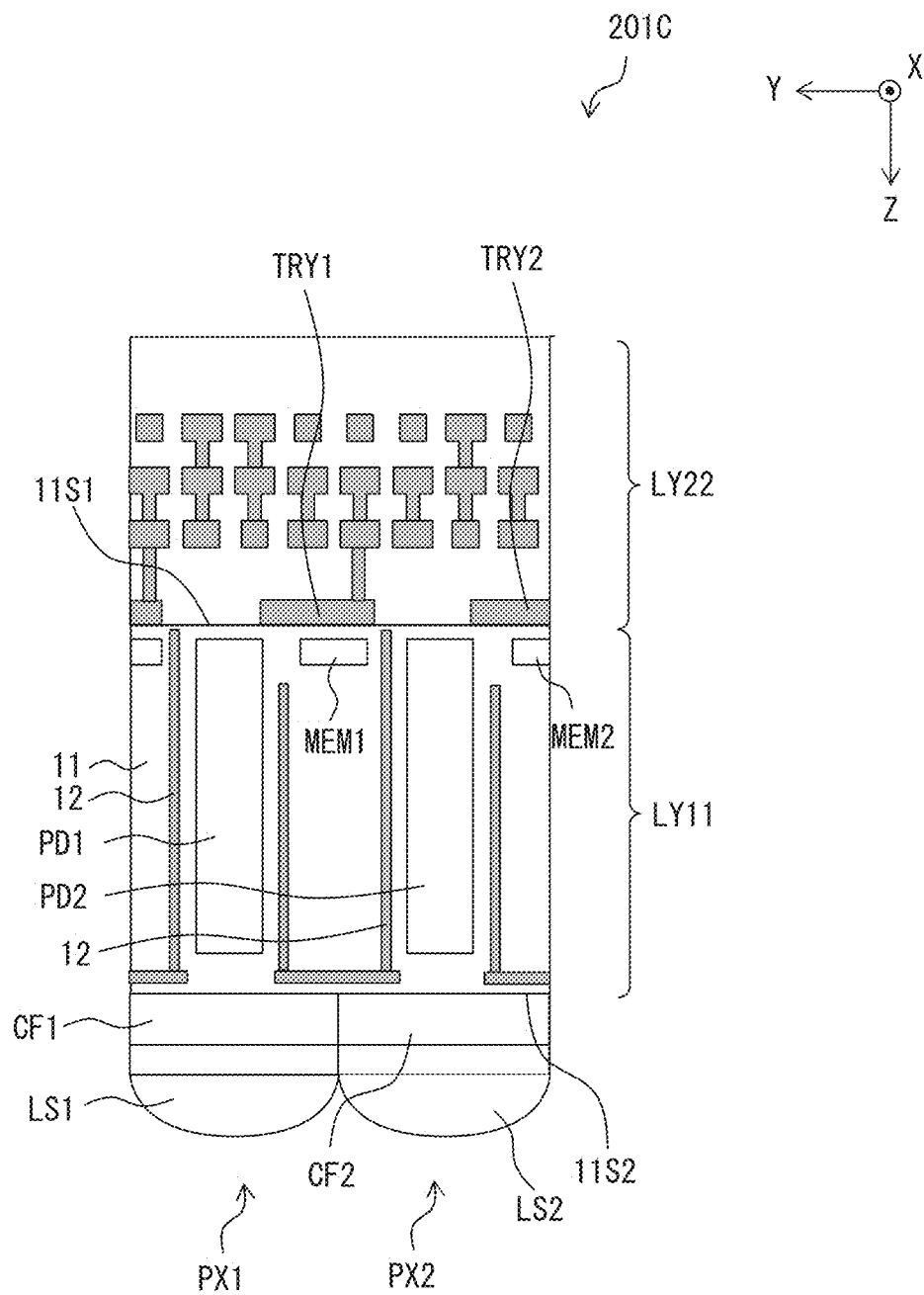

[FIG. 34]
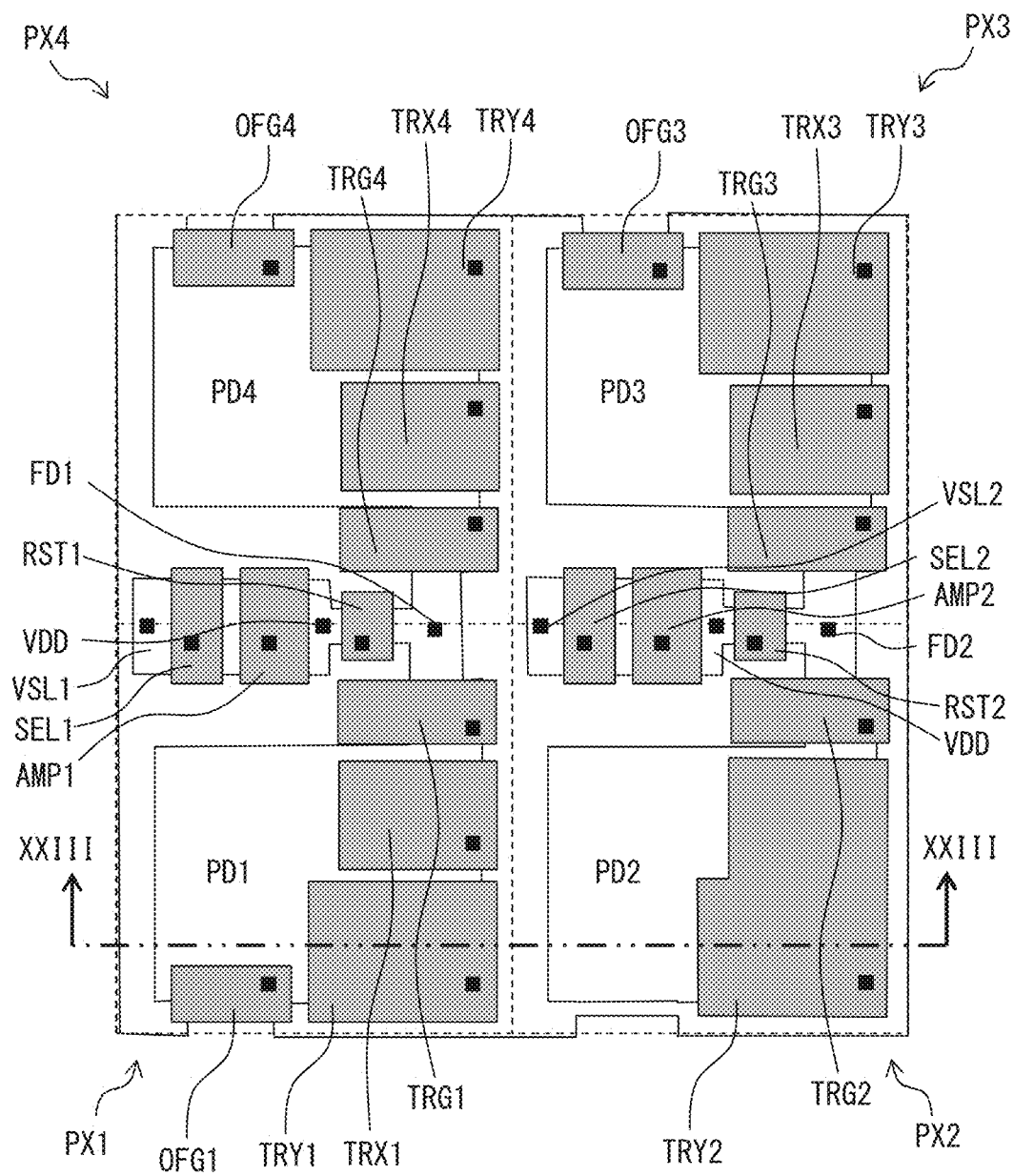

[FIG. 35]
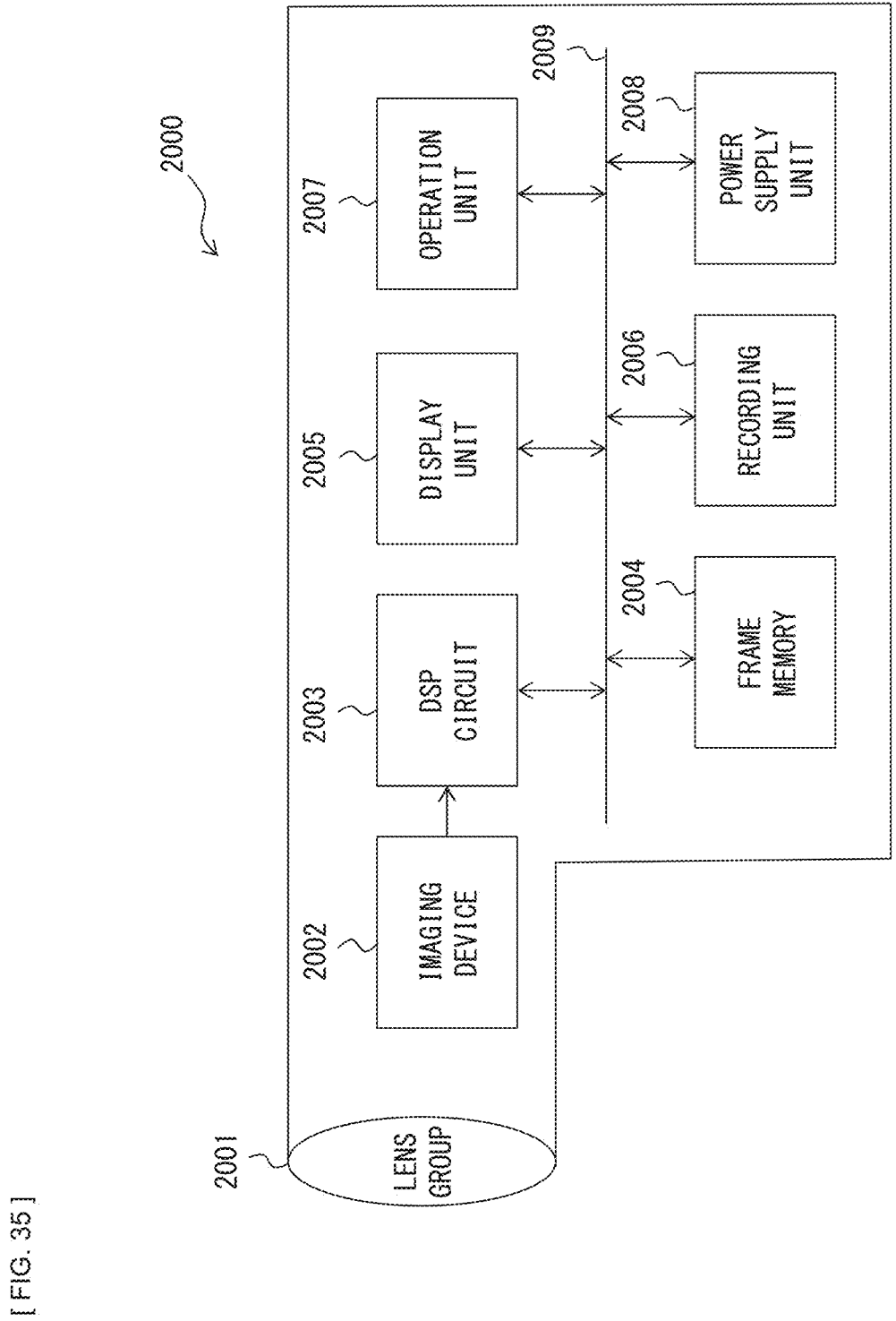

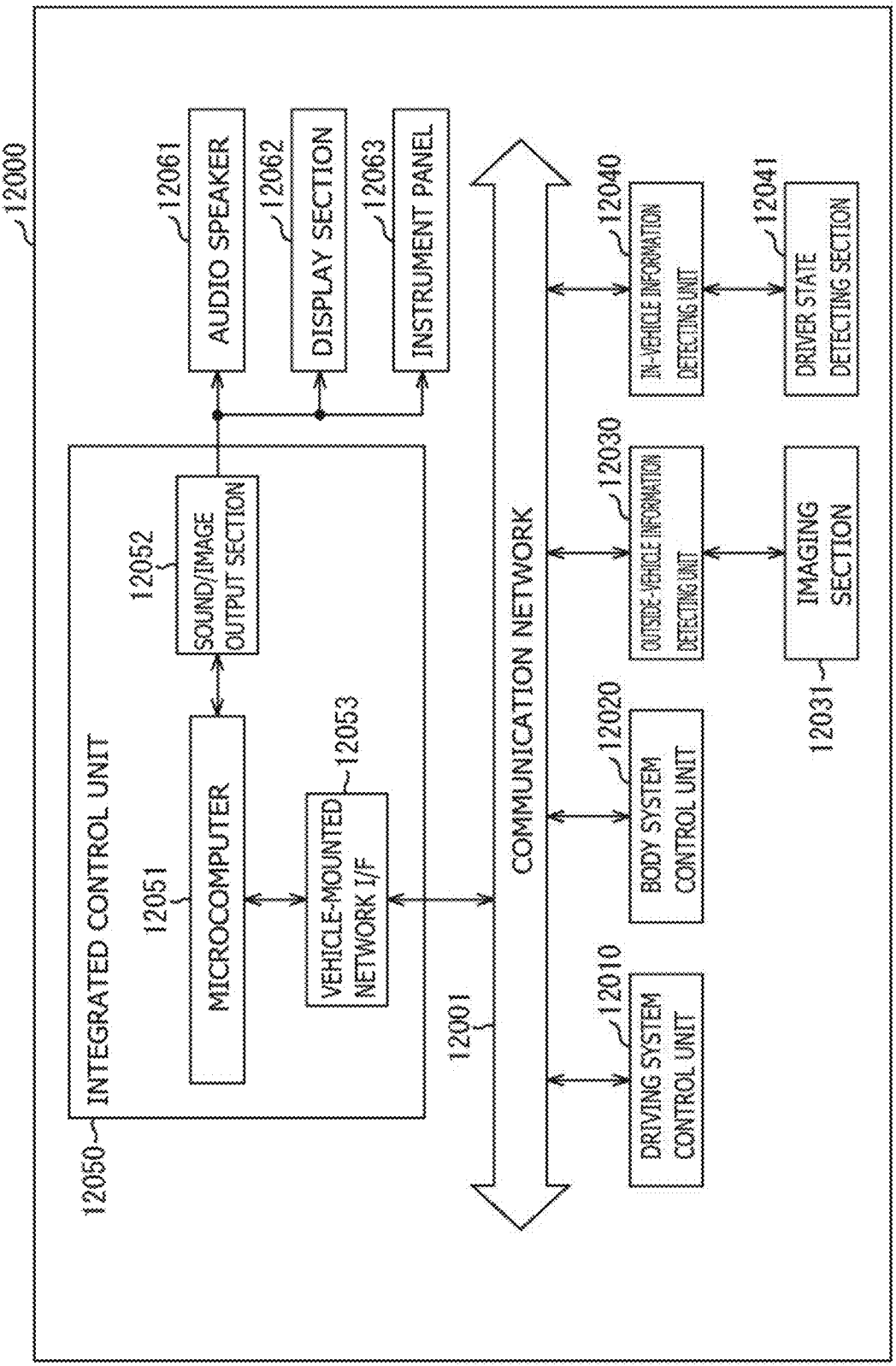

[FIG. 37]
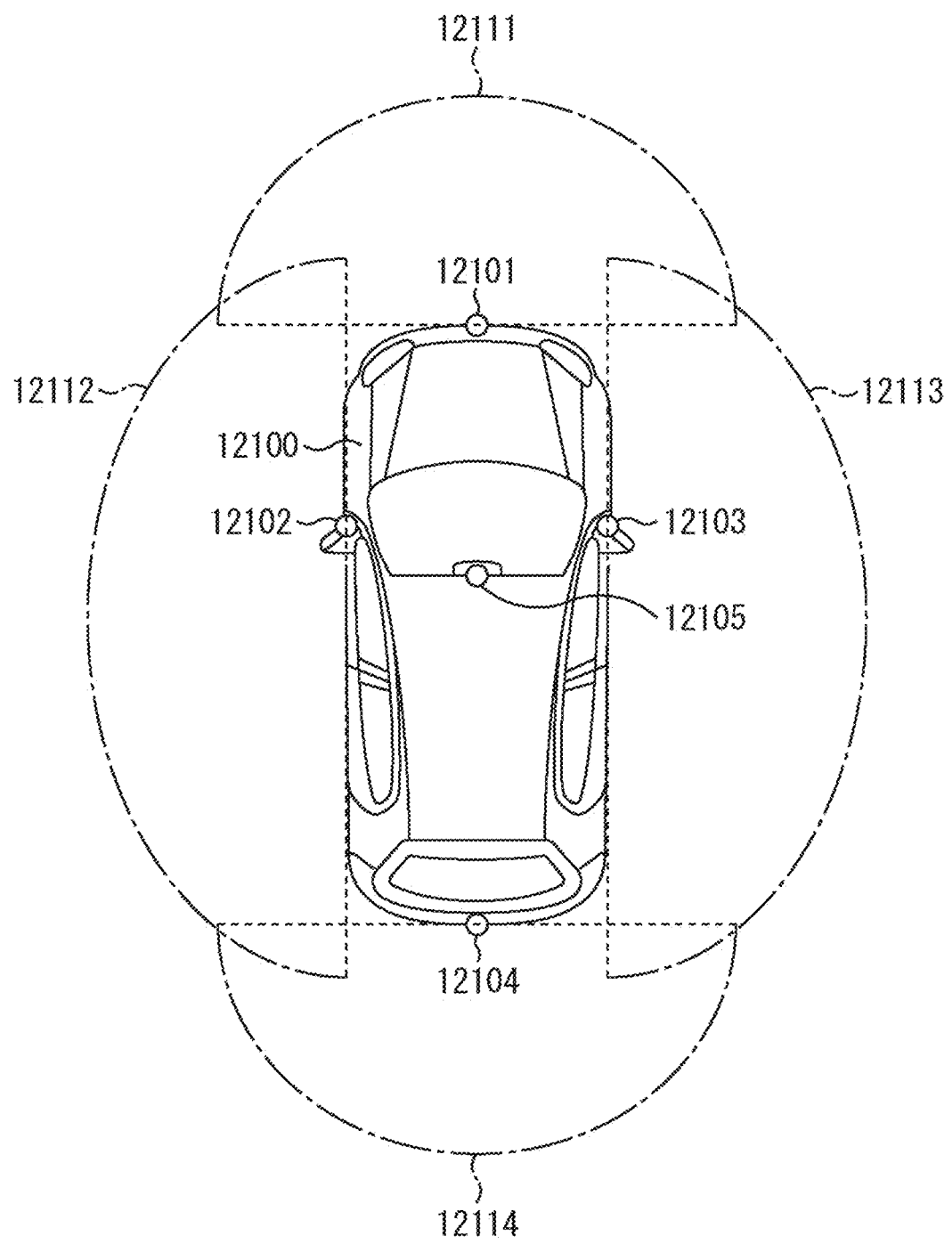

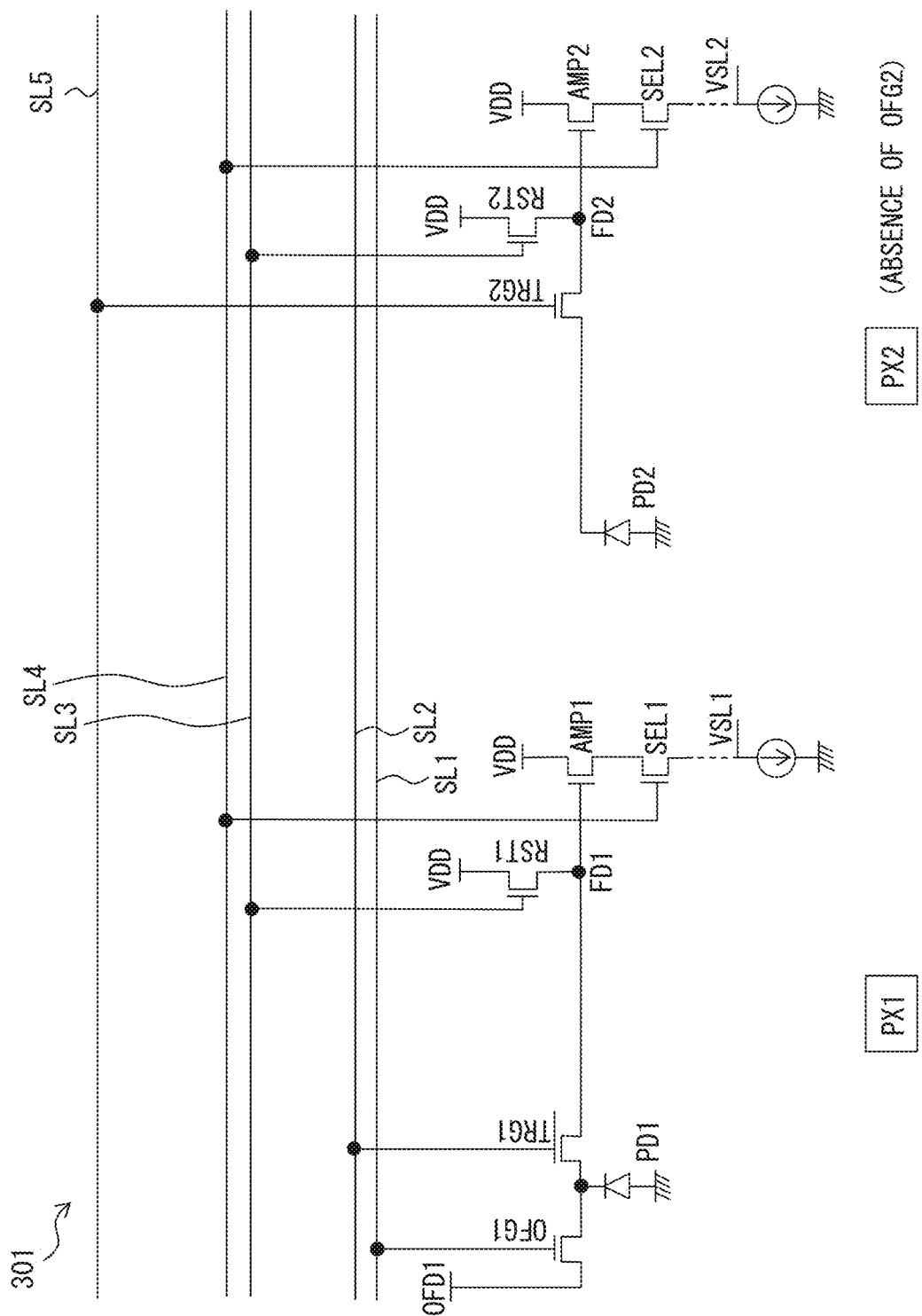
[FIG. 38]

[FIG. 39]
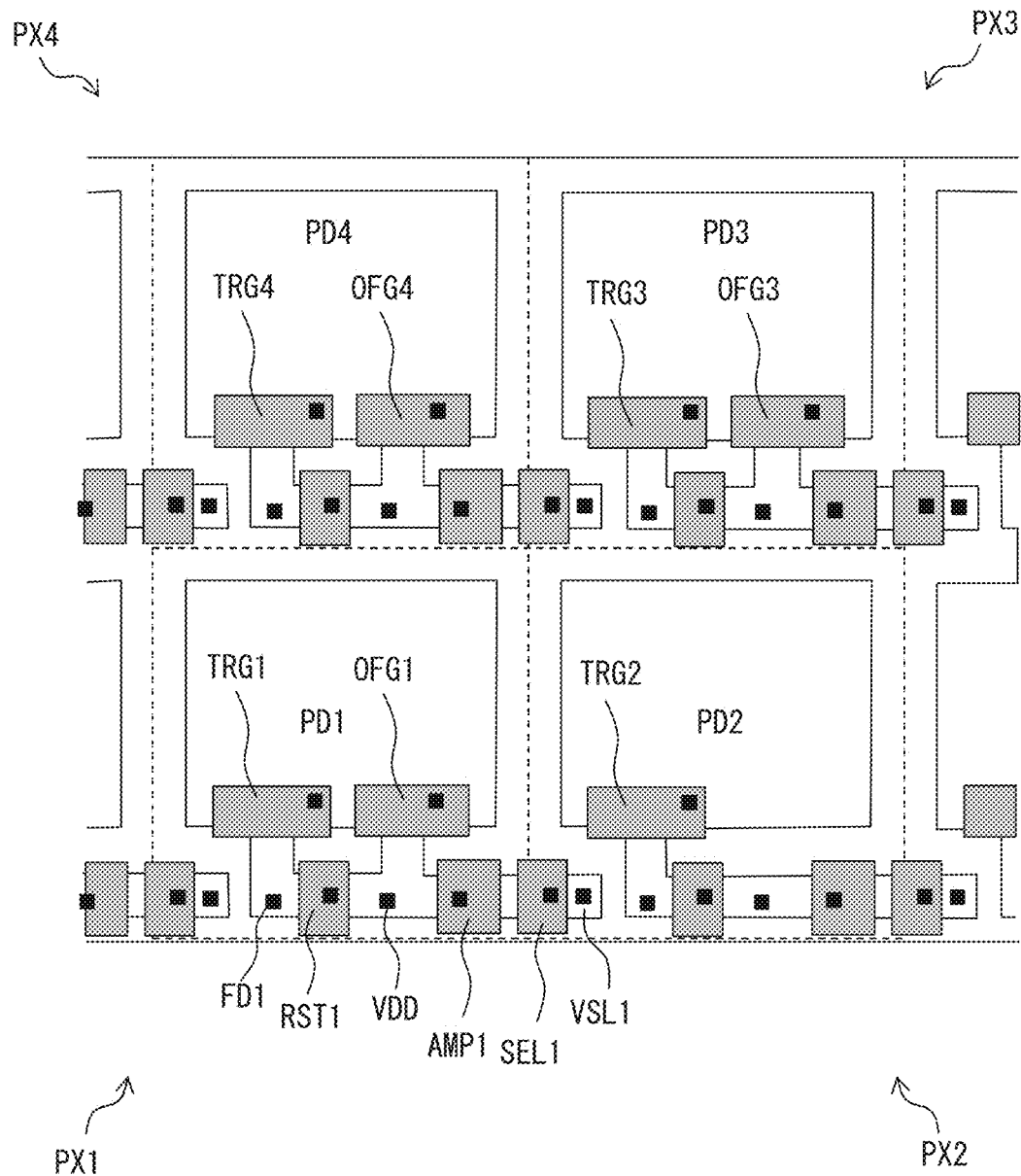

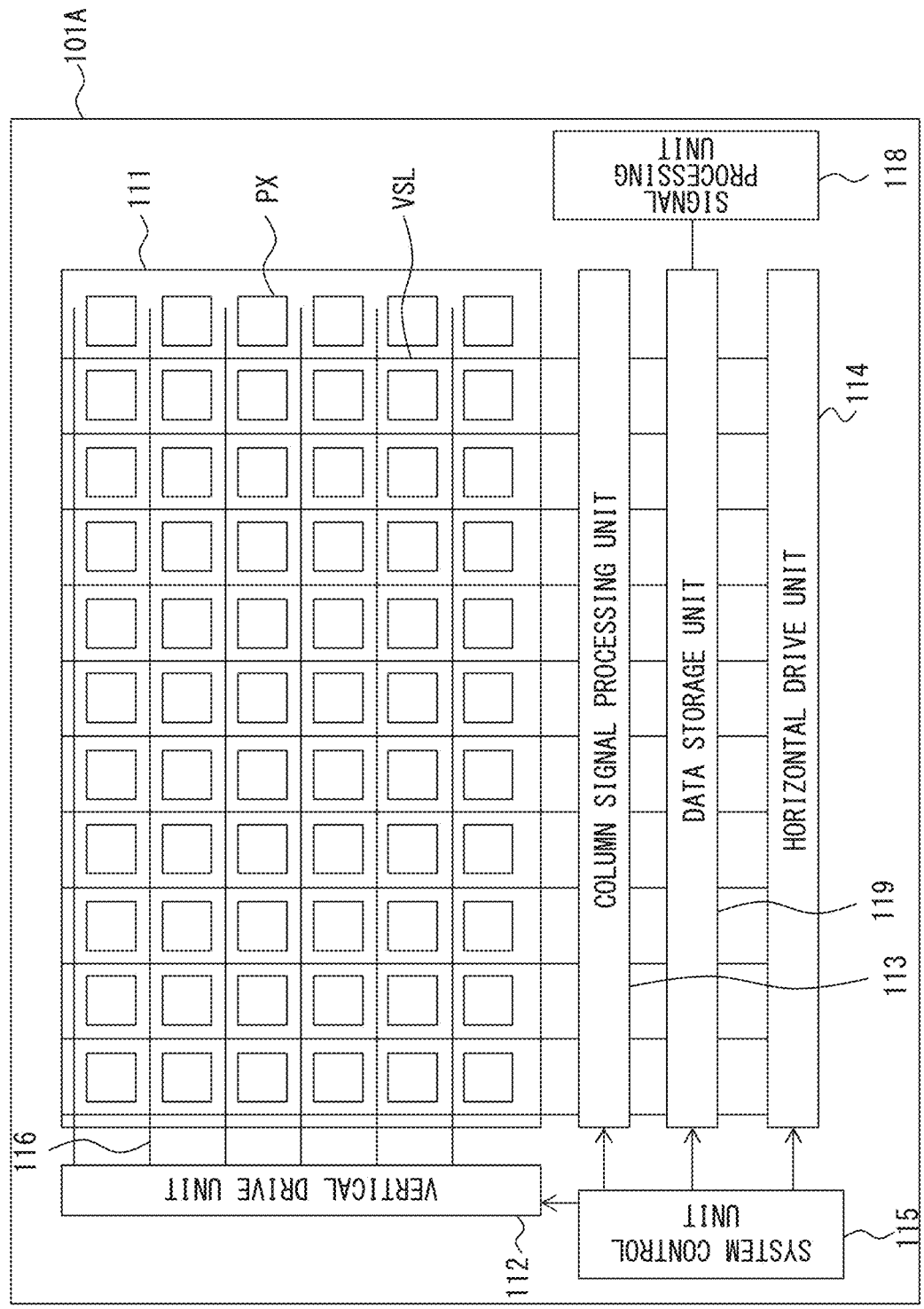
[FIG. 40A]

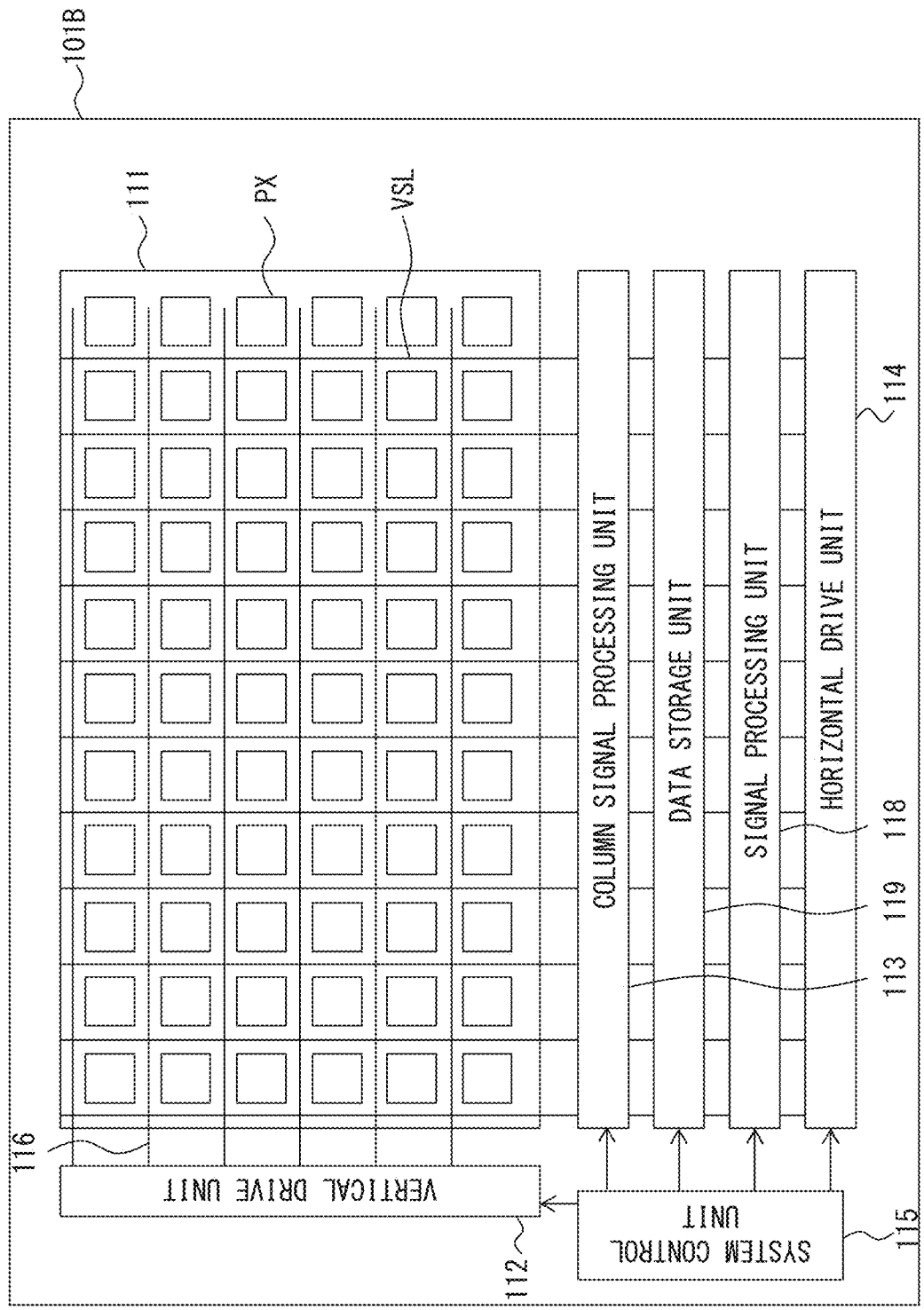
[FIG. 40B]

[FIG. 41]
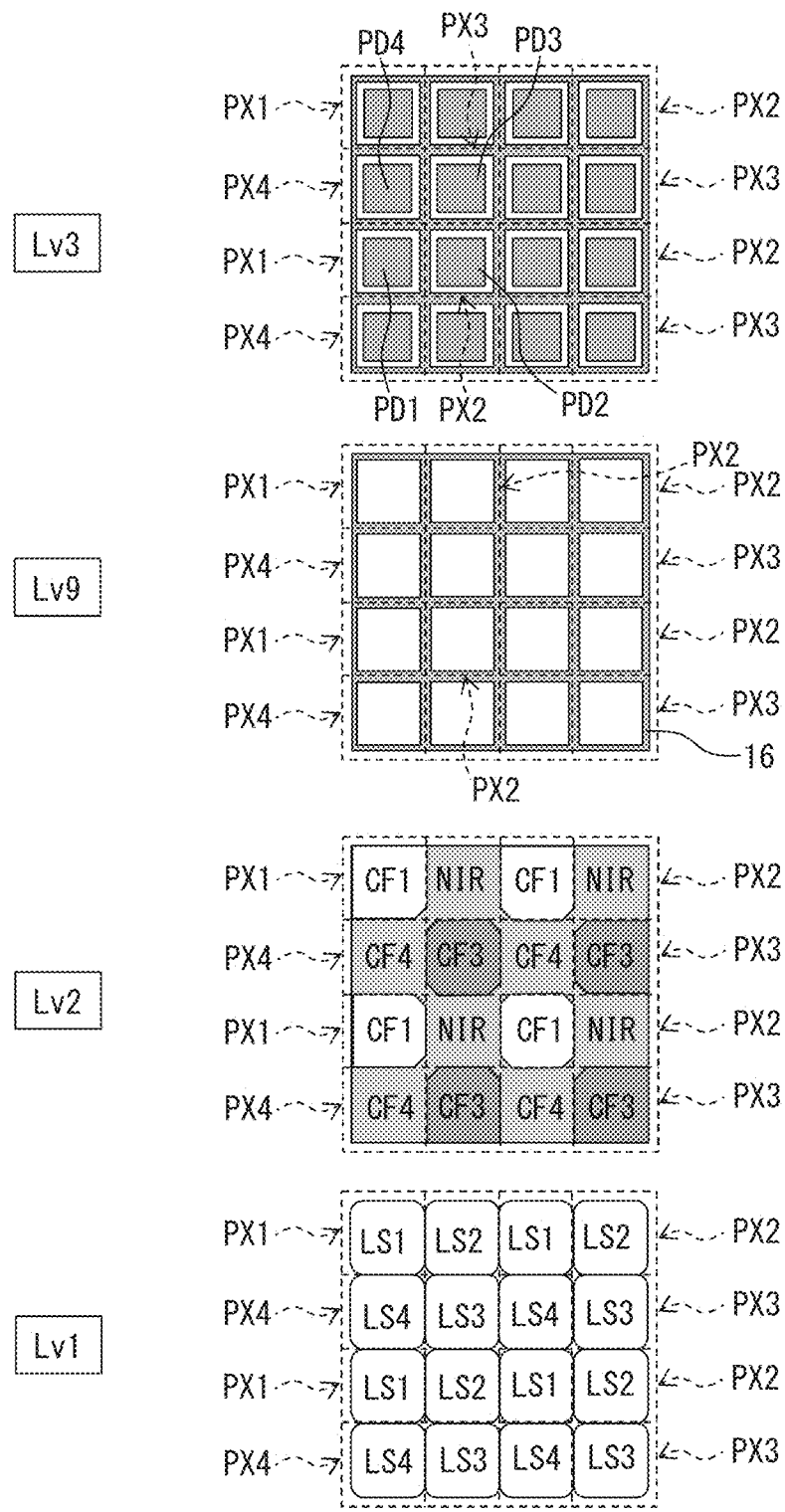

[FIG. 42]
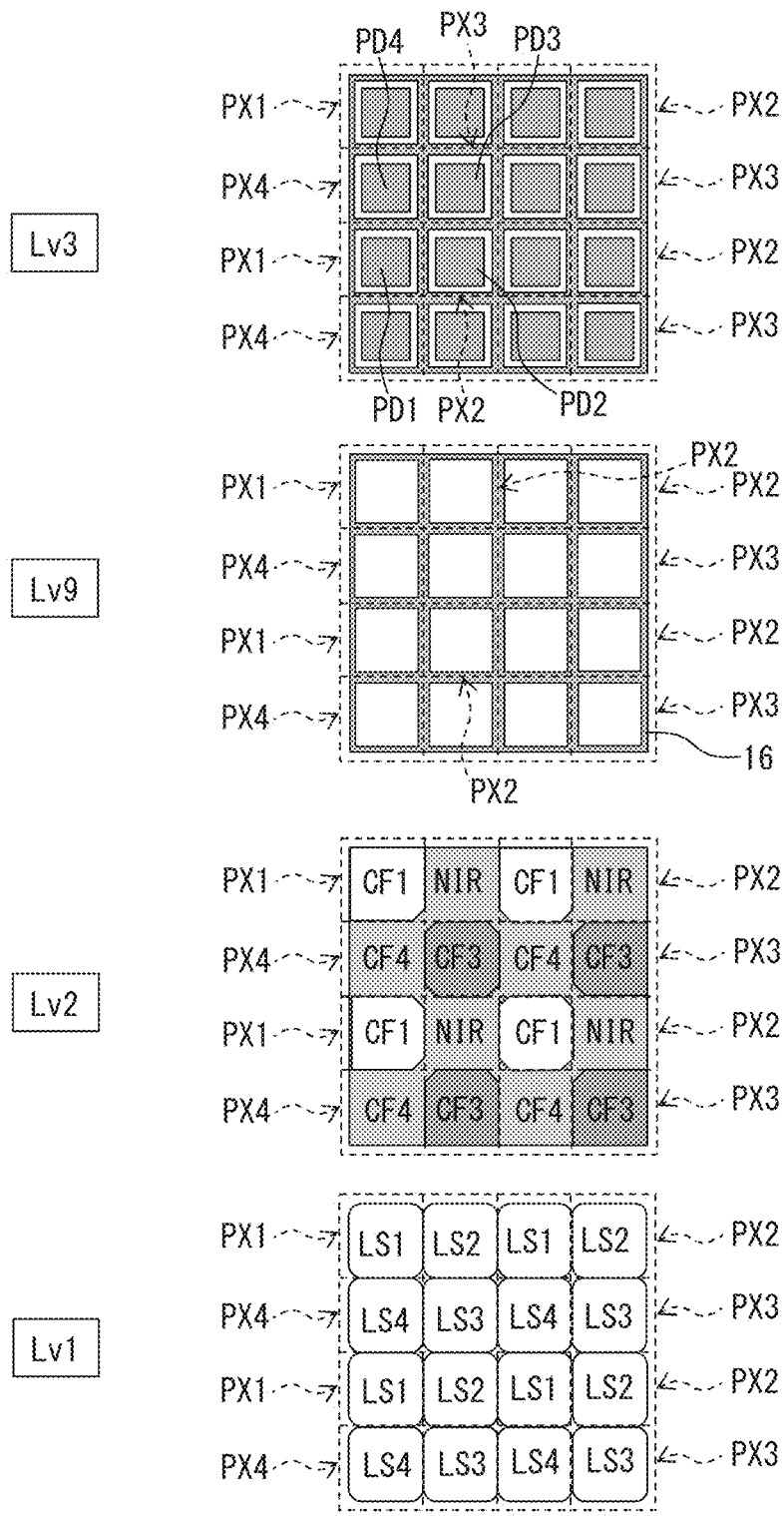

[FIG. 43]
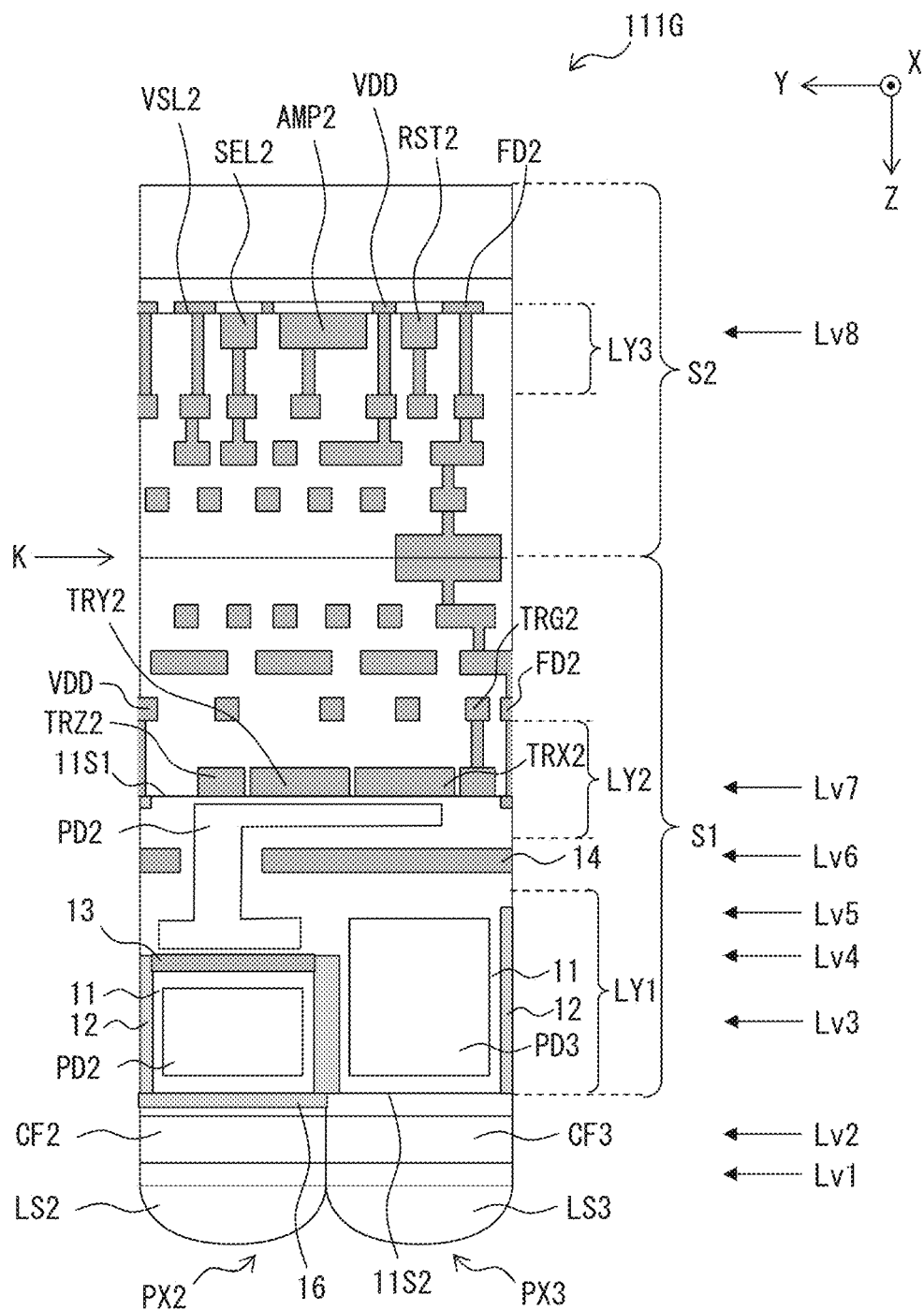

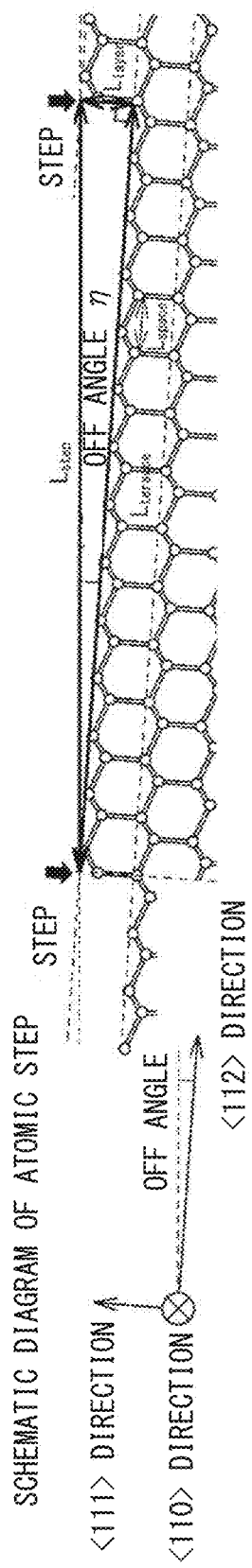
[FIG. 44]

IMAGING DEVICE THAT ALLOWS MINIATURIZATION AND ELECTRONIC APPARATUS

TECHNICAL FIELD

The present disclosure relates to an imaging device that performs imaging by performing photoelectric conversion and an electronic apparatus including the imaging device.

BACKGROUND ART

The applicant of the present application has proposed an imaging device including a silicon substrate having a stacked structure in which a photodiode and a memory are stacked in a light incidence direction (see, for example, PTL 1).

CITATION LIST

Patent Literature

PTL 1: International Publication No. WO 2016/136486

SUMMARY OF THE INVENTION

Incidentally, such an imaging device is requested to have smaller dimensions in the in-plane direction orthogonal to the light incidence direction.

It is thus desirable to provide an imaging device that allows miniaturization to be achieved in the in-plane direction without impairing operation performance and an electronic apparatus including such an imaging device.

An imaging device according to an embodiment of the present disclosure includes a first pixel and a second pixel. The first pixel includes m (m represents an integer greater than or equal to 2) first wiring lines and m first gate electrodes that are coupled to the m respective first wiring lines. The second pixel includes n (n represents a natural number smaller than m) second wiring lines and n second gate electrodes that are coupled to the n respective second wiring lines.

In addition, an electronic apparatus according to an embodiment of the present disclosure includes the imaging device described above.

BRIEF DESCRIPTION OF DRAWING

FIG. 1 is a block diagram illustrating a configuration example of a solid-state imaging device according to a first embodiment of the present disclosure.

FIG. 2 is a circuit diagram illustrating a circuit configuration of one normal pixel and one phase difference detection pixel in the solid-state imaging device illustrated in FIG. 1.

FIG. 3A is a first schematic cross-sectional view of a cross section along a stack direction of the one normal pixel and the one phase difference detection pixel in the solid-state imaging device illustrated in FIG. 1.

FIG. 3B is a second schematic cross-sectional view of the cross section along the stack direction of the one normal pixel and the one phase difference detection pixel in the solid-state imaging device illustrated in FIG. 1.

FIG. 4A is a first schematic cross-sectional view of a cross section orthogonal to the stack direction of the one normal pixel and the one phase difference detection pixel in the solid-state imaging device illustrated in FIG. 1.

FIG. 4B is a second schematic cross-sectional view of the cross section orthogonal to the stack direction of the one normal pixel and the one phase difference detection pixel in the solid-state imaging device illustrated in FIG. 1.

FIG. 4C is a third schematic cross-sectional view of the cross section orthogonal to the stack direction of the one normal pixel and the one phase difference detection pixel in the solid-state imaging device illustrated in FIG. 1.

FIG. 4D is a fourth schematic cross-sectional view of the cross section orthogonal to the stack direction of the one normal pixel and the one phase difference detection pixel in the solid-state imaging device illustrated in FIG. 1.

FIG. 4E is a fifth schematic cross-sectional view of the cross section orthogonal to the stack direction of the one normal pixel and the one phase difference detection pixel in the solid-state imaging device illustrated in FIG. 1.

FIG. 4F is a sixth schematic cross-sectional view of the cross section orthogonal to the stack direction of the one normal pixel and the one phase difference detection pixel in the solid-state imaging device illustrated in FIG. 1.

FIG. 4G is a seventh schematic cross-sectional view of the cross section orthogonal to the stack direction of the one normal pixel and the one phase difference detection pixel in the solid-state imaging device illustrated in FIG. 1.

FIG. 4H is an eighth schematic cross-sectional view of the cross section orthogonal to the stack direction of the one normal pixel and the one phase difference detection pixel in the solid-state imaging device illustrated in FIG. 1.

FIG. 4I is a schematic diagram illustrating an example of a layout of sensor pixels in a pixel array unit.

FIG. 5 is a circuit diagram illustrating a circuit configuration of one normal pixel and one phase difference detection pixel in a solid-state imaging device according to a first modification example of the present disclosure.

FIG. 6A is a first schematic cross-sectional view of a cross section along a stack direction of the one normal pixel and the one phase difference detection pixel in the solid-state imaging device illustrated in FIG. 5.

FIG. 6B is a second schematic cross-sectional view of the cross section along the stack direction of the one normal pixel and the one phase difference detection pixel in the solid-state imaging device illustrated in FIG. 5.

FIG. 7 is a schematic cross-sectional view of a cross section orthogonal to the stack direction of the one normal pixel and the one phase difference detection pixel in the solid-state imaging device illustrated in FIG. 5.

FIG. 8 is a circuit diagram illustrating a circuit configuration of one normal pixel and one phase difference detection pixel in a solid-state imaging device according to a second modification example of the present disclosure.

FIG. 9A is a first schematic cross-sectional view of a cross section along a stack direction of the one normal pixel and the one phase difference detection pixel in the solid-state imaging device illustrated in FIG. 8.

FIG. 9B is a second schematic cross-sectional view of the cross section along the stack direction of the one normal pixel and the one phase difference detection pixel in the solid-state imaging device illustrated in FIG. 8.

FIG. 10 is a schematic cross-sectional view of a cross section orthogonal to the stack direction of the one normal pixel and the one phase difference detection pixel in the solid-state imaging device illustrated in FIG. 8.

FIG. 11 is a circuit diagram illustrating a circuit configuration of one normal pixel and one phase difference detection pixel in a solid-state imaging device according to a third modification example of the present disclosure.

FIG. 12A is a first schematic cross-sectional view of a cross section along a stack direction of the one normal pixel and the one phase difference detection pixel in the solid-state imaging device illustrated in FIG. 11.

FIG. 12B is a second schematic cross-sectional view of the cross section along the stack direction of the one normal pixel and the one phase difference detection pixel in the solid-state imaging device illustrated in FIG. 11.

FIG. 13 is a schematic cross-sectional view of a cross section orthogonal to the stack direction of the one normal pixel and the one phase difference detection pixel in the solid-state imaging device illustrated in FIG. 11.

FIG. 14 is a circuit diagram illustrating a circuit configuration of one normal pixel and one phase difference detection pixel in a solid-state imaging device according to a fourth modification example of the present disclosure.

FIG. 15A is a first schematic cross-sectional view of a cross section along a stack direction of the one normal pixel and the one phase difference detection pixel in the solid-state imaging device illustrated in FIG. 14.

FIG. 15B is a second schematic cross-sectional view of the cross section along the stack direction of the one normal pixel and the one phase difference detection pixel in the solid-state imaging device illustrated in FIG. 14.

FIG. 16 is a schematic cross-sectional view of a cross section orthogonal to the stack direction of the one normal pixel and the one phase difference detection pixel in the solid-state imaging device illustrated in FIG. 14.

FIG. 17 is a circuit diagram illustrating a circuit configuration of one normal pixel and one phase difference detection pixel in a solid-state imaging device according to a fifth modification example of the present disclosure.

FIG. 18A is a first schematic cross-sectional view of a cross section along a stack direction of the one normal pixel and the one phase difference detection pixel in the solid-state imaging device illustrated in FIG. 17.

FIG. 18B is a second schematic cross-sectional view of the cross section along the stack direction of the one normal pixel and the one phase difference detection pixel in the solid-state imaging device illustrated in FIG. 17.

FIG. 19 is a schematic cross-sectional view of a cross section orthogonal to the stack direction of the one normal pixel and the one phase difference detection pixel in the solid-state imaging device illustrated in FIG. 17.

FIG. 20 is a circuit diagram illustrating a circuit configuration of one normal pixel and one phase difference detection pixel in a solid-state imaging device according to a sixth modification example of the present disclosure.

FIG. 21A is a first schematic cross-sectional view of a cross section along a stack direction of the one normal pixel and the one phase difference detection pixel in the solid-state imaging device illustrated in FIG. 20.

FIG. 21B is a second schematic cross-sectional view of the cross section along the stack direction of the one normal pixel and the one phase difference detection pixel in the solid-state imaging device illustrated in FIG. 20.

FIG. 22 is a schematic cross-sectional view of a cross section orthogonal to the stack direction of the one normal pixel and the one phase difference detection pixel in the solid-state imaging device illustrated in FIG. 20.

FIG. 23 is a circuit diagram illustrating a circuit configuration of one normal pixel and one phase difference detection pixel in a solid-state imaging device according to a second embodiment of the present disclosure.

FIG. 24 is a schematic cross-sectional view of a cross section along a stack direction of the one normal pixel and the one phase difference detection pixel in the solid-state imaging device illustrated in FIG. 23.

FIG. 25 is a schematic plan view of a planar configuration of a front surface of a semiconductor substrate in the solid-state imaging device illustrated in FIG. 23.

FIG. 26 is a circuit diagram illustrating a circuit configuration of one normal pixel and one phase difference detection pixel in a solid-state imaging device according to a seventh modification example of the present disclosure.

FIG. 27 is a schematic cross-sectional view of a cross section along a stack direction of the one normal pixel and the one phase difference detection pixel in the solid-state imaging device illustrated in FIG. 26.

FIG. 28 is a schematic plan view of a planar configuration of a front surface of a semiconductor substrate in the solid-state imaging device illustrated in FIG. 26.

FIG. 29 is a circuit diagram illustrating a circuit configuration of one normal pixel and one phase difference detection pixel in a solid-state imaging device according to an eighth modification example of the present disclosure.

FIG. 30 is a schematic cross-sectional view of a cross section along a stack direction of the one normal pixel and the one phase difference detection pixel in the solid-state imaging device illustrated in FIG. 29.

FIG. 31 is a schematic plan view of a planar configuration of a front surface of a semiconductor substrate in the solid-state imaging device illustrated in FIG. 29.

FIG. 32 is a circuit diagram illustrating a circuit configuration of one normal pixel and one phase difference detection pixel in a solid-state imaging device according to a ninth modification example of the present disclosure.

FIG. 33 is a schematic cross-sectional view of a cross section along a stack direction of the one normal pixel and the one phase difference detection pixel in the solid-state imaging device illustrated in FIG. 32.

FIG. 34 is a schematic plan view of a planar configuration of a front surface of a semiconductor substrate in the solid-state imaging device illustrated in FIG. 32.

FIG. 35 is a schematic diagram illustrating an overall configuration example of an electronic apparatus.

FIG. 36 is a block diagram depicting an example of schematic configuration of a vehicle control system.

FIG. 37 is a diagram of assistance in explaining an example of installation positions of an outside-vehicle information detecting section and an imaging section.

FIG. 38 is a circuit diagram illustrating a circuit configuration of the one normal pixel and the one phase difference detection pixel in the solid-state imaging device according to the eighth modification example of the present disclosure.

FIG. 39 is a schematic plan view of a planar configuration of a front surface of a semiconductor substrate in the solid-state imaging device illustrated in FIG. 38.

FIG. 40A is a block diagram illustrating a configuration example of a solid-state imaging device according to a ninth modification example of the present disclosure.

FIG. 40B is a block diagram illustrating a configuration example of a solid-state imaging device according to a tenth modification example of the present disclosure.

FIG. 41 is a schematic diagram illustrating an example of a layout of sensor pixels in a pixel array unit according to an eleventh modification example of the present disclosure.

FIG. 42 is a schematic diagram illustrating an example of a layout of sensor pixels in a pixel array unit according to a twelfth modification example of the present disclosure.

FIG. 43 is a schematic cross-sectional view of a cross section along a stack direction of one normal pixel and one phase difference detection pixel in a solid-state imaging device according to a thirteenth modification example of the present disclosure.

FIG. 44 is a schematic diagram describing an off angle on a front surface of a Si substrate according to the present disclosure.

MODES FOR CARRYING OUT THE INVENTION

An imaging pixel (that is referred to simply as global shutter pixel below) of a global shutter mode as described in PTL 1 described above requests a transistor that transfers electric charge. This requests more transistors than an imaging pixel (that is referred to simply as non-global shutter pixel below) of a mode other than the global shutter mode does. To independently drive a plurality of respective global shutter pixels, more signal lines are therefore necessary than signal lines necessary to independently drive a plurality of respective non-global shutter pixels. In a case where a certain number of global shutter pixels are disposed in a region having a certain size, a larger number of signal lines are thus necessary than the number of signal lines necessary in a case where the same number of non-global shutter pixels are disposed. There is no choice but to decrease the width of each signal line or the pitch between a plurality of signal lines. As a result, issues may be raised including influence on the design of drive circuits such as decreasing manufacturing yields and increasing time constants, increasing settling time, and the like in addition to an increasing number of manufacturing steps and increasing manufacturing time.

The present disclosure has been devised in view of these issues and has an object to provide an imaging device that allows miniaturization to be achieved in the in-plane direction without impairing operation performance and an electronic apparatus including such an imaging device.

The following describes embodiments of the present disclosure in detail with reference to the drawings. It is to be noted that description is given in the following order.
1. First Embodiment
An example of a solid-state imaging device including a normal pixel that is an MEM holding global shutter pixel and an image plane phase difference pixel and having a photoelectric conversion unit and MEM stacked therein.
2. Modification Examples of First Embodiment
2-1. A first modification example of a solid-state imaging device in which an image plane phase difference pixel includes one fewer wiring lines than wiring lines for a normal pixel.
2-2. A second modification example of a solid-state imaging device in which an image plane phase difference pixel includes one fewer wiring lines than wiring lines for a normal pixel.
2-3. A third modification example of a solid-state imaging device in which an image plane phase difference pixel includes one fewer wiring lines than wiring lines for a normal pixel.
2-4. A fourth modification example of a solid-state imaging device in which an image plane phase difference pixel includes two fewer wiring lines than wiring lines for a normal pixel.
2-5. A fifth modification example of a solid-state imaging device in which an image plane phase difference pixel includes three fewer wiring lines than wiring lines for a normal pixel.
2-6. A sixth modification example of a solid-state imaging device in which an image plane phase difference pixel includes four fewer wiring lines than wiring lines for a normal pixel.
3. Second Embodiment
An example of a solid-state imaging device including a normal pixel and an image plane phase difference pixel and having a photoelectric conversion unit and a memory disposed in the same layer.
4. Modification Examples of Second Embodiment
4-1. A seventh modification example of a solid-state imaging device in which an image plane phase difference pixel includes three fewer wiring lines than wiring lines for a normal pixel.
4-2. A ninth modification example of a solid-state imaging device in which an image plane phase difference pixel includes two fewer wiring lines than wiring lines for a normal pixel.
4-3. An eighth modification example of a solid-state imaging device in which an image plane phase difference pixel includes one fewer wiring lines than wiring lines for a normal pixel.
4-4. A ninth modification example of a solid-state imaging device in which an image plane phase difference pixel includes two fewer wiring lines than wiring lines for a normal pixel.
5. Example of Application to Electronic Apparatus
6. Example of Application to Mobile Body
7. Other Modification Examples
An example or the like of a solid-state imaging device including a normal pixel that is an FD holding global shutter pixel and an image plane phase difference pixel.

1. First Embodiment

[Configuration of Solid-State Imaging Device 101]

FIG. 1 is a block diagram illustrating a functional configuration example of a solid-state imaging device 101 according to a first embodiment of the present technology.

The solid-state imaging device 101 is, for example, a back-illuminated image sensor of a so-called global shutter mode such as a CMOS (Complementary Metal Oxide Semiconductor) image sensor. The solid-state imaging device 101 receives light from a subject and performs photoelectric conversion. The solid-state imaging device 101 generates an image signal to capture an image.

The global shutter mode is a mode for performing global exposure in which exposure is basically begun at the same time for all the pixels and is finished at the same time for all the pixels. Here, all the pixels refer to all the pixels in the portion appearing in an image and exclude dummy pixels or the like. In addition, in a case where a time difference or image distortion is small enough to raise no issue, the global shutter mode also includes a mode of changing regions for global exposure while performing global exposure not at the same time for all the pixels, but for a plurality of rows (e.g., several tens of rows). In addition, the global shutter mode also includes a mode of performing global exposure for the pixels in a predetermined region rather than all the pixels in the portion appearing in an image.

The back-illuminated image sensor refers to an image sensor having a configuration in which a photoelectric conversion unit such as a photodiode is provided between a light receiving surface and a wiring layer. The photoelectric conversion unit receives light from a subject and converts the light into an electric signal. Light from a subject enters the light receiving surface. The wiring layer is provided with a wiring line of a transistor or the like that drives each of pixels.

The solid-state imaging device 101 includes, for example, a pixel array unit 111, a vertical drive unit 112, a column signal processing unit 113, a data storage unit 119, a horizontal drive unit 114, a system control unit 115, and a signal processing unit 118.

In the solid-state imaging device 101, the pixel array unit 111 is formed on a semiconductor substrate 11 (that is described below). Peripheral circuits such as the vertical drive unit 112, the column signal processing unit 113, the data storage unit 119, the horizontal drive unit 114, the system control unit 115, and the signal processing unit 118 are provided, for example, on the semiconductor substrate 11 as with the pixel array unit 111.

The pixel array unit 111 includes a plurality of sensor pixels PX each including a photoelectric conversion unit PD (that is described below) that generates electric charge corresponding to the amount of light coming from a subject and accumulates the electric charge. As illustrated in FIG. 1, the sensor pixels PX are arranged in both the horizontal direction (row direction) and the vertical direction (column direction). In the pixel array unit 111, there is provided a pixel drive line 116 in the row direction for each of the pixel rows and there is provided a vertical signal line VSL in the column direction for each of the pixel columns. Each of the pixel rows includes the sensor pixels PX arranged in line in the row direction. Each of the pixel columns includes the sensor pixels PX arranged in line in the column direction.

The vertical drive unit 112 includes a shift register, an address decoder, and the like. The vertical drive unit 112 drives all of the plurality of sensor pixels PX in the pixel array unit 111 at the same time or drives the plurality of sensor pixels PX in the pixel array unit 111 for each of the pixel rows by supplying the plurality of sensor pixels PX with signals or the like through the plurality of pixel drive lines 116.

The signal to be outputted from each unit pixel in the pixel row selectively scanned by the vertical drive unit 112 is supplied to the column signal processing unit 113 through each of the vertical signal lines VSL. The column signal processing unit 113 performs predetermined signal processing on the signal outputted from each unit pixel in the selected row through the vertical signal line VSL for each of the pixel columns of the pixel array unit 111 and temporarily holds the pixel signal that has been subjected to the signal processing.

Specifically, the column signal processing unit 113 includes, for example, a shift register, an address decoder, and the like and performs a noise removal process, a correlation double sampling process, an A/D (Analog/Digital) conversion A/D conversion process on an analog pixel signal, and the like to generate a digital pixel signal. The column signal processing unit 113 supplies the generated pixel signal to the signal processing unit 118.

The horizontal drive unit 114 includes a shift register, an address decoder, and the like and selects, in order, unit circuits corresponding to pixel columns of the column signal processing unit 113. The selective scanning by this horizontal drive unit 114 causes the pixel signals that have been subjected to signal processing for each of the unit circuits in the column signal processing unit 113 to be outputted to the signal processing unit 118 in order.

The system control unit 115 includes a timing generator or the like that generates a variety of timing signals. The system control unit 115 performs drive control on the vertical drive unit 112, the column signal processing unit 113, and the horizontal drive unit 114 on the basis of the timing signals generated by the timing generator.

While temporarily storing data in the data storage unit 119 as necessary, the signal processing unit 118 performs signal processing such as an arithmetic process on the pixel signals supplied from the column signal processing unit 113 and outputs an image signal including each of the pixel signals.

The data storage unit 119 temporarily holds data necessary for the signal processing unit 118 to perform signal processing.

[Configuration of Sensor Pixel PX]
(Circuit Configuration Example)

Next, with reference to FIG. 2, a circuit configuration example of the sensor pixel PX provided in the pixel array unit 111 in FIG. 1 is described. FIG. 2 illustrates a circuit configuration example of two sensor pixels PX1 and PX2 of the plurality of sensor pixels PX included in the pixel array unit 111.

In the example illustrated in FIG. 2, the sensor pixels PX (PX1 and PX2) in the pixel array unit 111 achieve a memory-holding global shutter.

The sensor pixel PX1 is a normal pixel for image detection that acquires visible light information. The sensor pixel PX1 includes a photoelectric conversion unit PD1, first to third transfer transistors TG1A to TG1C, an electric charge holding unit MEM1, a discharge transistor OFG1, a discharge unit OFD1, and a buffer BUF1. The first transfer transistor TG1A includes a transfer gate TRZ1, the second transfer transistor TG1B includes a transfer gate TRY1 and a transfer gate TRX1, and the third transfer transistor TG1C includes a transfer gate TRG1. Here, the gate electrode of the discharge transistor OFG1 is coupled to a signal line SL1. The transfer gate TRZ1 is coupled to a signal line SL2. The transfer gate TRY1 is coupled to a signal line SL3. The transfer gate TRX1 is coupled to a signal line SL4. The transfer gate TRG1 is coupled to a signal line SL5.

The sensor pixel PX1 further includes a power supply VDD, an electric charge voltage conversion unit FD1, a reset transistor RST1, an amplification transistor AMP1, a selection transistor SEL1, and the like. The gate electrode of the reset transistor RST1 is coupled to a signal line SL6. The gate electrode of the selection transistor SEL1 is coupled to a signal line SL7. It is to be noted that the sensor pixel PX1 may share the electric charge voltage conversion unit FD1, the reset transistor RST1, the amplification transistor AMP1, the selection transistor SEL1, and the like with a sensor pixel PX4 (described below) adjacent to the sensor pixel PX1. The sensor pixel PX4 is a normal pixel for image detection that acquires visible light information as with the sensor pixel PX1.

The sensor pixel PX2 is a pixel that acquires information other than visible light information. Specifically, the sensor pixel PX2 is, for example, an image plane phase difference detection pixel (that is referred to as ZAF pixel below) for acquiring a phase difference signal for autofocus. The sensor pixel PX2 includes a photoelectric conversion unit PD2, first to third transfer transistors TG2A to TG2C, an electric charge holding unit MEM2, and a buffer BUF2. The sensor pixel PX2 according to the present embodiment does not, however, include any discharge transistor and any discharge unit. The first transfer transistor TG2A includes a transfer gate TRZ2, the second transfer transistor TG2B includes a transfer gate TRY2 and a transfer gate TRX2, and the third transfer transistor TG2C includes a transfer gate TRG2. Here, the transfer gate TRZ2 is coupled to a signal line SL9. The transfer gate TRY2 is coupled to a signal line SL10. The transfer gate TRX2 is coupled to a signal line SL11. The transfer gate TRG2 is coupled to a signal line SL12.

The sensor pixel PX2 further includes the power supply VDD, an electric charge voltage conversion unit FD2, a reset transistor RST2, an amplification transistor AMP2, a selection transistor SEL2, and the like. The gate electrode of the reset transistor RST2 is coupled to the signal line SL6 as with the gate electrode of the reset transistor RST1. The gate electrode of the selection transistor SEL2 is coupled to the signal line SL7 as with the gate electrode of the selection transistor SEL2. It is to be noted that the sensor pixel PX2 may share the electric charge voltage conversion unit FD2, the reset transistor RST2, the amplification transistor AMP2, the selection transistor SEL2, and the like with a sensor pixel PX3 (described below) adjacent to the sensor pixel PX2. The sensor pixel PX3 is a normal pixel for image detection that acquires visible light information as with the sensor pixel PX1.

In this example, all of the first to third transfer transistors TG1A to TG1C and TG2A to TG2C, the reset transistors RST1 and RST2, the amplification transistors AMP1 and AMP2, and the selection transistors SEL1 and SEL2 are N-type MOS transistors. The respective gate electrodes of the first to third transfer transistors TG1A to TG1C and TG2A to TG2C, the reset transistors RST1 and RST2, the amplification transistors AMP1 and AMP2, and the selection transistors SEL1 and SEL2 are supplied with drive signals from the vertical drive unit 112 and the horizontal drive unit 114 through the signal lines SL1 to SL7 and SL9 to SL12 on the basis of the drive control of the system control unit 115. Each of those drive signals is a pulse signal whose high level state corresponds to an active state (on state) and whose low level state corresponds to an inactive state (off state). It is to be noted that the following also refers to bringing a drive signal into the active state as turning on the drive signal and refers to bringing a drive signal into the inactive state as turning off the drive signal.

Each of the photoelectric conversion units PD1 and PD2 is, for example, a photoelectric conversion element including a PN-junction photodiode. Each of the photoelectric conversion units PD1 and PD2 is configured to receive light from a subject, generate electric charge corresponding to the amount of received light through photoelectric conversion, and accumulate the electric charge.

The electric charge holding units MEM1 and MEM2 are respectively provided between the photoelectric conversion units PD1 and PD2 and the electric charge voltage conversion units FD1 and FD2. The electric charge holding units MEM1 and MEM2 are regions that temporarily hold the electric charge generated and accumulated in the photoelectric conversion units PD1 and PD2 until the electric charge is transferred to the respective electric charge voltage conversion units FD1 and FD2 to achieve a global shutter function.

In the sensor pixel PX1, the first transfer transistor TG1A and the second transfer transistor TG1B are disposed in order between the photoelectric conversion unit PD1 and the electric charge holding unit MEM1. The third transfer transistor TG1C is disposed between the electric charge holding unit MEM1 and the electric charge voltage conversion unit FD1. The first transfer transistor TG1A and the second transfer transistor TG1B are configured to transfer the electric charge accumulated in the photoelectric conversion unit PD1 to the electric charge holding unit MEM1 in accordance with respective drive signals applied to the transfer gate TRZ2 and the transfer gate TRY2 and the transfer gate TRX2 thereof.

Similarly, in the sensor pixel PX2, the first transfer transistor TG2A and the second transfer transistor TG2B are disposed in order between the photoelectric conversion unit PD2 and the electric charge holding unit MEM2. The third transfer transistor TG2C is disposed between the electric charge holding unit MEM2 and the electric charge voltage conversion unit FD2. The first transfer transistor TG2A and the second transfer transistor TG2B are configured to transfer the electric charge accumulated in the photoelectric conversion unit PD2 to the electric charge holding unit MEM2 in accordance with respective drive signals applied to the transfer gate TRZ2 and the transfer gate TRY2 and the transfer gate TRX2 thereof.

The third transfer transistor TG1C and the third transfer transistor TG2C are respectively configured to transfer the electric charge temporarily held in the electric charge holding unit MEM1 and the electric charge holding unit MEM2 to the electric charge voltage conversion units FD1 and FD2 in accordance with drive signals applied to the transfer gates TRG1 and TRG2 thereof.

For example, in a case where the second transfer transistors TG1B and TG2B are turned off and the third transfer transistors TG1C and TG2C are turned on in the sensor pixels PX1 and PX2, the electric charge held in the respective electric charge holding units MEM1 and MEM2 is transferred to the electric charge voltage conversion units FD1 and FD2 through the third transfer transistors TG1C and TG2C.

The buffer BUF1 in the sensor pixel PX1 is an electric charge accumulation region formed between the first transfer transistor TG1A and the second transfer transistor TG1B. The buffer BUF2 in the sensor pixel PX2 is an electric charge accumulation region formed between the first transfer transistor TG2A and the second transfer transistor TG2B.

The reset transistor RST1 in the sensor pixel PX1 has the drain coupled to the power supply VDD and the source coupled to the electric charge voltage conversion unit FD1. The reset transistor RST1 initializes or resets the electric charge voltage conversion unit FD1 in accordance with the drive signal applied to the gate electrode thereof. For example, in a case where the reset transistor RST1 is turned on by the drive signal, the potential of the electric charge voltage conversion unit FD1 is reset to the voltage level of the power supply VDD. In other words, the electric charge voltage conversion unit FD1 is initialized. Similarly, the reset transistor RST2 in the sensor pixel PX2 has the drain coupled to the power supply VDD and the source coupled to the electric charge voltage conversion unit FD2. The reset transistor RST2 initializes or resets the electric charge voltage conversion unit FD2 in accordance with the drive signal applied to the gate electrode thereof. For example, in a case where the reset transistor RST2 is turned on by the drive signal, the potential of the electric charge voltage conversion unit FD2 is reset to the voltage level of the power supply VDD.

The electric charge voltage conversion unit FD1 in the sensor pixel PX1 is a floating diffusion region that converts, into electric signals (e.g., voltage signals), the electric charge transferred from the photoelectric conversion unit PD1 through the first to third transfer transistors TG1A to TG1C and the electric charge holding unit MEM1 and outputs the converted electric signals. The reset transistor RST1 is coupled to the electric charge voltage conversion unit FD1 and the vertical signal line VSL is coupled through the amplification transistor AMP1 and the selection transistor SEL1.

The electric charge voltage conversion unit FD2 in the sensor pixel PX2 is a floating diffusion region that converts, into electric signals (e.g., voltage signals), the electric charge transferred from the photoelectric conversion unit PD2 through the first to third transfer transistors TG2A to TG2C and the electric charge holding unit MEM2 and outputs the converted electric signals. The reset transistor RST2 is coupled to the electric charge voltage conversion unit FD2 and the vertical signal line VSL is coupled through the amplification transistor AMP2 and the selection transistor SEL2.

The amplification transistor AMP1 outputs an electric signal corresponding to the potential of the electric charge voltage conversion unit FD1. In addition, the amplification transistor AMP2 outputs an electric signal corresponding to the potential of the electric charge voltage conversion unit FD2. Each of the amplification transistors AMP1 and AMP2 is included, for example, in a source follower circuit along with a constant current source provided in the column signal processing unit 113.

The selection transistors SEL1 and SEL2 are respectively turned on in a case where the sensor pixels PX1 and PX2 are selected. The selection transistors SEL1 and SEL2 respectively output electric signals supplied from the electric charge voltage conversion units FD1 and FD2 through the amplification transistors AMP1 and AMP2 to the column signal processing unit 113 through the vertical signal line VSL.

The sensor pixel PX1 further includes the discharge unit OFD1 as a transfer destination of the electric charge of the photoelectric conversion unit PD1 in addition to the electric charge voltage conversion unit FD1. The discharge transistor OFG1 is disposed between the buffer BUF1 and the discharge unit OFD1.

The discharge transistor OFG1 has the drain coupled to the discharge unit OFD1 and the source coupled to the buffer BUF1. The discharge transistor OFG1 initializes or resets the photoelectric conversion unit PD1 in accordance with the drive signal applied to the gate electrode. Resetting the photoelectric conversion unit PD1 means depleting the photoelectric conversion unit PD1.

In addition, the discharge transistor OFG1 forms an overflow path. The discharge transistor OFG1 discharges electric charge overflowing from the photoelectric conversion unit PD1 to the discharge unit OFD1. In this way, it is possible for the discharge transistor OFG1 to directly reset a photoelectric conversion unit PD51 in the sensor pixel PX1 according to the present embodiment. It is, however, necessary to turn on the discharge transistor OFG1 and turn on the transfer gate TRZ1 in a case where the photoelectric conversion unit PD1 is reset.

(Cross-sectional Configuration Example and Planar Configuration Example)

Next, with reference to FIGS. 3A to 4I, a cross-sectional configuration example and a planar configuration example of the sensor pixel PX provided in the pixel array unit 111 in FIG. 1 are described.

Each of FIGS. 3A and 3B illustrates a cross-sectional configuration example of the four sensor pixels PX1 to PX4 of the plurality of sensor pixels PX included in the pixel array unit 111. FIG. 3A illustrates an arrow-direction cross section taken along the IIIA-IIIA cutting line that extends in the X axis direction and passes through the sensor pixel PX1 and the sensor pixel PX2 illustrated in each of FIGS. 4A to 4H. In addition, FIG. 3B illustrates an arrow-direction cross section taken along the IIIB-IIIB cutting line that extends in the Y axis direction.

Each of FIGS. 4A to 4H illustrates a planar configuration example of the four sensor pixels PX1 to PX4 disposed in a lattice of two rows and two columns. Specifically, FIGS. 4A to 4H respectively illustrate planar configurations at height positions Lv1 to Lv8 illustrated in each of FIGS. 3A and 3B. In addition, FIG. 4I is a schematic diagram illustrating an example of a layout pattern of the sensor pixels PX1 to PX4 in the pixel array unit 111. In FIG. 4I, Lv9 means a height position Lv9 illustrated in each of FIGS. 3A and 3B. Lv9 is a height position corresponding to a light shielding film formation layer including a ZAF light shielding film 16 described below. In the pixel array unit 111 according to the present embodiment, the sensor pixels PX1 to PX4 illustrated in FIGS. 4A to 4H are used as a minimum unit and repeatedly arranged along both the X axis direction and the Y axis direction as illustrated in FIG. 4I. As illustrated in FIG. 4I, all of the sensor pixels PX2 in the pixel array unit 111 do not, however, have to be ZAF pixels. It is sufficient if some of the sensor pixels PX2 randomly selected in the pixel array unit 111 are ZAF pixels. In FIG. 4I, the sensor pixel PX2 for which the ZAF light shielding film 16 is formed is a ZAF pixel.

The sensor pixel PX3 and the sensor pixel PX4 are normal pixels each having substantially the same configuration as that of the sensor pixel PX1. The sensor pixel PX3 and the sensor pixel PX4 thus include photoelectric conversion units PD3 and PD4, first to third transfer transistors TG3A to TG3C and TG4A to TG4C, electric charge holding units MEM3 and MEM4, discharge transistors OFG3 and OFG4, discharge units OFD3 and OFD4, buffers BUF3 and BUF4, the power supplies VDD, and the like. In addition, the sensor pixel PX3 shares a vertical signal line VSL2, the electric charge voltage conversion unit FD2, the reset transistor RST2, the amplification transistor AMP2, and the selection transistor SEL2 with the sensor pixel PX2. The sensor pixel PX4 shares a vertical signal line VSL1, the electric charge voltage conversion unit FD1, the reset transistor RST1, the amplification transistor AMP1, and the selection transistor SEL1 with the sensor pixel PX1.

As illustrated in FIGS. 3A and 3B, the pixel array unit 111 has a structure in which a first substrate S1 including a first layer LY1 and a second layer LY2 and a second substrate S2 including a third layer LY3 are bonded together on a bonding interface K. The wiring layers are bonded to each other at the bonding interface K. So-called Cu—Cu junction is preferable to bond the wiring layers to each other. In the Cu—Cu junction, for example, the surfaces of metal layers such as Cu (copper) are irradiated with plasma to be activated and bonded to each other.

The photoelectric conversion units PD (PD1 to PD4) and the like are formed in the first layer LY1 of the pixel array unit 111. Each of the sensor pixels PX1 to PX4 includes the semiconductor substrate 11 and the photoelectric conversion unit PD (PD1 to PD4) in the first layer LY1. The semiconductor substrate 11 is formed by using a semiconductor material such as Si (silicon). The photoelectric conversion unit PD (PD1 to PD4) is embedded in the semiconductor substrate 11. In addition, the semiconductor substrate 11 includes a front surface 11S1 and a back surface 11S2 opposite to the front surface 11S1. The back surface 11S2 is a surface that receives light from the outside. The back surface 11S2 is provided with a color filter formation layer including color filters CF (CF1 to CF4) (see FIGS. 3A, 3B, and 4B). The color filters CF (CF1 to CF4) are further provided with on-chip lenses LS (LS1 to LS4) on the opposite side to the back surface 11S2 (see FIGS. 3A, 3B, and 4A). In addition, the front portions of two vertical trench gates 51 and 52 are in contact with the photoelectric conversion unit PD (PD1 to PD4) (see FIGS. 3A, 3B, and 4E). The two vertical trench gates 51 and 52 extend from the lower portion of the transfer gate TRZ (TRZ1 to TRZ4) in the depth direction (+Z direction). The transfer gate TRZ (TRZ1 to TRZ4) is provided on the front surface 11S 1. Further, the sensor pixel PX2 is a ZAF pixel and the sensor pixel PX2 thus further includes a light shielding film formation layer between the back surface 11S2 and the color filter formation layer including a color filter CF2. The light shielding film formation layer includes the ZAF light shielding film 16.

An element separation unit 12 is further provided in the first layer LY1 of the semiconductor substrate 11 to surround each of the photoelectric conversion units PD (PD1 to PD4) (FIGS. 3A, 3B, and 4C). The element separation unit 12 is a wall-shaped member that extends in the Z axis direction at a boundary position between the sensor pixels PX adjacent to each other to penetrate the semiconductor substrate 11 and surrounds each of the photoelectric conversion units PD. The element separation unit 12 electrically separates the sensor pixels PX adjacent to each other. In addition, the element separation unit 12 prevents the generation of noise such as color mixing caused by the entry of leakage light from the adjacent sensor pixel PX into each of the photoelectric conversion units PD (PD1 to PD4). The element separation unit 12 includes, for example, an insulating material such as silicon oxide.

For example, the first to third transfer transistors TG1A to TG1C, TG2A to TG2C, TG3A to TG3C, and the TG4A to TG4C, the electric charge holding units MEM1 to MEM4, the discharge transistors OFG1, OFG3, and OFG4, the discharge units OFD1, OFD3, and OFD4, the buffers BUF1 to BUF4, the power supplies VDD, the electric charge voltage conversion units FD1 to FD4, and the like are formed in the second layer LY2 of the sensor pixels PX1 to PX4 (see FIGS. 3A, 3B, and 4G). It is to be noted that the electric charge holding units MEM1 to MEM4 are positioned, for example, below the transfer gates TRY1 to TRY4, TRX1 to TRX4, and TRG1 to TRG4.

The second layer LY2 of the sensor pixels PX1 to PX4 is provided with the two vertical trench gates 51 and 52 arranged side by side in the X axis direction (see FIGS. 3A, 3B, 4E, and 4F). The vertical trench gates 51 and 52 are included in a portion of the electric charge transfer unit. The vertical trench gates 51 and 52 connect the photoelectric conversion units PD1 to PD4 and the transfer gates TRZ1 to TRZ4, respectively. The vertical trench gates 51 and 52 serve as paths for transferring electric charge from the photoelectric conversion units PD1 to PD4 to the electric charge holding units MEM1 to MEM4 through the buffers BUF1 to BUF4. The electric charge holding units MEM1 to MEM4 are transfer destinations. It is to be noted that one vertical trench gate alone may be disposed or three or more vertical trench gates may be disposed.

There is provided a horizontal light shielding film 13 between the vertical trench gates 51 and 52 and the back surface 11S2 (see FIGS. 3A, 3B, and 4D). The horizontal light shielding film 13 extends along the XY plane to overlap with the vertical trench gates 51 and 52 in the Z axis direction. The horizontal light shielding film 13 is coupled, for example, to the end of the element separation unit 12 opposite to the back surface 11S2. As illustrated in FIG. 4D, there are provided openings 13K1 to 13K4 in portions of the horizontal light shielding film 13 to partially partition the photoelectric conversion units PD1 to PD4 in the Z axis direction. The electric charge generated in the photoelectric conversion units PD1 to PD4 moves to the vertical trench gates 51 and 52 through the respective openings 13K1 to 13K4. It is to be noted that the positions of the openings 13K1 to 13K4 in the XY plane are different from the positions of openings 14K1 to 14K4 in the XY plane in the horizontal light shielding film 14 described below.

There is further provided a horizontal light shielding film 14 between the photoelectric conversion units PD1 to PD4 and the electric charge holding units MEM1 to MEM4 (FIGS. 3A, 3B, and 4F). The horizontal light shielding film 14 extends along the XY plane. The horizontal light shielding film 14 is a member that prevents light from entering the electric charge holding units MEM1 to MEM4 as with the horizontal light shielding film 13. The horizontal light shielding film 14 suppresses the entry of light passing through the photoelectric conversion units PD1 to PD4 into the electric charge holding units MEM1 to MEM4 and the generation of noise. It is to be noted that the light which comes from the back surface 11B and passes through the photoelectric conversion units PD1 to PD4 without being absorbed by the photoelectric conversion units PD1 to PD4 is reflected on the horizontal light shielding film 14 and enters the photoelectric conversion units PD1 to PD4 again. In other words, the horizontal light shielding film 14 is also a reflector. The horizontal light shielding film 14 increases the photoelectric conversion efficiency by causing the light passing through the photoelectric conversion units PD1 to PD4 to enter the photoelectric conversion units PD1 to PD4 again. The horizontal light shielding film 14 is, however, provided with openings 14K (14K1 to 14K4) that allow the electric charge generated by the photoelectric conversion units PD1 to PD4 to pass therethrough. The vertical trench gates 51 and 52 are provided to extend through the respective openings 14K1 to 14K4. The horizontal light shielding film 14 may be provided over the whole of the XY plane of the pixel array unit 111 except for the openings 14K1 to 14K4. Each of the horizontal light shielding films 13 and 14 has, for example, a two-layer structure including an inner layer portion and an outer layer portion surrounding the periphery thereof. The inner layer portion includes, for example, a material including at least one of a single metal, a metal alloy, a metal nitride, or a metal silicide having a light shielding property. More specific examples of a material included in the inner layer portion include Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), a tungsten silicon compound, or the like. Among them, Al (aluminum) is the most optically preferable material. It is to be noted that the inner layer portion may include graphite, an organic material, or the like. The outer layer portion includes, for example, an insulating material such as SiOx (silicon oxide). The outer layer portion secures an electrical insulation property between the inner layer portion and the semiconductor substrate 11.

It is to be noted that it is possible to form each of the horizontal light shielding films 13 and 14 extending in the XY plane, for example, by removing a portion of the semiconductor substrate 11 to form a space inside the semiconductor substrate 11 through a wet etching process and then filling the space with the material described above. In the wet etching process, for example, in a case where the semiconductor substrate 11 includes Si {111}, crystal anisotropic etching using a property that the etching rate is different in accordance with the plane orientation of the Si {111} is performed by using a predetermined alkaline aqueous solution. More specifically, the property is used that the etching rate in a <110> direction is sufficiently high with respect to the etching rate in a <111> direction in a Si {111} substrate. Here, the <111> direction is a direction with three Si backbonds. In addition, the <110> direction is a direction with one or two Si backbonds. In the present embodiment, the X axis direction corresponds to the <110> direction. As the predetermined alkaline aqueous solution, an inorganic solution is applicable such as KOH, NaOH, or CsOH. An organic solution is applicable such as EDP (ethylenediamine pyrocatechol aqueous solution), N2H4 (hydrazine), NH$_4$OH (ammonium hydroxide), or TMAH (tetramethyl ammonium hydroxide).

In addition, in the present embodiment, the semiconductor substrate 11 is, for example, of a P-type (first electrical conductivity type) and the photoelectric conversion unit PD and the electric charge holding units MEM1 to MEM4 are of an N-type (second electrical conductivity type).

The vertical signal lines VSL1 and VSL2, the electric charge voltage conversion units FD1 and FD2, the reset transistors RST1 and RST2, the amplification transistors AMP1 and AMP2, the selection transistors SEL1 and SEL2, and the like are formed in the third layer LY3 (see FIGS. 3A, 3B, and 4H).

(Operation of Sensor Pixel PX)

Next, with reference to FIGS. 2 to 4H and the like, an operation of the sensor pixel PX is described. In each of the sensor pixels PX that are normal pixels except for the sensor pixel PX2 that is a ZAF pixel, first, a high-level drive signal is supplied to each of the discharge transistor OFG and the transfer gate TRZ before exposure is performed on the basis of the drive control by the system control unit 115. This turns on the discharge transistor OFG and the transfer gate TRZ. This causes the electric charge accumulated in the photoelectric conversion unit PD to be discharged to the discharge unit OFD and the photoelectric conversion unit PD is reset.

After the photoelectric conversion unit PD is reset, a low-level drive signal is supplied to each of the discharge transistor OFG and the transfer gate TRZ on the basis of the drive control by the system control unit 115. This turns off the discharge transistor OFG and the transfer gate TRZ. This begins exposure for all of the sensor pixels PX in the pixel array unit 111 and generates and accumulates electric charge in each of the photoelectric conversion units PD that have received light from a subject.

After a scheduled exposure time elapses, in all of the sensor pixels PX in the pixel array unit 111, the drive signals to the transfer gate TRZ and a transfer gate TRY are turned on on the basis of the drive control by the system control unit 115. This transfers the electric charge accumulated in the photoelectric conversion unit PD from the photoelectric conversion unit PD to an electric charge holding unit MEM through the transfer gate TRZ and the transfer gate TRY in each of the sensor pixels PX. The electric charge is temporarily held in the electric charge holding unit MEM.

Subsequently, the drive signals to the transfer gate TRZ and the transfer gate TRY are turned off on the basis of the drive control by the system control unit 115. After that, a readout operation is performed of sequentially reading out the electric charge held in the electric charge holding units MEM of the respective sensor pixels PX. The readout operation for the electric charge is performed, for example, for each of the rows of the pixel array unit 111. Specifically, the transfer gates TRX and the transfer gates TRG are turned on by the drive signals for each of the rows to be read out. This transfers the electric charge held in the electric charge holding units MEM of the respective sensor pixels PX to the respective electric charge voltage conversion units FD row by row.

In a case where a selection transistor SEL is turned on by a drive signal after that, an electric signal indicating the level corresponding to the electric charge held in an electric charge voltage conversion unit FD sequentially passes through an amplification transistor AMP and the selection transistor SEL and is outputted to the column signal processing unit 113 through the vertical signal line VSL.

[Effects of Solid-State Imaging Device 101]

In this way, the solid-state imaging device 101 according to the present embodiment includes the sensor pixel PX1 as the first pixel and the sensor pixel PX2 as the second pixel. The sensor pixel PX1 is a normal pixel. The sensor pixel PX2 is a ZAF pixel. The sensor pixel PX1 includes the seven signal lines SL1 to SL7 and seven gate electrodes coupled to those respective signal lines SL1 to SL7. In other words, the sensor pixel PX1 includes the gate electrode of the discharge transistor OFG1, the transfer gates TRZ1, TRY1, TRX1, and TRG1 of the first to third transfer transistors TG1A to TG1C, the gate electrode of the reset transistor RST1, the gate electrode of the amplification transistor AMP1, and the gate electrode of the selection transistor SEL1. The sensor pixel PX2 that is a ZAF pixel includes the six signal lines SL6 to SL7 and SL9 to SL12 and six gate electrodes coupled to those respective signal lines SL6 to SL7 and SL9 to SL12 as the second pixel. In other words, the sensor pixel PX2 includes the transfer gates TRZ2, TRY2, TRX2, and TRG2 of the first to third transfer transistors TG2A to TG2C, the gate electrode of the reset transistor RST2, the gate electrode of the amplification transistor AMP2, and the gate electrode of the selection transistor SEL2. Thus, in the solid-state imaging device 101, the number of signal lines SL coupled to the sensor pixel PX2 is smaller than the number of signal lines SL coupled to the sensor pixel PX1. It is therefore advantageous to miniaturize the overall configuration.

For example, in a case where a region having predetermined area is provided with more signal lines SL in the same layer, there is a concern about a short circuit between the signal lines SL because the adjacent signal lines SL have a shorter interval. Therefore, to maintain the interval between the adjacent signal lines SL, it is necessary to further decrease the line width of each of the signal lines SL. That case raises an issue that the resistance value of each of the signal lines SL per unit length increases. In addition, it is possible to avoid an issue that a short circuit occurs between the signal lines SL and an issue that a resistance value increases by providing the plurality of signal lines SL in different layers. This, however, involves an increase in manufacturing processes and an increase in the thickness of the solid-state imaging device.

Accordingly, the solid-state imaging device 101 according to the present embodiment has fewer signal lines SL coupled to the sensor pixel PX2 to avoid the issues described above and achieve miniaturization.

It is to be noted that, in a case where the sensor pixel PX2 which is a ZAF pixel shares an electric charge voltage conversion unit (FD) with another normal pixel, there are concerns about the flow of the signal charge overflowing from the sensor pixel PX2 into the shared electric charge voltage conversion unit at the time of the readout of the normal pixel and the superimposition of the signal charge on signals of the normal pixel as noise. To avoid such a phenomenon, it is originally desirable to provide even the sensor pixel PX2 with a discharge transistor (OFG), turn on the discharge transistor, and prevent the signal charge overflowing from the sensor pixel PX2 from flowing from the sensor pixel PX2 to the shared electric charge voltage conversion unit. It is, however, possible to prevent, in a case where the other normal pixel with which the electric charge voltage conversion unit is shared is read out, the signal charge from flowing into the shared electric charge voltage conversion unit by adjusting the design margin of a potential in spite of the absence of a discharge transistor as with the sensor pixel PX2 in the solid-state imaging device 101 according to the present embodiment. In addition, the sensor pixel PX2 has the same configuration as that of another normal pixel except that the sensor pixel PX2 does not include any discharge transistor (OFG). This allows the electric charge holding unit MEM2 to have substantially the same other characteristics such as saturation capacity in the sensor pixel PX2 as those of another normal pixel.

2. Modification Examples of First Embodiment

2-1. First Modification Example

[Circuit Configuration of Sensor Pixel PX in Pixel Array Unit 111A]

FIG. 5 is a circuit diagram illustrating a circuit configuration of the sensor pixel PX in a pixel array unit 111A according to a first modification example and corresponds to FIG. 2 in the first embodiment described above. In addition, each of FIGS. 6A and 6B illustrates a cross-sectional configuration example of the four sensor pixels PX1 to PX4 of the plurality of sensor pixels PX included in the pixel array unit 111A. FIGS. 6A and 6B respectively correspond to FIGS. 3A and 3B in the first embodiment described above. Further, FIG. 7 illustrates a planar configuration of the four sensor pixels PX1 to PX4 at a height position Lv7 illustrated in each of FIGS. 6A and 6B. The four sensor pixels PX1 to PX4 are arranged in a lattice of two rows and two columns. FIG. 7 corresponds to FIG. 4G in the first embodiment described above. It is to be noted that FIG. 6A illustrates an arrow-direction cross section taken along the VIA-VIA cutting line illustrated in FIG. 7 and extending in the X axis direction and FIG. 6B illustrates an arrow-direction cross section taken along the VIB-VIB cutting line illustrated in FIG. 7 and extending in the Y axis direction.

In the pixel array unit 111A, a ZAF pixel includes one fewer wiring lines than wiring lines for a normal pixel as in the pixel array unit 111 according to the first embodiment described above. In the pixel array unit 111 according to the first embodiment described above, a discharge transistor (OFG2) in the sensor pixel PX2 that is a ZAF pixel and a signal line (SL8) connected to the gate electrode of the discharge transistor (OFG2) are omitted. In contrast, in the pixel array unit 111A according to the first modification example, the sensor pixel PX2 that is a ZAF pixel includes the discharge transistor OFG2 and the signal line SL8 connected to the gate electrode of the discharge transistor OFG2. Meanwhile, the sensor pixel PX2 does not include the transfer gate TRX2 and the signal line SL11 connected to the transfer gate TRX2. The pixel array unit 111A has substantially the same configuration as that of the pixel array unit 111 described above except for that point.

[Workings and Effects of Pixel Array Unit 111A]

In the pixel array unit 111A, the number of signal lines coupled to the sensor pixel PX2 is smaller than the number of signal lines coupled to the sensor pixel PX1 as in the pixel array unit 111. It is therefore advantageous to miniaturize the overall configuration.

In addition, in the pixel array unit 111A, the sensor pixel PX2 that is a ZAF pixel includes the discharge transistor OFG2. This makes it possible to prevent, even in a case where the sensor pixel PX2 shares an electric charge voltage conversion unit (FD) with another normal pixel, the signal charge overflowing from the sensor pixel PX2 from flowing into the shared electric charge voltage conversion unit at the time of the readout of the normal pixel by turning on the discharge transistor OFG2. However, in the pixel array unit 111A, the sensor pixel PX2 does not include the transfer gate TRX2. The upper limit of the saturation capacity of the electric charge holding unit MEM2 is thus lower than the upper limit of the saturation capacity of the electric charge holding unit MEM2 of the sensor pixel PX2 in the pixel array unit 111.

2-2. Second Modification Example

[Circuit Configuration of Sensor Pixel PX in Pixel Array Unit 111B]

FIG. 8 is a circuit diagram illustrating a circuit configuration of the sensor pixel PX in a pixel array unit 111B according to a second modification example and corresponds to FIG. 2 in the first embodiment described above. In addition, each of FIGS. 9A and 9B illustrates a cross-sectional configuration example of the four sensor pixels PX1 to PX4 of the plurality of sensor pixels PX included in the pixel array unit 111B. FIGS. 9A and 9B respectively correspond to FIGS. 3A and 3B in the first embodiment described above. Further, FIG. 10 illustrates a planar configuration of the four sensor pixels PX1 to PX4 at a height position Lv7 illustrated in each of FIGS. 9A and 9B. The four sensor pixels PX1 to PX4 are arranged in a lattice of two rows and two columns. FIG. 10 corresponds to FIG. 4G in the first embodiment described above. It is to be noted that FIG. 9A illustrates an arrow-direction cross section taken along the IXA-IXA cutting line illustrated in FIG. 10 and extending in the X axis direction and FIG. 9B illustrates an arrow-direction cross section taken along the IXB-IXB cutting line illustrated in FIG. 10 and extending in the Y axis direction.

In the pixel array unit 111B, a ZAF pixel includes one fewer wiring lines than wiring lines for a normal pixel as in the pixel array unit 111 according to the first embodiment described above. However, in the pixel array unit 111B according to the second modification example, the sensor pixel PX2 that is a ZAF pixel includes the discharge transistor OFG2 and the signal line SL8 connected to the gate electrode of the discharge transistor OFG2. Meanwhile, the sensor pixel PX2 does not include the second transfer transistor TG2B including the transfer gate TRY2 and the signal line SL10 connected to the transfer gate TRY2. The pixel array unit 111B has substantially the same configuration as that of the pixel array unit 111 described above except for that point.

[Workings and Effects of Pixel Array Unit 111B]

In the pixel array unit 111B, the number of signal lines coupled to the sensor pixel PX2 is smaller than the number of signal lines coupled to the sensor pixel PX1 as in the pixel array unit 111. It is therefore advantageous to miniaturize the overall configuration.

In addition, in the pixel array unit 111B, the sensor pixel PX2 that is a ZAF pixel includes the discharge transistor OFG2. This makes it possible to prevent, even in a case where the sensor pixel PX2 shares an electric charge voltage conversion unit (FD) with another normal pixel, the signal charge overflowing from the sensor pixel PX2 from flowing into the shared electric charge voltage conversion unit at the time of the readout of the normal pixel by turning on the discharge transistor OFG2. However, in the pixel array unit 111B, the sensor pixel PX2 does not include the transfer gate TRY2. The upper limit of the saturation capacity of the electric charge holding unit MEM2 is thus lower than the upper limit of the saturation capacity of the electric charge holding unit MEM2 of the sensor pixel PX2 in the pixel array unit 111. For a similar reason, the upper limit of the saturation capacity of the photoelectric conversion unit PD2 in the pixel array unit 111B is lower than the upper limit of the saturation capacity of the photoelectric conversion unit PD2 of the sensor pixel PX2 in the pixel array unit 111.

2-3. Third Modification Example

[Circuit Configuration of Sensor Pixel PX in Pixel Array Unit 111C]

FIG. 11 is a circuit diagram illustrating a circuit configuration of the sensor pixel PX in a pixel array unit 111C according to a third modification example and corresponds to FIG. 2 in the first embodiment described above. In addition, each of FIGS. 12A and 12B illustrates a cross-sectional configuration example of the four sensor pixels PX1 to PX4 of the plurality of sensor pixels PX included in the pixel array unit 111C. FIGS. 12A and 12B respectively correspond to FIGS. 3A and 3B in the first embodiment described above. Further, FIG. 13 illustrates a planar configuration of the four sensor pixels PX1 to PX4 at a height position Lv7 illustrated in each of FIGS. 12A and 12B. The four sensor pixels PX1 to PX4 are arranged in a lattice of two rows and two columns. FIG. 13 corresponds to FIG. 4G in the first embodiment described above. It is to be noted that FIG. 12A illustrates an arrow-direction cross section taken along the XIIA-XIIA cutting line illustrated in FIG. 13 and extending in the X axis direction and FIG. 12B illustrates an arrow-direction cross section taken along the XIIB-XIIB cutting line illustrated in FIG. 13 and extending in the Y axis direction.

In the pixel array unit 111C, a ZAF pixel includes one fewer wiring lines than wiring lines for a normal pixel as in the pixel array unit 111 according to the first embodiment described above. However, in the pixel array unit 111C according to the third modification example, the sensor pixel PX2 that is a ZAF pixel includes the discharge transistor OFG2 and the signal line SL8 connected to the gate electrode of the discharge transistor OFG2. Meanwhile, the sensor pixel PX2 does not include the first transfer transistor TG2A including the transfer gate TRZ2 and the signal line SL9 connected to the transfer gate TRZ2. The pixel array unit 111C has substantially the same configuration as that of the pixel array unit 111 described above except for that point.

[Workings and Effects of Pixel Array Unit 111C]

In the pixel array unit 111C, the number of signal lines coupled to the sensor pixel PX2 is smaller than the number of signal lines coupled to the sensor pixel PX1 as in the pixel array unit 111. It is therefore advantageous to miniaturize the overall configuration.

In addition, in the pixel array unit 111C, the sensor pixel PX2 that is a ZAF pixel includes the discharge transistor OFG2. This makes it possible to prevent, even in a case where the sensor pixel PX2 shares an electric charge voltage conversion unit (FD) with another normal pixel, the signal charge overflowing from the sensor pixel PX2 from flowing into the shared electric charge voltage conversion unit at the time of the readout of the normal pixel by turning on the discharge transistor OFG2. However, in the pixel array unit 111C, the sensor pixel PX2 does not include the transfer gate TRZ2. The upper limit of the saturation capacity of the electric charge holding unit MEM2 is thus lower than the upper limit of the saturation capacity of the electric charge holding unit MEM2 of the sensor pixel PX2 in the pixel array unit 111. For a similar reason, the upper limit of the saturation capacity of the photoelectric conversion unit PD2 in the pixel array unit 111C is lower than the upper limit of the saturation capacity of the photoelectric conversion unit PD2 of the sensor pixel PX2 in the pixel array unit 111.

2-4. Fourth Modification Example

[Circuit Configuration of Sensor Pixel PX in Pixel Array Unit 111D]

FIG. 14 is a circuit diagram illustrating a circuit configuration of the sensor pixel PX in a pixel array unit 111D according to a fourth modification example and corresponds to FIG. 2 in the first embodiment described above. In addition, each of FIGS. 15A and 15B illustrates a cross-sectional configuration example of the four sensor pixels PX1 to PX4 of the plurality of sensor pixels PX included in the pixel array unit 111D. FIGS. 15A and 15B respectively correspond to FIGS. 3A and 3B in the first embodiment described above. Further, FIG. 16 illustrates a planar configuration of the four sensor pixels PX1 to PX4 at a height position Lv7 illustrated in each of FIGS. 15A and 15B. The four sensor pixels PX1 to PX4 are arranged in a lattice of two rows and two columns. FIG. 16 corresponds to FIG. 4G in the first embodiment described above. It is to be noted that FIG. 15A illustrates an arrow-direction cross section taken along the XVA-XVA cutting line illustrated in FIG. 16 and extending in the X axis direction and FIG. 15B illustrates an arrow-direction cross section taken along the XVB-XVB cutting line illustrated in FIG. 16 and extending in the Y axis direction.

In the pixel array unit 111D, a ZAF pixel includes two fewer wiring lines than wiring lines for a normal pixel. In the pixel array unit 111D according to the fourth modification example, the sensor pixel PX2 that is a ZAF pixel includes the discharge transistor OFG2 and the signal line SL8 connected to the gate electrode of the discharge transistor OFG2. Meanwhile, the sensor pixel PX2 does not include the second transfer transistor TG2B including the transfer gate TRY2 and the transfer gate TRX2, the signal line SL10 connected to the transfer gate TRY2, and the signal line SL11 connected to the transfer gate TRX2. The pixel array unit 111D has substantially the same configuration as that of the pixel array unit 111 described above except for those points.

[Workings and Effects of Pixel Array Unit 111D]

In the pixel array unit 111D, two fewer signal lines are coupled to the sensor pixel PX2 than the signal lines coupled to the sensor pixel PX1. It is therefore more advantageous to miniaturize the overall configuration.

In addition, in the pixel array unit 111D, the sensor pixel PX2 that is a ZAF pixel includes the discharge transistor OFG2. This makes it possible to prevent, even in a case where the sensor pixel PX2 shares an electric charge voltage conversion unit (FD) with another normal pixel, the signal charge overflowing from the sensor pixel PX2 from flowing into the shared electric charge voltage conversion unit at the time of the readout of the normal pixel by turning on the discharge transistor OFG2. However, in the pixel array unit 111D, the sensor pixel PX2 does not include the transfer gate TRY2 and the transfer gate TRX2. The upper limit of the saturation capacity of the electric charge holding unit MEM2 is thus lower than the upper limit of the saturation capacity of the electric charge holding unit MEM2 of the sensor pixel PX2 in the pixel array unit 111. For a similar reason, the upper limit of the saturation capacity of the photoelectric conversion unit PD2 in the pixel array unit 111B is lower than the upper limit of the saturation capacity of the photoelectric conversion unit PD2 of the sensor pixel PX2 in the pixel array unit 111.

2-5. Fifth Modification Example

[Circuit Configuration of Sensor Pixel PX in Pixel Array Unit 111E]

FIG. 17 is a circuit diagram illustrating a circuit configuration of the sensor pixel PX in a pixel array unit 111E according to a fifth modification example and corresponds to FIG. 2 in the first embodiment described above. In addition, each of FIGS. 18A and 18B illustrates a cross-sectional configuration example of the four sensor pixels PX1 to PX4 of the plurality of sensor pixels PX included in the pixel array unit 111E. FIGS. 18A and 18B respectively correspond to FIGS. 3A and 3B in the first embodiment described above. Further, FIG. 19 illustrates a planar configuration of the four sensor pixels PX1 to PX4 at the height position Lv7 illustrated in each of FIGS. 18A and 18B. The four sensor pixels PX1 to PX4 are arranged in a lattice of two rows and two columns. FIG. 19 corresponds to FIG. 4G in the first embodiment described above. It is to be noted that FIG. 18A illustrates an arrow-direction cross section taken along the XVIIIA-XVIIIA cutting line illustrated in FIG. 19 and extending in the X axis direction and FIG. 18B illustrates an arrow-direction cross section taken along the XVIIIB-XVIIIB cutting line illustrated in FIG. 19 and extending in the Y axis direction.

In the pixel array unit 111E, a ZAF pixel includes three fewer wiring lines than wiring lines for a normal pixel. In the pixel array unit 111E according to the fifth modification example, the sensor pixel PX2 that is a ZAF pixel includes the discharge transistor OFG2 and the signal line SL8 connected to the gate electrode of the discharge transistor OFG2. Meanwhile, the sensor pixel PX2 does not include the first transfer transistor TG2A including the transfer gate TRZ2, the second transfer transistor TG2B including the transfer gate TRY2 and the transfer gate TRX2, the signal line SL9 connected to the transfer gate TRZ2, the signal line SL10 connected to the transfer gate TRY2, and the signal line SL11 connected to the transfer gate TRX2. The sensor pixel PX2 that is a ZAF pixel thus serves as a non-global shutter pixel and includes no MEM2. In the sensor pixel PX2, the exposure and the transfer of electric charge are performed by rolling. To achieve this, the pixel array unit 111E is designed to transfer the signal charge generated through photoelectric conversion in the photoelectric conversion unit PD2 to the front surface 11S1 of the semiconductor substrate 11 by diffusion. In other words, the photoelectric conversion unit PD2 extends to the region near the transfer gate TRG2. The pixel array unit 111E has substantially the same configuration as that of the pixel array unit 111 described above except for those points.

[Workings and Effects of Pixel Array Unit 111E]

In the pixel array unit 111E, three fewer signal lines SL are coupled to the sensor pixel PX2 than the signal lines SL coupled to the sensor pixel PX1. It is therefore more advantageous to miniaturize the overall configuration.

In addition, in the pixel array unit 111E, the sensor pixel PX2 that is a ZAF pixel includes the discharge transistor OFG2. This makes it possible to prevent, even in a case where the sensor pixel PX2 shares an electric charge voltage conversion unit (FD) with another normal pixel, the signal charge overflowing from the sensor pixel PX2 from flowing into the shared electric charge voltage conversion unit at the time of the readout of the normal pixel by turning on the discharge transistor OFG2.

2-6. Sixth Modification Example

[Circuit Configuration of Sensor Pixel PX in Pixel Array Unit 111F]

FIG. 20 is a circuit diagram illustrating a circuit configuration of the sensor pixel PX in a pixel array unit 111F according to a sixth modification example and corresponds to FIG. 2 in the first embodiment described above. In addition, each of FIGS. 21A and 21B illustrates a cross-sectional configuration example of the four sensor pixels PX1 to PX4 of the plurality of sensor pixels PX included in the pixel array unit 111F. FIGS. 21A and 21B respectively correspond to FIGS. 3A and 3B in the first embodiment described above. Further, FIG. 22 illustrates a planar configuration of the four sensor pixels PX1 to PX4 at the height position Lv7 illustrated in each of FIGS. 21A and 21B. The four sensor pixels PX1 to PX4 are arranged in a lattice of two rows and two columns. FIG. 22 corresponds to FIG. 4G in the first embodiment described above. It is to be noted that FIG. 21A illustrates an arrow-direction cross section taken along the XXIA-XXIA cutting line illustrated in FIG. 22 and extending in the X axis direction and FIG. 21B illustrates an arrow-direction cross section taken along the XXIB-XXIB cutting line illustrated in FIG. 22 and extending in the Y axis direction.

In the pixel array unit 111F, a ZAF pixel includes four fewer wiring lines than wiring lines for a normal pixel. In the pixel array unit 111F according to the sixth modification example, the sensor pixel PX2 that is a ZAF pixel does not include the discharge transistor OFG2, the signal line SL8 connected to the gate electrode of the discharge transistor OFG2, the first transfer transistor TG2A including the transfer gate TRZ2, the second transfer transistor TG2B including the transfer gate TRY2 and the transfer gate TRX2, the signal line SL9 connected to the transfer gate TRZ2, the signal line SL10 connected to the transfer gate TRY2, and the signal line SL11 connected to the transfer gate TRX2. The sensor pixel PX2 that is a ZAF pixel thus serves as a non-global shutter pixel and includes no MEM2. In the sensor pixel PX2, the exposure and the transfer of electric charge are performed by rolling. To achieve this, the pixel array unit 111F is designed to transfer the signal charge generated through photoelectric conversion in the photoelectric conversion unit PD2 to the front surface 11S1 of the semiconductor substrate 11 by diffusion. In other words, the photoelectric conversion unit PD2 extends to the region near the transfer gate TRG2.

[Workings and Effects of Pixel Array Unit 111F]

In the pixel array unit 111F, four fewer signal lines SL are coupled to the sensor pixel PX2 than the signal lines SL coupled to the sensor pixel PX1. It is therefore still more advantageous to miniaturize the overall configuration.

3. Second Embodiment

[Configuration of Solid-state Imaging Device 201]

FIG. 23 illustrates a circuit configuration example of the two sensor pixels PX1 and PX2 of a plurality of sensor pixels provided in a pixel array unit of a solid-state imaging device 201 according to a second embodiment of the present technology and corresponds to FIG. 2 in the first embodiment described above.

In the first embodiment described above, the stacked solid-state imaging device 101 has been described in which a photoelectric conversion unit and a memory are stacked. In contrast, in the present embodiment, the planar solid-state imaging device 201 is described in which a photoelectric conversion unit and a memory are provided in the same layer. The solid-state imaging device 201 is considerably different from the solid-state imaging device 101 from the perspective of a circuit configuration in that the solid-state imaging device 201 does not include transfer gate TRZ included in the stacked solid-state imaging device 101.

FIG. 24 illustrates a cross-sectional configuration example of the two sensor pixels PX1 and PX2 of the plurality of sensor pixels PX included in the pixel array unit of the solid-state imaging device 201 and corresponds to FIG. 3A in the first embodiment described above. Further, FIG. 25 illustrates a planar configuration of the four sensor pixels PX1 to PX4 along the front surface 11S1. The four sensor pixels PX1 to PX4 are arranged in a lattice of two rows and two columns. FIG. 25 corresponds to FIG. 4G in the first embodiment described above. It is to be noted that FIG. 24 illustrates an arrow-direction cross section taken along the XXIV-XXIV cutting line illustrated in FIG. 25 and extending in the X axis direction.

As illustrated in FIG. 24, a light shielding film 17 is disposed near the back surface 11S2 to extend along the XY plane for blocking light entering the electric charge holding units MEM1 and MEM2. The element separation unit 12 extending in the thickness direction (Z axis direction) is provided around the photoelectric conversion units PD1 and PD2. However, the element separation unit 12 is partially removed in electric charge transfer paths extending from the photoelectric conversion units PD1 and PD2 to the electric charge holding units MEM1 and MEM2.

The sensor pixel PX2 is also a ZAF pixel in the solid-state imaging device 201 according to the present embodiment as in the solid-state imaging device 101 according to the first embodiment described above. Here, as illustrated in each of FIGS. 23 to 25, the sensor pixel PX2 is not provided with the discharge transistor OFG2, the transfer gate TRY2, and the transfer gate TRX2 and the signal lines SL8 to SL10 coupled thereto.

Thus, in the solid-state imaging device 201, the number of signal lines SL coupled to the sensor pixel PX2 is smaller than the number of signal lines SL coupled to the sensor pixel PX1. It is therefore advantageous to miniaturize the overall configuration.

4. Modification Examples of Second Embodiment

4-1. Seventh Modification Example

[Solid-State Imaging Device 201A]

FIG. 26 is a circuit diagram illustrating a circuit configuration of the sensor pixel PX in a pixel array unit of a solid-state imaging device 201A according to a seventh modification example and corresponds to FIG. 2 in the first embodiment described above. In addition, FIG. 27 illustrates a cross-sectional configuration example of the two sensor pixels PX1 and PX2 of the plurality of sensor pixels PX included in the pixel array unit of the solid-state imaging device 201A. Further, FIG. 28 illustrates a planar configuration of the four sensor pixels PX1 to PX4 along the front surface 11S1. The four sensor pixels PX1 to PX4 are arranged in a lattice of two rows and two columns. FIG. 28 corresponds to FIG. 4G in the first embodiment described above. It is to be noted that FIG. 27 illustrates an arrow-direction cross section taken along the XXVII-XXVII cutting line illustrated in FIG. 28 and extending in the X axis direction.

The solid-state imaging device 201A has a configuration similar to that of the solid-state imaging device 201 according to the second embodiment described above except that the solid-state imaging device 201A further includes the discharge transistor OFG2 and the signal line SL8 coupled thereto.

4-2. Eighth Modification Example

[Solid-State Imaging Device 201B]

FIG. 29 is a circuit diagram illustrating a circuit configuration of the sensor pixel PX in a pixel array unit of a solid-state imaging device 201B according to an eighth modification example and corresponds to FIG. 2 in the first embodiment described above. In addition, FIG. 30 illustrates a cross-sectional configuration example of the two sensor pixels PX1 and PX2 of the plurality of sensor pixels PX included in the pixel array unit of the solid-state imaging device 201B. Further, FIG. 31 illustrates a planar configuration of the four sensor pixels PX1 to PX4 along the front surface 11S1. The four sensor pixels PX1 to PX4 are arranged in a lattice of two rows and two columns. FIG. 31 corresponds to FIG. 4G in the first embodiment described above. It is to be noted that FIG. 30 illustrates an arrow-direction cross section taken along the XXX-XXX cutting line illustrated in FIG. 31 and extending in the X axis direction.

The solid-state imaging device 201B has a configuration similar to that of the solid-state imaging device 201 according to the second embodiment described above except that the solid-state imaging device 201B further includes the discharge transistor OFG2, the signal line SL8 coupled thereto, the transfer gate TRY2, and the signal line SL9 coupled thereto.

4-3. Ninth Modification Example

[Solid-State Imaging Device 201C]

FIG. 32 is a circuit diagram illustrating a circuit configuration of the sensor pixel PX in a pixel array unit of a solid-state imaging device 201C according to a ninth modification example and corresponds to FIG. 2 in the first embodiment described above. In addition, FIG. 33 illustrates a cross-sectional configuration example of the two sensor pixels PX1 and PX2 of the plurality of sensor pixels PX included in the pixel array unit of the solid-state imaging device 201C. Further, FIG. 34 illustrates a planar configuration of the four sensor pixels PX1 to PX4 along the front surface 11S1. The four sensor pixels PX1 to PX4 are arranged in a lattice of two rows and two columns. FIG. 34 corresponds to FIG. 4G in the first embodiment described above. It is to be noted that FIG. 33 illustrates an arrow-direction cross section taken along the XXXIII-XXXIII cutting line illustrated in FIG. 34 and extending in the X axis direction.

The solid-state imaging device 201C has a configuration similar to that of the solid-state imaging device 201 according to the second embodiment described above except that the solid-state imaging device 201C further includes the transfer transistor TRY2 and the signal line SL9 coupled thereto.

5. Example of Application to Electronic Apparatus

FIG. 35 is a block diagram illustrating a configuration example of a camera 2000 serving as an electronic apparatus to which the present technology is applied.

The camera 2000 includes an optical unit 2001 including a lens group and the like, an imaging device (imaging device) 2002 to which the solid-state imaging device 101 or the like (referred to as solid-state imaging device 101 or the like below) described above is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are coupled to each other through a bus line 2009.

The optical unit 2001 takes in incident light (image light) from a subject to form an image on an imaging surface of the imaging device 2002. The imaging device 2002 converts the amount of incident light formed as an image on the imaging surface by the optical unit 2001 into an electric signal on a pixel unit basis and outputs the converted electric signal as a pixel signal.

The display unit 2005 includes, for example, a panel display such as a liquid crystal panel or an organic EL panel and displays a moving image or a still image captured by the imaging device 2002. The recording unit 2006 records a moving image or a still image captured by the imaging device 2002 in a recording medium such as a hard disk or a semiconductor memory.

The operation unit 2007 issues an operation instruction about a variety of functions of the camera 2000 under an operation of a user. The power supply unit 2008 appropriately supplies the DSP circuit 2003, the frame memory 2004, the display unit 2005, the recording unit 2006, and the operation unit 2007 with various kinds of power for operations of these supply targets.

As described above, the use of the solid-state imaging device 101 or the like described above as the imaging device 2002 makes it possible to expect the acquirement of a favorable image.

6. Example of Practical Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 36 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 36, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

FIG. 37 is a diagram depicting an example of the installation position of the imaging section 12031.

In FIG. 37, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 37 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. Specifically, for example, the solid-state imaging device 101 illustrated in FIG. 1A or the like is applicable to the imaging section 12031. It is possible to expect an excellent operation of the vehicle control system by applying the technology according to the present disclosure to the imaging section 12031.

7. Other Modification Examples

Although the present disclosure has been described above with reference to several embodiments and modification examples, the present disclosure is not limited to the embodiments and the like described above. It is possible to make a variety of modifications. For example, the present disclosure is not limited to the back-illuminated image sensor, but is applicable to even a front-illuminated image sensor.

In addition, the imaging device according to the present disclosure is not limited to an imaging device that detects the light amount distribution of visible light and acquires it as an image, but may be an imaging device that acquires the amount distribution of incident infrared rays, X-rays, particles, or the like as an image.

In addition, the imaging device according to the present disclosure may also be in the form of a module in which an imaging unit and a signal processing unit or an optical system are packaged together.

In addition, in the embodiment described above, the back-illuminated image sensor of the memory holding global shutter mode has been described, but the present disclosure is not limited to this. For example, as with a solid-state imaging device 301 illustrated in each of FIGS. 38 and 39, a back-illuminated image sensor of an FD holding global shutter mode may also be adopted. In the solid-state imaging device 301, electric charge is held in the electric charge voltage conversion unit FD instead of the electric charge holding unit MEM. The solid-state imaging device 301 also includes the sensor pixel PX1 serving as a normal pixel and the sensor pixel PX2 serving as an image plane phase difference pixel. It is to be noted that FIG. 38 is a circuit diagram illustrating a circuit configuration of the solid-state imaging device 301 according to the eighth modification example of the present disclosure. FIG. 39 is a schematic plan view of a planar configuration of the front surface of a semiconductor substrate in the solid-state imaging device 301. The solid-state imaging device 301 is not provided with the discharge transistor OFG2 in the sensor pixel PX2. This reduces the signal lines SL coupled thereto.

Further, the solid-state imaging device according to the technology of the present disclosure may have a configuration, for example, like those of the solid-state imaging device 101A illustrated in FIG. 40A and the solid-state imaging device 101B illustrated in FIG. 40B. FIG. 40A is a block diagram illustrating a configuration example of a solid-state imaging device 101A according to a ninth modification example of the present disclosure. FIG. 40B is a block diagram illustrating a configuration example of a solid-state imaging device 101B according to a tenth modification example of the present disclosure In the solid-state imaging device 101A illustrated in FIG. 40A, the data storage unit 119 is provided between the column signal processing unit 113 and the horizontal drive unit 114 and a pixel signal outputted from the column signal processing unit 113 is supplied to the signal processing unit 118 through the data storage unit 119.

In addition, the solid-state imaging device 101B in FIG. 40B is provided with the data storage unit 119 and the signal processing unit 118 in parallel between the column signal processing unit 113 and the horizontal drive unit 114. In the solid-state imaging device 101B, the column signal processing unit 113 performs A/D conversion for each of the columns of the pixel array unit 111 or for a plurality of columns of the pixel array unit 111. The A/D conversion converts an analog pixel signal into a digital pixel signal.

In addition, in the embodiments and the like described above, the case has been exemplified where an image plane phase difference detection pixel is used as the second pixel, but the present disclosure is not limited to this. The second pixel may be, for example, a polarizing pixel including an infrared light information acquisition pixel and a polarizer. FIGS. 41 and 42 are schematic diagrams respectively illustrating the layout patterns of the sensor pixels PX1 to PX4 in the pixel array units 111 according to an eleventh modification example and a twelfth modification example of the present disclosure. In FIG. 4I, at a height position Lv2, NIR pixels each including a near-infrared filter NIR instead of the color filter CF2 are disposed at the positions of the sensor pixels PX2 that are the second pixels. The near-infrared filter NIR selectively transmits near-infrared light. In addition, in FIG. 42, in the height position Lv9, a polarizing pixel for which a polarizer PL is disposed is disposed at the position of the sensor pixel PX2 that is the second pixel. All of the sensor pixels PX2 in the pixel array unit 111 do not, however, have to be NIR pixels or polarizing pixels. It is sufficient if some of the sensor pixels PX2 randomly selected in the pixel array unit 111 are NIR pixels or polarizing pixels.

In addition, in the embodiments and the like described above, the case has been exemplified where the second pixel does not include a portion of the gate electrodes corresponding to a plurality of gate electrodes included in the first pixel, but the present disclosure is not limited to this. For example, the gate electrodes corresponding to all of the gate electrodes in the sensor pixel PX1 serving as the first pixel may be all included in the sensor pixel PX2 serving as the second pixel. In that case, it is favorable to refrain from providing a signal line coupled to a portion of the plurality of gate electrodes in the second pixel, for example, as in a pixel array unit 111G in a solid-state imaging device according to a thirteenth modification example of the present disclosure illustrated in FIG. 43. In the pixel array unit 111G, each of the transfer gates TRZ2, TRY2, and TRX2 is disposed and (a portion of) wiring lines coupled thereto are not provided.

In the imaging device and the electronic apparatus according to the respective embodiments of the present disclosure, the number of second wiring lines in the second pixel is smaller than the number of first wiring lines in the first pixel. This makes it possible to miniaturize the overall configuration while securing as much operation performance as possible that is requested from the second pixel.

In addition, the Si {111} substrate according to the present disclosure refers to a substrate or a wafer including a silicon single crystal and having a crystal plane represented by {111} in the Miller index notation. The Si {111} substrate according to the present disclosure also includes a substrate or a wafer having a crystal orientation shifted by several degrees. For example, the crystal orientation is shifted by several degrees from the {111} plane in the nearest [110] direction. Further, the Si {111} substrate also includes a silicon single crystal grown on a portion or the whole of a surface of this substrate or this wafer in an epitaxial method or the like.

In addition, in the notation of the present disclosure, the {111} plane is a generic term of the (111) plane, the (-111) plane, the (1-11) plane, the (11-1) plane, the (-1-11) plane, the (-11-1) plane, the (1-1-1) plane, and the (-1-1-1) plane, which are crystal planes equivalent to each other in terms of symmetry. Accordingly, the description of the Si {111} substrate in the specification or the like of the present disclosure may also be read, for example, as an Si(1-11) substrate. Here, a bar sign of the Miller index for expressing an index in the negative direction is substituted with a minus sign.

In addition, the <110> direction in the description of the present invention is a generic term of the [110] direction, the [101] direction, the [011] direction, the [-110] direction, the [1-10] direction, the [-101] direction, the [10-1] direction, the [0-11] direction, the [01-1] direction, the [-1-10] direction, the [-10-1] direction, and the [0-1-1] direction, which are crystal plane directions equivalent to each other in terms of symmetry. The <110> direction may also be read as any of the above. In the present disclosure, however, etching is performed in the direction orthogonal to an element formation surface and the direction further orthogonal to this direction orthogonal to the element formation surface (i.e., the direction parallel with the element formation surface).

Table 1 exhibits specific combinations of planes and orientations in which etching in the <110> direction is established in the {111} plane that is the crystal plane of the Si {111} substrate in the present invention.

used to cause the etching to progress in the X axis direction, but the etching does not progress in the Y axis direction or the Z axis direction. The present disclosure is not, however, limited to this. It is sufficient if the etching progress orientation includes both the X axis direction and the Y axis direction or any one of the X axis direction or the Y axis direction. In addition, the Si {111} substrate also includes a substrate whose front surface is processed to have an off angle in the <112> direction, for example, as illustrated in FIG. 44. In a case where the off angle is 19.47° or less, even a substrate having an off angle maintains a relationship in which the etching rate in the <110> direction or the direction with one Si backbond is sufficiently higher than the etching rate in the <111> direction or the direction with three Si backbonds. A larger off angle causes the number of steps to increase. This increases the density of micro step differences. It is thus preferable that the off angle be 5° or less. It is to be noted that the case where the substrate front surface has an off angle in the <112> direction has been described in the example of FIG. 44, but the substrate front surface may have an off angle in the <110> direction. It does not matter which direction the off angle is in. In addition, the Si plane orientation is analyzable by using an X-ray diffraction method, an electron beam diffraction method, an electron beam backscatter diffraction method, or the like. The number of Si backbonds is determined by the Si crystal structure and the number of backbonds is thus also analyzable by analyzing the Si plane orientation.

It is to be noted that the effects described in this specification are merely illustrative, but not limited to the description. There may be other effects. In addition, the present technology may have configurations as follows.

TABLE 1

| etching orientation | element formation surface | | | | | | | |
|---|---|---|---|---|---|---|---|---|
| | (111) | (-111) | (1-11) | (11-1) | (-1-11) | (-11-1) | (1-1-1) | (-1-1-1) |
| [110] | | ○ | ○ | | | ○ | ○ | |
| [101] | | ○ | | ○ | ○ | | ○ | |
| [011] | | | ○ | ○ | ○ | ○ | | |
| [-110] | ○ | | | ○ | ○ | | | ○ |
| [1-10] | ○ | | | ○ | ○ | | | ○ |
| [-101] | ○ | | ○ | | | ○ | | ○ |
| [10-1] | ○ | | ○ | | | ○ | | ○ |
| [0-11] | ○ | ○ | | | | | ○ | ○ |
| [01-1] | ○ | ○ | | | | | ○ | ○ |
| [-1-10] | | ○ | ○ | | | ○ | ○ | |
| [-10-1] | | ○ | | ○ | ○ | | ○ | |
| [0-1-1] | | | ○ | ○ | ○ | ○ | | |

As illustrated in Table 1, there are 96 (=8×12) combinations of the {111} planes and the <110> directions. However, the <110> direction according to the present disclosure is limited to the direction orthogonal to the {111} plane that is an element formation surface and the direction parallel with the element formation surface. In other words, a combination of the element formation surfaces of the Si {111} substrate according to the present disclosure and the orientations in which the etching is performed on the Si {111} substrate is selected from any of the combinations indicated by ○ in Table 1.

In addition, in the first embodiment described above, the case has been exemplified where the Si {111} substrate is (1)
An imaging device including:
a first pixel including m (m represents an integer greater than or equal to 2) first wiring lines and m first gate electrodes that are coupled to the m respective first wiring lines; and
a second pixel including n (n represents a natural number smaller than m) second wiring lines and n second gate electrodes that are coupled to the n respective second wiring lines.

(2)
The imaging device according to (1), in which
the first pixel includes a first transistor including the first gate electrode, and the second pixel includes a second transistor including the second gate electrode.

(3)

The imaging device according to (1) or (2), in which a first wiring line corresponding to a portion of the m first wiring lines and a second wiring line corresponding to a portion of the n second wiring lines include shared common wiring lines.

(4)

The imaging device according to (3), in which the common wiring lines include a first common wiring line and a second common wiring line, the first pixel includes a first reset transistor including the first gate electrode coupled to the first common wiring line and a first selection transistor including the first gate electrode coupled to the second common wiring line, and the second pixel includes a second reset transistor including the second gate electrode coupled to the first common wiring line and a second selection transistor including the second gate electrode coupled to the second common wiring line.

(5)

The imaging device according to any one of (1) to (4), in which the first pixel includes an imaging pixel that acquires visible light information, and the second pixel acquires information other than the visible light information.

(6)

The imaging device according to (5), in which the second pixel includes an image plane phase difference detection pixel, an infrared light information acquisition pixel, or a polarizer.

(7)

The imaging device according to any one of (1) to (6), in which a shape of a formation region of the first pixel and a shape of a formation region of the second pixel are substantially same.

(8)

The imaging device according to any one of (1) to (7), in which the first pixel further includes a first photoelectric conversion unit and a first electric charge voltage conversion unit, the first photoelectric conversion unit being configured to generate first electric charge through photoelectric conversion, the first electric charge corresponding to an amount of received light, the first electric charge voltage conversion unit converting the first electric charge into a voltage signal, the second pixel further includes a second photoelectric conversion unit and a second electric charge voltage conversion unit, the second photoelectric conversion unit being configured to generate second electric charge through photoelectric conversion, the second electric charge corresponding to an amount of received light, the second electric charge voltage conversion unit converting the second electric charge into a voltage signal, the first pixel is provided with p (p represents a natural number smaller than m) first transistors between the first photoelectric conversion unit and the first electric charge voltage conversion unit, and the second pixel is provided with q (q represents an integer smaller than p and greater than or equal to 0) second transistors between the second photoelectric conversion unit and the second electric charge voltage conversion unit.

(9)

The imaging device according to (8), in which the first pixel includes a global shutter pixel further including an electric charge holding unit between the first photoelectric conversion unit and the first electric charge voltage conversion unit, the electric charge holding unit being configured to hold the first electric charge.

(10)

An electronic apparatus including an imaging device, in which the imaging device includes a first pixel including m (m represents an integer greater than or equal to 2) first wiring lines and m first gate electrodes that are coupled to the m respective first wiring lines, and a second pixel including n (n represents a natural number smaller than m) second wiring lines and n second gate electrodes that are coupled to the n respective second wiring lines.

The present application claims the priority on the basis of Japanese Patent Application No. 2019-222999 filed on Dec. 10, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
   a first pixel including:
      m first wiring lines;
      m first gate electrodes that are coupled to the m respective first wiring lines,
      wherein the m represents an integer greater than or equal to 2;
      a first photoelectric conversion unit configured to generate first electric charge through photoelectric conversion, wherein the first electric charge corresponds to an amount of light received by the first photoelectric conversion unit;
      a first electric charge voltage conversion unit configured to convert the first electric charge into a first voltage signal; and
      p first transistors between the first photoelectric conversion unit and the first electric charge voltage conversion unit, wherein the p represents a natural number smaller than the m; and
   a second pixel including:
      n second wiring lines;
      n second gate electrodes that are coupled to the n respective second wiring lines, wherein the n represents a natural number smaller than the m;
      a second photoelectric conversion unit configured to generate second electric charge through the photoelectric conversion, wherein the second electric charge corresponds to an amount of light received by the second photoelectric conversion unit;
      a second electric charge voltage conversion unit configured to convert the second electric charge into a second voltage signal; and
      q second transistors between the second photoelectric conversion unit and the second electric charge voltage conversion unit, wherein the q represents an integer smaller than the p and greater than or equal to 0.

2. The imaging device according to claim 1, wherein
the first pixel further includes a first transistor of the p first transistors, wherein the first transistor includes a first gate electrode of the m first gate electrodes, and
the second pixel further includes a second transistor of the q second transistors, wherein the second transistor includes a second gate electrode of the n second gate electrodes.

3. The imaging device according to claim 1, wherein
a first wiring line corresponding to a portion of the m first wiring lines and a second wiring line corresponding to a portion of the n second wiring lines include shared common wiring lines.

4. The imaging device according to claim 2, wherein
common wiring lines include a first common wiring line and a second common wiring line,
the first pixel further includes:
  a first reset transistor including the first gate electrode coupled to the first common wiring line; and
  a first selection transistor including the first gate electrode coupled to the second common wiring line, and
the second pixel further includes:
  a second reset transistor including the second gate electrode coupled to the first common wiring line; and
  a second selection transistor including the second gate electrode coupled to the second common wiring line.

5. The imaging device according to claim 1, wherein
the first pixel further includes an imaging pixel configured to acquire visible light information, and
the second pixel is configured to acquire information other than the visible light information.

6. The imaging device according to claim 5, wherein the second pixel includes one of an image plane phase difference detection pixel, an infrared light information acquisition pixel, or a polarizer.

7. The imaging device according to claim 1, wherein a shape of a formation region of the first pixel and a shape of a formation region of the second pixel are substantially same.

8. The imaging device according to claim 1, wherein
the first pixel further includes a global shutter pixel including an electric charge holding unit between the first photoelectric conversion unit and the first electric charge voltage conversion unit, and
the electric charge holding unit is configured to hold the first electric charge.

9. An electronic apparatus, comprising
an imaging device that includes:
  a first pixel including:
    m first wiring lines;
    m first gate electrodes that are coupled to the m respective first wiring lines, wherein the m represents an integer greater than or equal to 2;
    a first photoelectric conversion unit configured to generate first electric charge through photoelectric conversion, wherein the first electric charge corresponds to an amount of light received by the first photoelectric conversion unit;
    a first electric charge voltage conversion unit configured to convert the first electric charge into a first voltage signal; and
    p first transistors between the first photoelectric conversion unit and the first electric charge voltage conversion unit, wherein the p represents a natural number smaller than the m; and
  a second pixel including:
    n second wiring lines;
    n second gate electrodes that are coupled to the n respective second wiring lines, wherein the n represents a natural number smaller than the m;
    a second photoelectric conversion unit configured to generate second electric charge through the photoelectric conversion, wherein the second electric charge corresponds to an amount of light received by the second photoelectric conversion unit;
    a second electric charge voltage conversion unit configured to convert the second electric charge into a second voltage signal; and
    q second transistors between the second photoelectric conversion unit and the second electric charge voltage conversion unit, wherein the q represents an integer smaller than the p and greater than or equal to 0.

* * * * *